US012041826B2

(12) United States Patent
Dong

(10) Patent No.: US 12,041,826 B2
(45) Date of Patent: Jul. 16, 2024

(54) DISPLAY SUBSTRATE AND MANUFACTURING METHOD THEREOF, AND DISPLAY APPARATUS

(71) Applicant: BOE Technology Group Co., Ltd., Beijing (CN)

(72) Inventor: Tian Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 761 days.

(21) Appl. No.: 17/256,006

(22) PCT Filed: Oct. 29, 2020

(86) PCT No.: PCT/CN2020/124967
§ 371 (c)(1),
(2) Date: Dec. 24, 2020

(87) PCT Pub. No.: WO2021/083298
PCT Pub. Date: May 6, 2021

(65) Prior Publication Data
US 2021/0376046 A1    Dec. 2, 2021

(30) Foreign Application Priority Data

Oct. 29, 2019   (CN) .......................... 201911038883.4
Nov. 7, 2019    (CN) .......................... 201911082352.5

(51) Int. Cl.
*H10K 59/131*     (2023.01)
*G09G 3/3233*     (2016.01)
(Continued)

(52) U.S. Cl.
CPC ......... *H10K 59/131* (2023.02); *G09G 3/3233* (2013.01); *G09G 3/3291* (2013.01);
(Continued)

(58) Field of Classification Search
CPC ............ H10K 59/1216; H10K 59/124; H10K 59/126; H10K 59/131; H10K 71/00;
(Continued)

(56) References Cited

U.S. PATENT DOCUMENTS 8,004,178 B2    8/2011    Lee
8,144,086 B2    3/2012    Lee et al.
(Continued)

FOREIGN PATENT DOCUMENTS

CN      1455632 A      11/2003
CN      108010939 A    5/2018
(Continued)

OTHER PUBLICATIONS

Office Action dated Jun. 25, 2021 for Chinese Patent Application No. 201911038883.4 and English Translation.
(Continued)

*Primary Examiner* — Matthew E Warren
(74) *Attorney, Agent, or Firm* — Ling Wu; Stephen Yang; Ling and Yang Intellectual Property

(57) ABSTRACT

Disclosed are a display substrate and a manufacturing method thereof, and a display apparatus. The display substrate includes, in a plane parallel to the display substrate, a plurality of gate lines, a plurality of data lines, a plurality of power lines and a plurality of sub-pixels arranged on a base substrate. At least one sub-pixel includes a light-emitting device and a driving circuit configured to drive the light-emitting device to emit light. The driving circuit includes a plurality of transistors and a storage capacitor. The display substrate includes, in a plane perpendicular to the display substrate, a base substrate and a plurality of functional layers. The plurality of functional layers includes a semiconductor layer, a first conductive layer, a second conduc-
(Continued)

tive layer, a third conductive layer and a fourth conductive layer which are sequentially arranged.

68 Claims, 27 Drawing Sheets

(51) Int. Cl.
　　*G09G 3/3291* (2016.01)
　　*H10K 59/121* (2023.01)
　　*H10K 59/124* (2023.01)
　　*H10K 59/126* (2023.01)
　　*H10K 71/00* (2023.01)

(52) U.S. Cl.
　　CPC ....... *H10K 59/1216* (2023.02); *H10K 59/124* (2023.02); *H10K 59/126* (2023.02); *H10K 71/00* (2023.02); *G09G 2300/0408* (2013.01); *G09G 2300/0426* (2013.01)

(58) Field of Classification Search
　　CPC .............. G09G 3/3233; G09G 3/3291; G09G 2300/0408; G09G 2300/0426
　　See application file for complete search history.

(56) References Cited

U.S. PATENT DOCUMENTS

| | | | |
|---|---|---|---|
| 10,109,696 | B2 | 10/2018 | Zhang et al. |
| 10,388,910 | B2 | 8/2019 | Bae et al. |
| 10,529,793 | B2 | 1/2020 | Li |
| 2003/0205968 | A1 | 11/2003 | Chae et al. |
| 2011/0241562 | A1 | 10/2011 | Choi et al. |
| 2012/0105388 | A1 | 5/2012 | Han et al. |
| 2016/0260781 | A1 | 9/2016 | Yang et al. |
| 2018/0122881 | A1 | 5/2018 | Shin et al. |
| 2018/0218684 | A1* | 8/2018 | Choi .................... G09G 3/3258 |
| 2020/0006401 | A1* | 1/2020 | Hwang ............... H10K 59/1213 |
| 2020/0075701 | A1 | 3/2020 | Song et al. |
| 2020/0294446 | A1 | 9/2020 | Long |
| 2020/0380903 | A1 | 12/2020 | Dong et al. |
| 2021/0126075 | A1* | 4/2021 | Wang ................. H10K 59/1213 |

FOREIGN PATENT DOCUMENTS

| | | | | |
|---|---|---|---|---|
| CN | 108376694 | A | | 8/2018 |
| CN | 108766988 | A | | 11/2018 |
| CN | 109256396 | A | | 1/2019 |
| CN | 208521584 | U | | 2/2019 |
| CN | 208753327 | U | | 4/2019 |
| CN | 109860259 | A | | 6/2019 |
| CN | 110162224 | A | | 8/2019 |
| CN | 110690265 | A | | 1/2020 |
| CN | 110707139 | A | | 1/2020 |
| EP | 1755104 | A2 | | 2/2007 |
| KR | 20180089928 | A | | 8/2018 |
| KR | 20210010717 | A | * | 1/2021 .......... H10K 59/131 |
| RU | 2669521 | C1 | | 10/2018 |

OTHER PUBLICATIONS

Office Action dated Apr. 7, 2022 for Korean Patent Application No. 10-2020-7036474 and English Translation.
Office Action dated Feb. 14, 2022 for Chinese Patent Application No. 201911038883.4 and English Translation.
International Search Report for PCT/CN2020/124967 Mailed Feb. 3, 2021.
European Search Report for 20824415.2 Mailed Oct. 16, 2023.

* cited by examiner

DISPLAY SUBSTRATE AND MANUFACTURING METHOD THEREOF, AND DISPLAY APPARATUS

The present application claims the priority of Chinese Patent Publication No. 201911082352.5, filed to the CNIPA on Nov. 7, 2019 and entitled "Display Substrate and Manufacturing Method Thereof, and Display Apparatus", and claims the priority of Chinese Patent Publication No. 201911038883.4, filed to the CNIPA on Oct. 29, 2019 and entitled "Display Substrate and Manufacturing Method Thereof, and Display Apparatus", the contents of which should be regarded as being incorporated herein by reference.

TECHNICAL FIELD

The present application relates to the field of display technology, and particularly relates to a display substrate and a manufacturing method thereof, and a display apparatus.

BACKGROUND

An Organic Light-Emitting Device (OLED) display substrate is a display substrate different from a traditional Liquid Crystal Display (LCD), and has the advantages such as active light emission, good temperature characteristics, low power consumption, fast response, flexibility, ultra-thinness and low cost. Therefore, it has become one of the important developments and discoveries of new generation display apparatus and has attracted more and more attention.

In order to realize the high-frequency driving of an OLED display substrate, an OLED display substrate with dual data lines is proposed in the related art, that is, pixels in a single column are connected with two data lines. However, although an OLED display substrate in the related art can realize high-frequency driving, the resolution is generally low, which cannot meet the demand concerning high resolution of display devices on the market.

SUMMARY

The following is a summary of subject matter described in detail herein. This summary is not intended to limit the protection scope of the claims.

A display substrate is provided. The display substrate includes, in a plane parallel to the display substrate, a plurality of gate lines, a plurality of data lines, a plurality of power lines and a plurality of sub-pixels arranged on a base substrate. At least one sub-pixel includes a light-emitting device and a driving circuit configured to drive the light-emitting device to emit light. The driving circuit includes a plurality of transistors and a storage capacitor. The display substrate includes, in a plane perpendicular to the display substrate, a base substrate and a plurality of functional layers arranged on the base substrate. The plurality of functional layers includes a semiconductor layer, a first conductive layer, a second conductive layer, a third conductive layer and a fourth conductive layer which are sequentially arranged. A first insulating layer, a second insulating layer, a third insulating layer and a fourth insulating layer are respectively arranged between the plurality of functional layers. In an extension direction of the gate lines, the power lines are connected with each other through at least one functional layer.

In an exemplary implementation, in an extension direction of the data lines, the power lines include a plurality of sub-power lines connected sequentially, and at least one sub-power line is arranged in one sub-pixel; and a sub-power line of at least one sub-pixel includes a plurality of power supply parts connected sequentially, and there is an included angle of greater than 90 degrees and smaller than 180 degrees between at least one power supply part and a power supply part connected with the at least one power supply part.

In an exemplary implementation, one power supply part of the at least one power supply part and the power supply part connected with the at least one power supply part is arranged in parallel with the data lines.

In an exemplary implementation, the sub-power line includes a first power supply part, a second power supply part and a third power supply part; the second power supply part is configured to connect the first power supply part and the third power supply part, the first power supply part and the third power supply part are arranged in parallel with the data lines, an included angle between the second power supply part and the first power supply part is greater than 90 degrees and smaller than 180 degrees, and an included angle between the second power supply part and the third power supply part is greater than 90 degrees and smaller than 180 degrees.

In an exemplary implementation, the first power supply part is connected with a third power supply part in a sub-pixel located in a previous row in a column, and the third power supply part is connected with a first power supply part in a sub-pixel located in a next row in the same column.

In an exemplary implementation, an extension length of the first power supply part in the extension direction of the data lines is greater than an average width of the first power supply parts, an extension length of the second power supply part in an oblique direction is greater than an average width of the second power supply parts, and an extension length of the third power supply part in the extension direction of the data lines is greater than an average width of the third power supply parts. The oblique direction is a direction in which the second power supply part and the first power supply part have the included angle therebetween.

In an exemplary implementation, the average width of the third power supply parts is smaller than the average width of the first power supply parts.

In an exemplary implementation, a distance between an edge of the first power supply part close to a side of the third power supply part in the extension direction of the gate lines and an edge of the third power supply part close to a side of the first power supply part in the extension direction of the gate lines is equivalent to the average width of the third power supply parts.

In an exemplary implementation, the display substrate further includes a first connection part, a second electrode of a storage capacitor in at least one sub-pixel and a second electrode of a storage capacitor in an adjacent sub-pixel in the extension direction of the gate lines are connected with each other through the first connection part; in at least one sub-pixel, there is an overlapping area between an orthographic projection of the second power supply part on the base substrate and an orthographic projection of the second electrode of the storage capacitor on the base substrate, or there is an overlapping area between an orthographic projection of the second power supply part on the base substrate and an orthographic projection of the first connection part on the base substrate.

In an exemplary implementation, there is an overlapping area between the orthographic projection of the second power supply part on the base substrate and an orthographic projection of a first electrode of the storage capacitor on the base substrate.

In an exemplary implementation, there is an overlapping area between the orthographic projection of the second power supply part on the base substrate and an orthographic projection of the gate lines on the base substrate.

In an exemplary implementation, the plurality of transistors include a second transistor, and there is an overlapping area between an orthographic projection of the first power supply part on the base substrate and an orthographic projection of the second transistor on the base substrate.

In an exemplary implementation, the display substrate further includes a fifth insulating layer arranged on the fourth conductive layer and a fifth conductive layer arranged on the fifth insulating layer. The fifth insulating layer is provided with a fifth via configured to connect the fifth conductive layer with the fourth conductive layer. There is no overlapping area between an orthographic projection of the fifth via on the base substrate and an orthographic projection of the sub-power line on the base substrate.

In an exemplary implementation, in at least one sub-pixel, there is an overlapping area between an orthographic projection of the fifth via on the base substrate and an orthographic projection of a virtual extension line of the first power supply part in the sub-power line in the extension direction of the data lines on the base substrate.

In an exemplary implementation, the first insulating layer, the second insulating layer and the third insulating layer are provided with an eighth via configured to enable the data line to write a data signal to the semiconductor layer. There is no overlapping area between an orthographic projection of the eighth via on the base substrate and orthographic projections of the first power supply part and the second power supply part in the sub-power line on the base substrate.

In an exemplary implementation, in at least one sub-pixel, there is an overlapping area between the orthographic projection of the eighth via on the base substrate and an orthographic projection of a virtual extension line of the third power supply part in the sub-power line in the extension direction of the data lines on the base substrate.

In an exemplary implementation, the power lines are arranged on the third conductive layer or on the fourth conductive layer, and the power lines are arranged on a same layer as the data lines.

In an exemplary implementation, the power lines are arranged on the third conductive layer and the data lines are arranged on the fourth conductive layer, or the data lines are arranged on the third conductive layer and the power lines are arranged on the fourth conductive layer.

In an exemplary implementation, the display substrate further includes a first connection part. A second electrode of a storage capacitor in at least one sub-pixel and a second electrode of a storage capacitor in an adjacent sub-pixel in the extension direction of the gate lines are connected with each other through the first connection part.

In an exemplary implementation, there is at least one area including 2*4 sub-pixels. In one row, a second electrode of a storage capacitor in a first sub-pixel and a second electrode of a storage capacitor in a second sub-pixel are connected with each other through the first connection part, the second electrode of the storage capacitor in the second first sub-pixel is directly connected with a second electrode of a storage capacitor in a third sub-pixel, and the second electrode of the storage capacitor in the third sub-pixel and a second electrode of a storage capacitor in a fourth sub-pixel are connected with each other through the first connection part. In the other row, a second electrode of a storage capacitor in a first sub-pixel is directly connected with a second electrode of a storage capacitor in a second sub-pixel, the second electrode of the storage capacitor in the second sub-pixel and a second electrode of a storage capacitor in a third sub-pixel are connected with each other through the first connection part, and the second electrode of the storage capacitor in the third sub-pixel is directly connected with a second electrode of a storage capacitor in a fourth sub-pixel.

In an exemplary implementation, a semiconductor layer in a first sub-pixel is spaced apart from a semiconductor layer in a second sub-pixel, the semiconductor layer in the second sub-pixel is spaced apart from a semiconductor layer in a third sub-pixel, and the semiconductor layer in the third sub-pixel is spaced apart from a semiconductor layer in a fourth sub-pixel.

In an exemplary implementation, the third conductive layer includes a first pole of a fifth transistor. A first pole of a fifth transistor in a first sub-pixel is spaced apart from a first pole of a fifth transistor in a second sub-pixel, the first pole of the fifth transistor in the second sub-pixel is spaced apart from a first pole of a fifth transistor in a third sub-pixel, and the first pole of the fifth transistor in the third sub-pixel is spaced apart from a first pole of a fifth transistor in a fourth sub-pixel.

In an exemplary implementation, there is at least one area including 2*4 sub-pixels. In one row, a second electrode of a storage capacitor in a first sub-pixel and a second electrode of a storage capacitor in a second sub-pixel are connected with each other through the first connection part, the second electrode of the storage capacitor in the second sub-pixel is disconnected from a second electrode of a storage capacitor in a third sub-pixel, and the second electrode of the storage capacitor in the third sub-pixel and a second electrode of a storage capacitor in a fourth sub-pixel are connected with each other through the first connection part. In the other row, a second electrode of a storage capacitor in a first sub-pixel is disconnected from a second electrode of a storage capacitor in a second sub-pixel, the second electrode of the storage capacitor in the second sub-pixel and a second electrode of a storage capacitor in a third sub-pixel are connected with each other through the first connection part, and the second electrode of the storage capacitor in the third sub-pixel is disconnected from a second electrode of a storage capacitor in a fourth sub-pixel.

In an exemplary implementation, the third conductive layer includes a first pole of a fifth transistor and a second connection part. In one row, a first pole of a fifth transistor in a first sub-pixel is disconnected from a first pole of a fifth transistor in a second sub-pixel, the first pole of the fifth transistor in the second sub-pixel and a first pole of a fifth transistor in a third sub-pixel are connected with each other through the second connection part, and the first pole of the fifth transistor in the third sub-pixel is disconnected from a first pole of a fifth transistor in a fourth sub-pixel. In the other row, a first pole of a fifth transistor in a first sub-pixel and a first pole of a fifth transistor in a second sub-pixel are connected with each other through the second connection part, the first pole of the fifth transistor in the second sub-pixel is disconnected from a first pole of a fifth transistor in a third sub-pixel, and the first pole of the fifth transistor in the third sub-pixel and a first pole of a fifth transistor in a fourth sub-pixel are connected with each other through the second connection part.

In an exemplary implementation, in the extension direction of the gate lines, the power lines are connected with each other through the second electrodes of the storage capacitors and the first poles of the fifth transistors.

In an exemplary implementation, the fourth insulating layer is provided with first vias exposing the first poles of the fifth transistors, the third insulating layer is provided with second vias exposing the second electrodes of the storage capacitors, the power lines are connected with the first poles of the fifth transistors through the first vias, and the first poles of the fifth transistors are connected with the second electrodes of the storage capacitors through the second vias.

In an exemplary implementation, in at least one sub-pixel, there is one first via and a plurality of second vias, and the plurality of second vias are arranged in the extension direction of the data lines. The orthographic projection of the power lines on the base substrate includes an orthographic projection of the first via on the base substrate, and the orthographic projection of the first pole of the fifth transistor on the base substrate includes an orthographic projection of the second vias on the base substrate.

In an exemplary implementation, the semiconductor layer includes a third connection part. In one row, a semiconductor layer in a first sub-pixel is disconnected from a semiconductor layer in a second sub-pixel, the semiconductor layer in the second sub-pixel and a semiconductor layer in a third sub-pixel are connected with each other through the third connection part, and the semiconductor layer in the third sub-pixel is disconnected from a semiconductor layer in a fourth sub-pixel. In the other row, a semiconductor layer in a first sub-pixel and a semiconductor layer in a second sub-pixel are connected with each other through the third connection part, the semiconductor layer in the second sub-pixel is disconnected from a semiconductor layer in a third sub-pixel, and the semiconductor layer in the third sub-pixel and a semiconductor layer in a fourth sub-pixel are connected with each other through the third connection part.

In an exemplary implementation, in the extension direction of the gate lines, the power lines are connected with each other through the third connection part of the semiconductor layer and the second electrodes of the storage capacitors.

In an exemplary implementation, the third insulating layer is provided with eleventh vias exposing the second electrodes of the storage capacitors, and the first insulating layer, the second insulating layer and the third insulating layer are provided with twelfth vias exposing the third connection part of the semiconductor layer. The power lines are connected with the second electrodes of the storage capacitors through the eleventh vias, and the power lines are connected with the third connection part of the semiconductor layer through the twelfth vias.

In an exemplary implementation, in at least one sub-pixel, there is one eleventh via and a plurality of twelfth vias. The plurality of twelfth vias are arranged in the extension direction of the data lines. The orthographic projection of the power lines on the base substrate includes orthographic projections of the eleventh via and the twelfth vias on the base substrate.

In an exemplary implementation, the plurality of transistors include a first transistor, a second transistor, a third transistor, a fourth transistor, a fifth transistor, a sixth transistor and a seventh transistor. In at least one sub-pixel, the semiconductor layer at least includes a first active region at a position where the first transistor is located, a second active region at a position where the second transistor is located, a third active region at a position where the third transistor is located, a fourth active region at a position where the fourth transistor is located, a fifth active region at a position where the fifth transistor is located, a sixth active region at a position where the sixth transistor is located, and a seventh active region at a position where the seventh transistor is located. The first active region, the second active region, the third active region, the fourth active region, the fifth active region, the sixth active region and the seventh active region are an integrated structure.

In an exemplary implementation, a distance between the second active region and the first active region in the extension direction of the gate lines is smaller than a distance between the second active region and the seventh active region in the extension direction of the gate lines.

In an exemplary implementation, the seventh active region and the first active region are sequentially arranged in a direction from the data lines to the power lines in which data signals are written.

In an exemplary implementation, at least one sub-pixel includes a first region, a second region and a third region which are sequentially arranged in the extension direction of the data lines. The first active region and the seventh active region are arranged on a side of the first region away from the second region, the second active region and the fourth active region are arranged on a side of the first region close to the second region, the third active region is arranged in the second region, and the fifth active region and the sixth active region are arranged in the third region.

In an exemplary implementation, the first pole of the first transistor is connected with an initial signal line, the second pole of the first transistor is connected with the first electrode of the storage capacitor, the first pole of the second transistor is connected with the first electrode of the storage capacitor, the second pole of the second transistor is connected with the second pole of the sixth transistor, the first pole of the third transistor is connected with the second pole of the fourth transistor, the second pole of the third transistor is connected with the second pole of the sixth transistor, the first pole of the fourth transistor is connected with a data line, the first pole of the fifth transistor is connected with a power line, the second pole of the fifth transistor is connected with the first pole of the third transistor, the second pole of the sixth transistor is connected with an anode of a light-emitting device, the first pole of the seventh transistor is connected with an initial signal line, the second pole of the seventh transistor is connected with the anode of the light-emitting device; the first active region is respectively connected with the second active region and the seventh active region, the second active region is respectively connected with the third active region and the sixth active region, and the fourth active region is respectively connected with the third active region and the fifth active region.

In an exemplary implementation, semiconductor layers of adjacent sub-pixels are symmetrical with each other in the extension direction of the gate lines.

In an exemplary implementation, there is at least one area including 2*2 sub-pixels. A shape of a semiconductor layer in a first sub-pixel in one row is the same as a shape of a semiconductor layer in a second sub-pixel in the other row, and a shape of a semiconductor layer in a second sub-pixel in one row is the same as a shape of a semiconductor layer in a first sub-pixel in the other row.

In an exemplary implementation, the semiconductor layer includes a third connection part. A semiconductor layer in at least one sub-pixel is connected with a semiconductor layer in an adjacent sub-pixel in the extension direction of the gate lines through the third connection part.

In an exemplary implementation, the third connection part is connected with the active region of the fifth transistor.

In an exemplary implementation, there is an overlapping area between an orthographic projection of the third connection part on the base substrate and the orthographic projection of the power lines on the base substrate.

In an exemplary implementation, the first insulating layer, the second insulating layer and the third insulating layer are provided with twelfth vias exposing the third connection part, and the power lines are connected with the third connection part through the twelfth vias.

In an exemplary implementation, there is at least one area including 2*4 sub-pixels. In one row, a semiconductor layer in a first sub-pixel is disconnected from a semiconductor layer in a second sub-pixel, the semiconductor layer in the second sub-pixel and a semiconductor layer in a third sub-pixel are connected with each other through the third connection part, and the semiconductor layer in the third sub-pixel is disconnected from a semiconductor layer in a fourth sub-pixel. In the other row, a semiconductor layer in a first sub-pixel and a semiconductor layer in a second sub-pixel are connected with each other through the third connection part, the semiconductor layer in the second sub-pixel is disconnected from a semiconductor layer in a third sub-pixel, and the semiconductor layer in the third sub-pixel and a semiconductor layer in a fourth sub-pixel are connected with each other through the third connection part.

In an exemplary implementation, there is at least one pixel column, and in the extension direction of the data lines, the data line includes a plurality of sub-data lines connected sequentially; and there is at least one sub-pixel, such that two sub-data lines are arranged between the sub-pixel and an adjacent sub-pixel in the extension direction of the gate lines.

In an exemplary implementation, the two sub-data lines are parallel to each other.

In an exemplary implementation, in at least one sub-pixel, the first insulating layer, the second insulating layer and the third insulating layer are provided with eighth vias exposing the semiconductor layer, the fourth insulating layer is provided with third vias exposing the first pole of the fourth transistor, the data line is connected with the first pole of the fourth transistor through the third via, and the first pole of the fourth transistor is connected with the semiconductor layer through the eighth via.

In an exemplary implementation, in the extension direction of the gate lines, the eighth vias of adjacent sub-pixels are symmetrical with each other.

In an exemplary implementation, the data lines are arranged on a third conductor layer, and the power lines are arranged on the third conductor layer.

In an exemplary implementation, the data lines are arranged on the fourth conductor layer, and the power lines are arranged on the third conductor layer or the fourth conductor layer.

In an exemplary implementation, in at least one column of sub-pixels, the data line includes a first sub-data line and a second sub-data line, which are located on two sides of the column of sub-pixels, respectively.

In an exemplary implementation, the power line is located between the first sub-data line and the second sub-data line.

In an exemplary implementation, pixel structures of adjacent sub-pixels are symmetrical with each other in the extension direction of the gate lines.

In an exemplary implementation, there is at least one area including 2*2 sub-pixels, in which a pixel structure of a first sub-pixel in one row is the same as a pixel structure of a second sub-pixel in the other row, and a pixel structure of a second sub-pixel in one row is the same as a pixel structure of a first sub-pixel in the other row.

In an exemplary implementation, the display substrate further includes a reset signal line, a light emission control line and an initial signal line; the semiconductor layer at least includes active regions of a plurality of transistors, the first conductor layer at least includes a gate line, a light emission control line, a reset signal line, a first electrode of a storage capacitor, and gate electrodes of a plurality of transistors, the second conductor layer at least includes an initial signal line and a second electrode of a storage capacitor; and the third conductor layer at least includes source and drain electrodes of a plurality of transistors, and the fourth conductor layer at least includes a data line and a power line.

In an exemplary implementation, at least one sub-pixel includes a first region, a second region and a third region which are sequentially arranged in the extension direction of the data line; and the gate line, the initial signal line and the reset signal line are located in the first region, the first electrode and the second electrode of the storage capacitor are located in the second region, and the light emission control line is located in the third region.

In an exemplary implementation, the second conductor layer further includes a shield electrode, and in at least one sub-pixel, there is an overlapping area between an orthographic projection of the shield electrode on the base substrate and the orthographic projection of the power lines on the base substrate.

In an exemplary implementation, the power line is connected with the shield electrode through a via.

In an exemplary implementation, the shield electrode is arranged between the gate line and the reset signal line in the extension direction of the data lines.

In an exemplary implementation, the shield electrode includes a first part extending in the extension direction of the gate lines and a second part extending in the extension direction of the data lines, and an end of the first part close to the second part is connected with an end of the second part close to the first part.

In an exemplary implementation, the first conductor layer further includes a gate block extending in the extension direction of the data lines. The gate block is connected with the gate line. In the extension direction of the data lines, the gate block and the second part of the shield electrode have opposite areas therebetween.

In an exemplary implementation, the source and drain electrodes of the plurality of transistors include the first pole of the second transistor. The second insulating layer and the third insulating layer are provided with seventh vias exposing the first electrode of the storage capacitor. The first insulating layer, the second insulating layer and the third insulating layer are provided with ninth vias exposing the active region of the second transistor. One end of the first pole of the second transistor is connected with the first electrode of the storage capacitor through the seventh via, and the other end of the first pole of the second transistor is connected with the active region of the second transistor through the ninth via.

In an exemplary implementation, there is an overlapping area between an orthographic projection of the first pole of the second transistor on the base substrate and an orthographic projection of the gate line on the base substrate, and there is no overlapping area between the orthographic projection of the first pole of the second transistor on the base substrate and orthographic projections of the light emission control line, the reset signal line and the initial signal line on the base substrate.

In an exemplary implementation, the source and drain electrodes of the plurality of transistors include a first pole of a first transistor. The third insulating layer is provided with sixth vias exposing the initial signal line. The first insulating layer, the second insulating layer and the third insulating layer are provided with tenth vias exposing the active region of the first transistor. One end of the first pole of the first transistor is connected with the initial signal line through the sixth via, and the other end of the first pole of the first transistor is connected with the active region of the first transistor through the tenth via.

In an exemplary implementation, there is an overlapping area between an orthographic projection of the first pole of the first transistor on the base substrate and an orthographic projection of the reset signal line on the base substrate, and there is no overlapping area between the orthographic projection of the first pole of the first transistor on the base substrate and orthographic projections of the gate line and the light emission control line on the base substrate.

In an exemplary implementation, the display substrate further includes a fifth insulating layer arranged on the fourth conductive layer and a fifth conductive layer arranged on the fifth insulating layer. The fourth conductor layer further includes a connection electrode, and the source and drain electrodes of the plurality of transistors include a second pole of a sixth transistor. The fourth insulating layer is provided with fourth vias exposing the second pole of the sixth transistor, and the fifth insulating layer is provided with fifth vias exposing the connection electrode. The connection electrode is connected with the second pole of the sixth transistor through the fourth via, and the fifth conductor layer is connected with the connection electrode through the fifth via.

In an exemplary implementation, there is an overlapping area between an orthographic projection of the connection electrode on the base substrate and an orthographic projection of the first pole of the second transistor on the base substrate.

In an exemplary implementation, at least one sub-pixel at least includes: a first via exposing a first pole of a fifth transistor, the first via being configured to connect the first pole of the fifth transistor with the power line; a second via exposing a second electrode of a storage capacitor, the second via being configured to connect the second electrode with the first pole of the fifth transistor; a third via exposing a first pole of a fourth transistor, the third via being configured to connect the first pole of the fourth transistor with the data line; a fourth via exposing a second pole of a sixth transistor, the fourth via being configured to connect the second pole of the sixth transistor with a connection electrode; a fifth via exposing the connection electrode, the fifth via being configured to connect the connection electrode with an anode of the fifth conductor layer; a sixth via exposing the initial signal line, the sixth via being configured to connect the initial signal line with a first pole of a first transistor; a seventh via exposing a first electrode of the storage capacitor, the seventh via being configured to connect the first electrode with a first pole of a second transistor; an eighth via exposing an active region of the fourth transistor, the eighth via being configured to connect the active region of the fourth transistor with the first pole of the fourth transistor; a ninth via exposing an active region of the second transistor, the ninth via being configured to connect the active region of the second transistor with the first pole of the second transistor; and a tenth via exposing an active region of the first transistor, the tenth via being configured to connect the active region of the first transistor with the first pole of the first transistor.

In an exemplary implementation, at least one sub-pixel at least includes: an eleventh via exposing the second electrode of the storage capacitor, the eleventh via being configured to connect the second electrode with the power line; and a twelfth via exposing a third connection part, the twelfth via being configured to connect the third connection part with the power line.

A display apparatus, including the abovementioned display substrate, is provided.

A method for manufacturing a display substrate is provided and configured to manufacture the above display substrate. The display substrate includes, in a plane parallel to the display substrate, gate lines, data lines, power lines and a plurality of sub-pixels arranged on a base substrate. At least one sub-pixel includes a light-emitting device and a driving circuit configured to drive the light-emitting device to emit light, and the driving circuit includes a plurality of transistors and a storage capacitor.

The method includes: providing a base substrate; and forming a plurality of functional layers on the base substrate, the plurality of functional layers including a semiconductor layer, a first conductive layer, a second conductive layer, a third conductive layer and a fourth conductive layer which are sequentially arranged, a first insulating layer, a second insulating layer, a third insulating layer and a fourth insulating layer being respectively arranged between the plurality of functional layers, and in an extension direction of the gate lines, the power lines being connected with each other through at least one functional layer.

Other aspects will become apparent upon reading and understanding accompanying drawings and the detailed description.

BRIEF DESCRIPTION OF DRAWINGS

Accompanying drawings are used to provide an understanding of technical solutions of the present application and form a part of the specification. Together with embodiments of the present application, they are used to explain technical solutions of the present application and do not constitute a limitation on the technical solutions of the present application.

DETAILED DESCRIPTION

Figure 1:
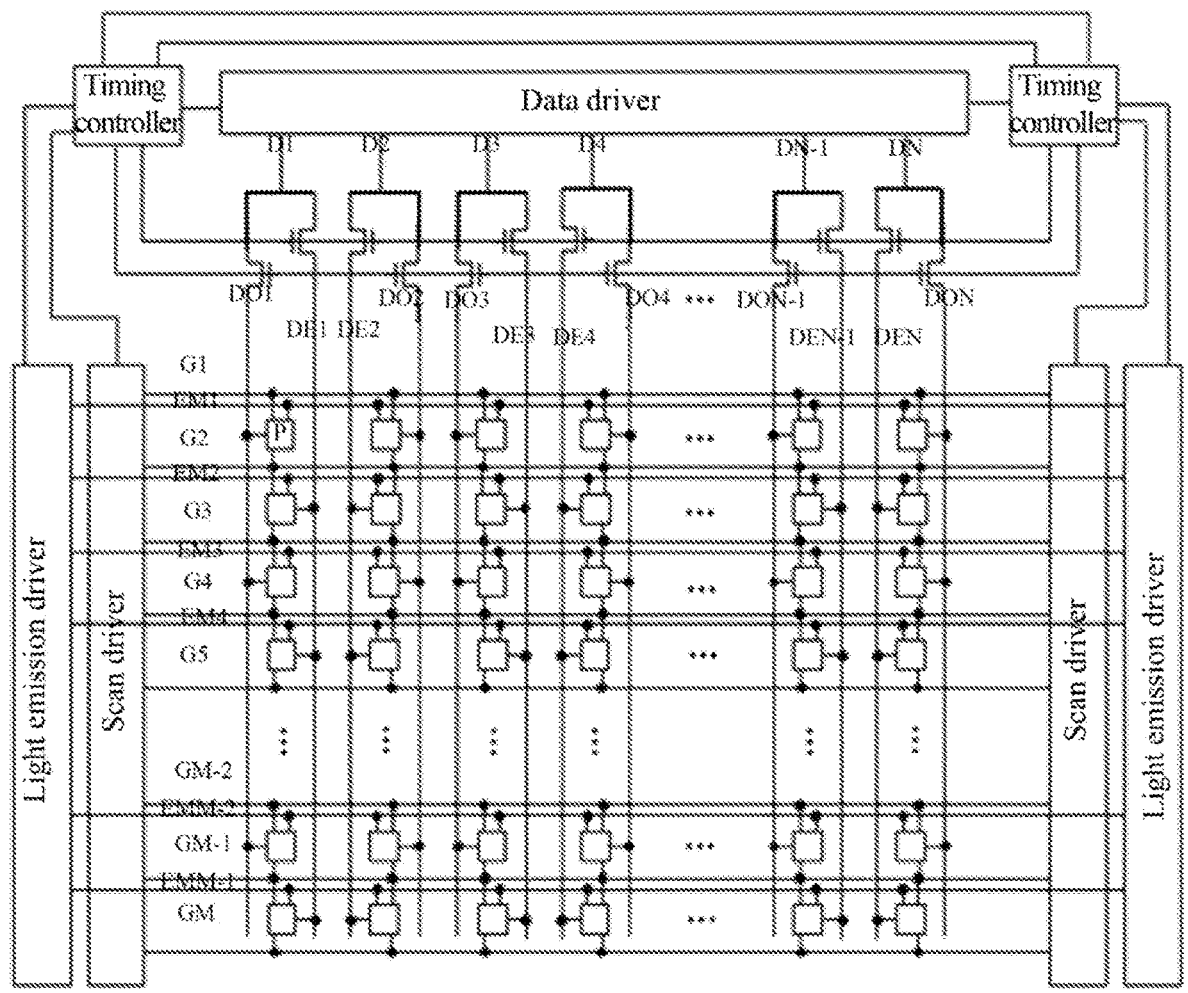
FIG. 1 is a schematic structural diagram of a display substrate according to the present application.

A plurality of embodiments are described in the present application, but the description is exemplary rather than limiting, and it is obvious to those of ordinary skills in the art that there may be more embodiments and implementation solutions within the scope of the embodiments described in the present application. Although many possible combinations of features are shown in the drawings and discussed in the Detailed Description, many other combinations of the disclosed features are also possible. Unless specifically limited, any feature or element of any embodiment may be used in combination with or in place of any other feature or element of any other embodiment.

The present application includes and contemplates combinations with features and elements known to those of ordinary skills in the art. Embodiments, features and elements already disclosed in this application may also be combined with any conventional features or elements to form a unique inventive solution defined by the claims. Any feature or element of any embodiment may also be combined with features or elements from other inventive solutions to form another unique inventive solution defined by the claims. Therefore, it should be understood that any of the features shown and/or discussed in the present application may be implemented individually or in any suitable combination. Therefore, the embodiments are not otherwise limited except in accordance with the appended claims and equivalents thereof. In addition, various modifications and changes can be made within the protection scope of the appended claims.

In addition, when describing representative embodiments, the specification may have presented a method and/or a process as a specific sequence of steps. However, to the extent that the method or process does not depend on the specific order of steps described herein, the method or process should not be limited to the specific order of steps described. As those of ordinary skills in the art will understand, other orders of steps are also possible. Therefore, the specific order of steps set forth in the specification should not be interpreted as limiting the claims. Furthermore, the claims for the method and/or process should not be limited to performing their steps in the written order, and those skilled in the art may easily understand that these orders can be varied and still remain within the spirit and scope of the present application.

Unless otherwise defined, technical terms or scientific terms used in the embodiments of the present invention shall have common meanings as construed by those of ordinary skills in the art to which the present invention pertains. The words "first", "second" and the like used in the embodiments of the present invention do not represent any order, quantity or importance, but are merely used to distinguish among different components. Similar words such as "including" or "comprising" mean that elements or articles preceding the words cover elements or articles listed after the words and their equivalents, and do not exclude other elements or articles. Similar words such as "connect" or "link" are not limited to physical or mechanical connections, but may include electrical connections, whether direct or indirect. "Up", "down", "left", "right", etc. are only used to represent a relative position relationship that may change accordingly when an absolute position of an object being described changes.

The term "about" herein means that the limit is not strictly set, and a value within the range of process and measurement errors is allowed. The term "equivalent" herein refers to a state in which a ratio of one dimension to another dimension is 0.8 to 1.2.

Some embodiments of the present application provide a display substrate. The display substrate includes, in a plane parallel to the display substrate, gate lines, data lines, power lines and a plurality of sub-pixels arranged on a base substrate. At least one sub-pixel includes a light-emitting device and a driving circuit configured to drive the light-emitting device to emit light. The driving circuit includes a plurality of transistors and a storage capacitor. The display substrate includes, in a plane perpendicular to the display substrate, a base substrate and a plurality of functional layers arranged on the base substrate. The plurality of functional layers includes a semiconductor layer, a first conductive layer, a second conductive layer, a third conductive layer and a fourth conductive layer which are sequentially arranged. A first insulating layer, a second insulating layer, a third insulating layer and a fourth insulating layer are respectively arranged between the plurality of functional layers, and in an extension direction of the gate lines, the power lines are connected with each other through at least one functional layer. In an exemplary embodiment, the display substrate further includes a fifth insulating layer arranged on the fourth conductive layer and a fifth conductive layer arranged on the fifth insulating layer.

Figure 2:
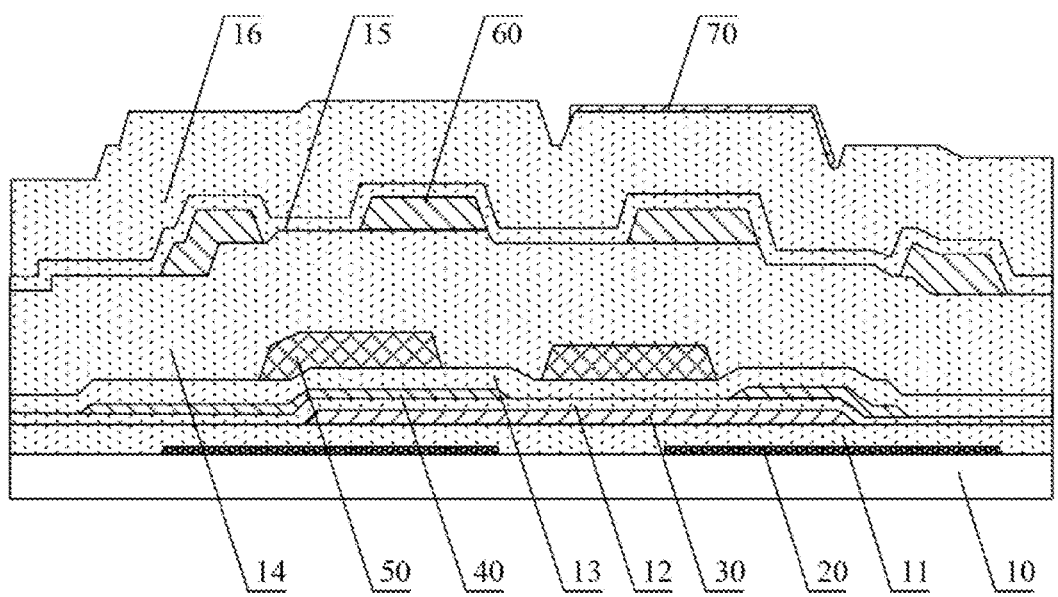
FIG. 2 is a side view of a sub-pixel in a display substrate according to the present application.
Figure 3:
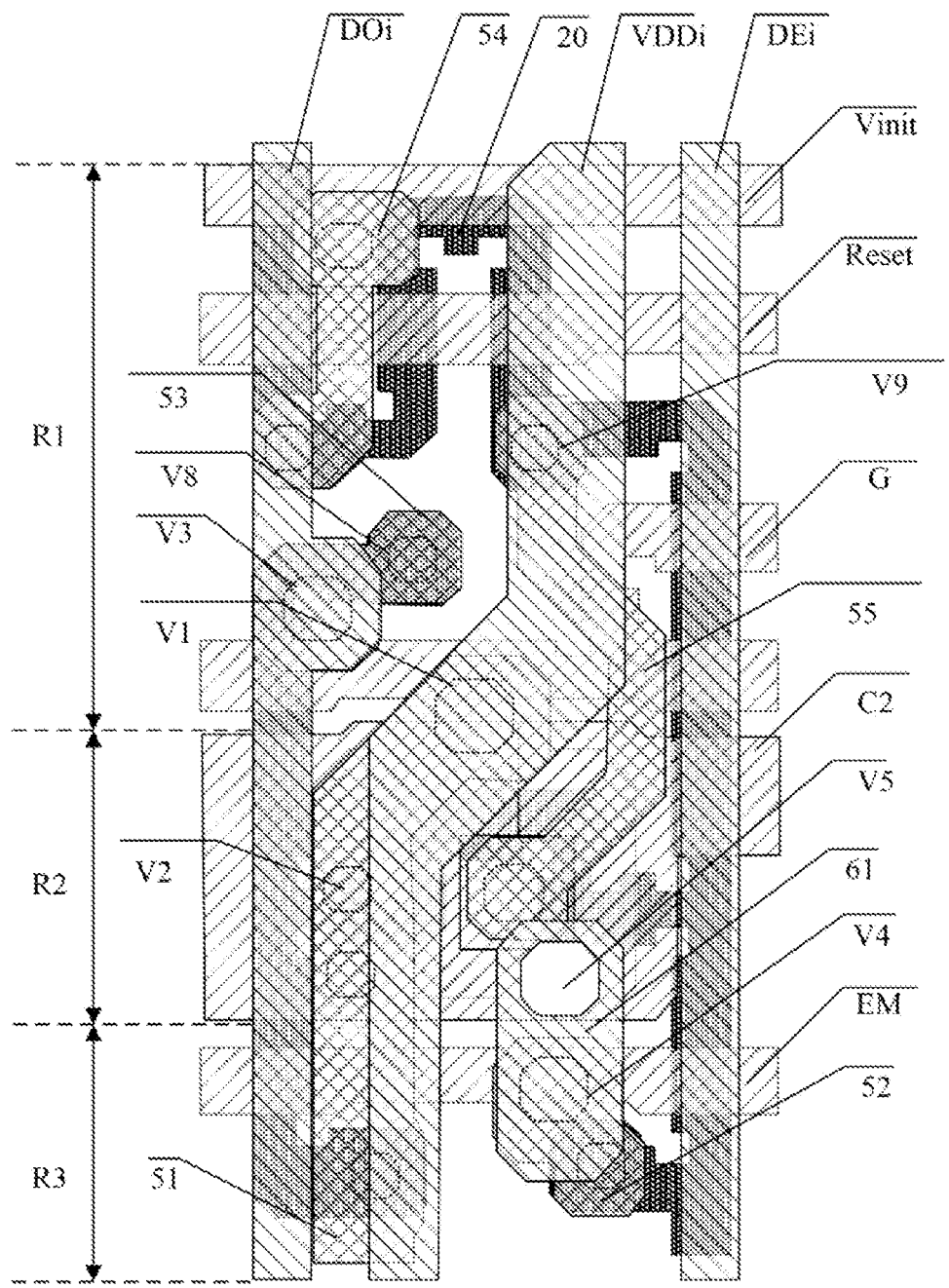
FIG. 3 is a top view of a sub-pixel in a display substrate according to the present application.

FIG. 1 is a schematic structural diagram of a display substrate according to the present application, FIG. 2 is a side view of a sub-pixel in a display substrate according to the present application, and FIG. 3 is a top view of a sub-pixel in a display substrate according to the present application. As shown in FIGS. 1-3, in a plane parallel to the display substrate, the display substrate according to the present application is provided with a gate line G, a data line D, a power line VDD, a reset signal line Reset, a light emission control line EM, an initial signal line Vinit and a plurality of sub-pixels P. Each sub-pixel includes: a light-emitting device and a driving circuit configured to drive the light-emitting device to emit light. The driving circuit includes a plurality of transistors and a storage capacitor. In a plane perpendicular to the display substrate, the display substrate includes: a base substrate 10, and a semiconductor layer 20, a first metal layer 30, a second metal layer 40, a third metal layer 50, a fourth metal layer 60 and a fifth metal layer 70 that are arranged on the base substrate 10 and insulated from each other. The first metal layer 30 serves as the first conductive layer, the second metal layer 40 serves as the second conductive layer, the third metal layer 50 serves as the third conductive layer, the fourth metal layer 60 serves as the fourth conductive layer, and the fifth metal layer 70 serves as the fifth conductive layer. In an exemplary embodiment, the display substrate includes a display area (AA) and a frame area located at a periphery of the display area. The display area includes a plurality of display sub-pixels, and the frame area includes a plurality of Dummy sub-pixels. The sub-pixels described herein refer to display sub-pixels in the display area.

In an exemplary embodiment, the semiconductor layer 20 may include active regions of the plurality of transistors. The first metal layer 30 may include the gate line G, the light emission control line EM, the reset signal line Reset, a first electrode C1 of the storage capacitor and gate electrodes of the plurality of transistors. The second metal layer 40 may include the initial signal line Vinit and a second electrode C2 of the storage capacitor. The third metal layer 50 may include first poles and second poles of the plurality of transistors. The fourth metal layer 60 may include the data line D and the power line VDD. The fifth metal layer 70 may include an anode of the light-emitting device.

In an exemplary embodiment, in the extension direction of the data line, the data line may include a plurality of sub-data lines connected sequentially, and the plurality of sub-data lines correspond to the plurality of sub-pixels. There is at least one sub-pixel, such that two sub-data lines are arranged between the sub-pixel and an adjacent sub-pixel in the extension direction of the gate line. In an exemplary embodiment, the two sub-data lines are parallel to each other.

As shown in FIG. 1, in an exemplary embodiment, M rows*N columns of sub-pixels, N columns of data lines D1-DN, N columns of power lines VDD1-VDDN, M rows of gate lines G1-GM, M−1 rows of light emission control lines EM1-EMM−1, a reset signal line Reset and an initial signal line Vinit may be arranged in the display substrate. The display substrate may further include: a data driver configured to provide data signals to the data lines, a scan driver configured to provide scan signals to the gate lines, a light emission driver configured to provide light emission control signals to the light emission control lines, and a timing controller configured to provide driving signals to the data driver, the scan driver and the light emission driver.

In some possible implementations, as shown in FIG. 1, driving circuits in the i-th column of sub-pixels are connected with the i-th column of data line. Each column of data line includes a first sub-data line DO and a second sub-data line DE. The first sub-data line DOi and the second sub-data line DEi in the i-th column of data line are located on two sides of the i-th column of sub-pixels, respectively, and 1≤i≤N, N is the number of total columns of sub-pixels.

In some possible implementations, two sub-data lines are arranged between two adjacent columns of sub-pixels, i.e., a first sub-data line DO of one column of sub-pixels and a second sub-data line DE of the adjacent column of sub-pixels are arranged between two adjacent columns of sub-pixels, or a second sub-data line DE of one column of sub-pixels and a first sub-data line DO of the adjacent column of sub-pixels are arranged between two adjacent columns of sub-pixels.

For example, the first sub-data line Doi of the i-th column of data line is located on a side of the i-th column of sub-pixels close to the i+1-th column of sub-pixels, and the first sub-data line DOi+1 of the i+1-th column of data line is located on a side of the i+1-th column of sub-pixels close to the i-th column of sub-pixels. Alternatively, the second sub-data line DEi of the i-th column of data line is located on a side of the i-th column of sub-pixels close to the i+1-th column of sub-pixels, and the second sub-data line DEi+1 of the i+1-th column of data line is located on a side of the i+1-th column of sub-pixels close to the i-th column of sub-pixels.

In some possible implementations, the base substrate 10 may be a rigid underlay substrate or a flexible underlay substrate. The rigid underlay substrate may be, but is not limited to, one or more of glass and metal foils. The flexible underlay substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

In some possible implementations, a manufacturing material of the semiconductor layer 20 may be polysilicon or metal oxides, which is not limited in the present application.

In some possible implementations, a manufacturing material of the first metal layer may be metallic materials such as silver, aluminum or copper, which is not limited in the present application In some possible implementations, a manufacturing material of the second metal layer may be metallic materials such as silver, aluminum or copper, which is not limited in the present application.

In some possible implementations, a manufacturing material of the third metal layer may be metallic materials such as silver, aluminum or copper, which is not limited in the present application.

In some possible implementations, a manufacturing material of the fourth metal layer may be metallic materials such as silver, aluminum or copper, which is not limited in the present application.

In some possible implementations, a manufacturing material of the fifth metal layer may be metallic materials such as silver, aluminum or copper, which is not limited in the present application.

Figure 4A:
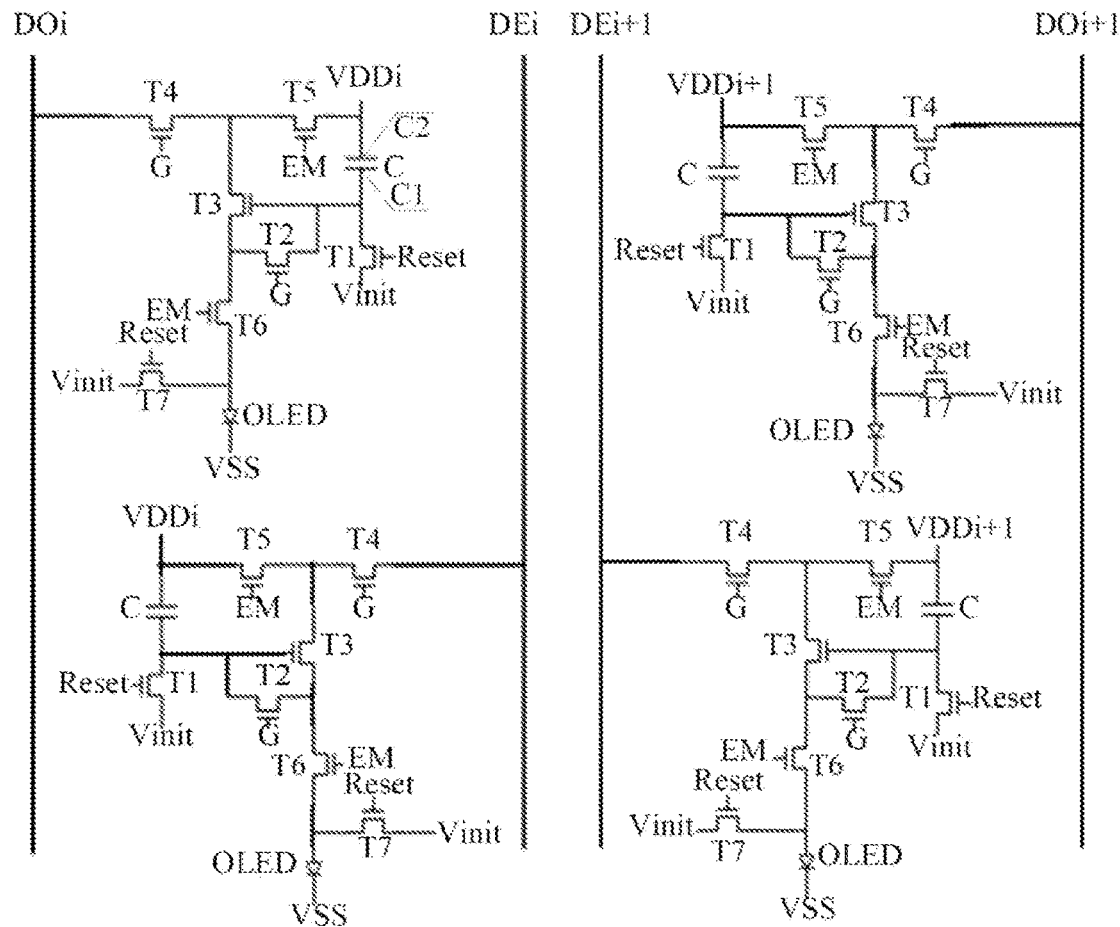
FIG. 4A is an equivalent circuit diagram of a driving circuit according to the present application.
Figure 4B:
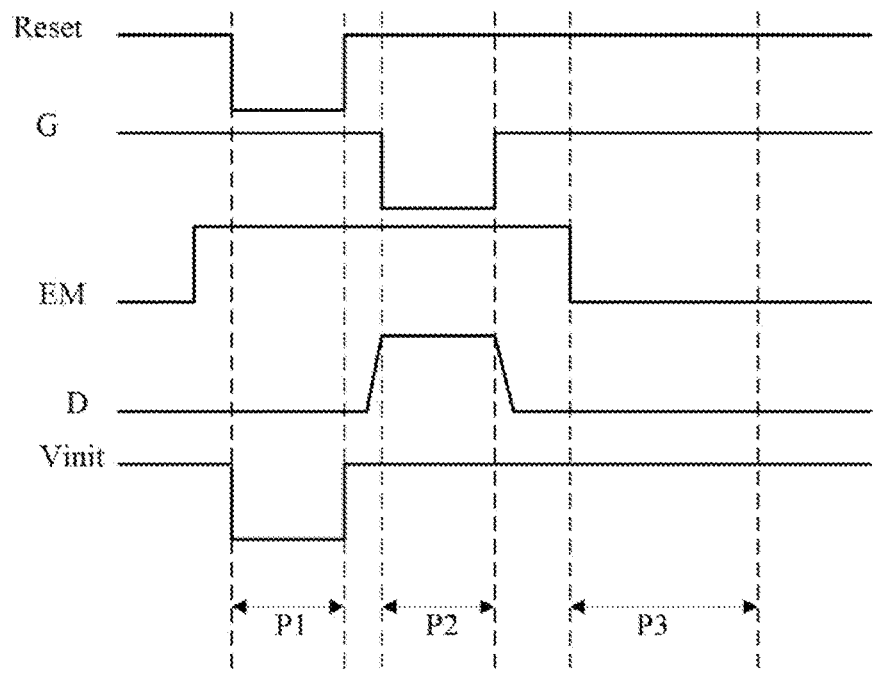
FIG. 4B is an operation timing diagram of a driving circuit according to the present application.

FIG. 4A is an equivalent circuit diagram of a driving circuit according to the present application, and FIG. 4B is an operation timing diagram of a driving circuit according to the present application. As shown in FIGS. 4A and 4B, FIG. 4A illustrates an example of driving circuits included in the i-th column of sub-pixels and the i+1-th column of sub-pixels. The driving circuit according to the present application may be a 7T1C structure, and may include: a first transistor T1 to a seventh transistor T7, and a storage capacitor C, wherein the storage capacitor C includes a first electrode C1 and a second electrode C2

In an exemplary implementation, specifically, a gate electrode of the first transistor T1 is connected with the reset signal line Reset, a first pole of the first transistor T1 is connected with the initial signal line Vinit, and a second pole of the first transistor T1 is connected with the first electrode C1 of the storage capacitor C. A gate electrode of the second transistor T2 is connected with the gate line G, a first pole of the second transistor T2 is connected with the first electrode C1 of the storage capacitor C, and a second pole of the second transistor T2 is connected with a second pole of the sixth transistor T6. A gate electrode of the third transistor T3 is connected with the first electrode C1 of the storage capacitor C, a first pole of the third transistor T3 is connected with a second pole of the fourth transistor T4, and a second pole of the third transistor T3 is connected with the second pole of the sixth transistor T6. A gate electrode of the fourth transistor T4 is connected with the gate line G, and a first pole of the fourth transistor T4 is connected with the data line D. A gate electrode of the fifth transistor T5 is connected with the light emission control line EM, a first pole of the fifth transistor T5 is connected with the power line VDD, and a second pole of the fifth transistor T5 is connected with the first pole of the third transistor T3. A gate electrode of the sixth transistor T6 is connected with the light emission control line EM, and the second pole of the sixth transistor T6 is connected with an anode of a light-emitting device. A gate electrode of the seventh transistor T7 is connected with the reset signal line Reset, a first pole of the seventh transistor T7 is connected with the initial signal line Vinit, and a second pole of the seventh transistor T7 is connected with the anode of the light-emitting device. The second electrode C2 of the storage capacitor is connected with the power line VDD, and a cathode of the light-emitting device OLED is connected with a low-level power supply terminal VSS.

In an exemplary embodiment, the third transistor T3 is a driving transistor, other transistors than the third transistor T3 are all switching transistors, and the first transistor T1 to the seventh transistor T7 may all be P-type transistors or N-type transistors, which is not limited in the present application.

Taking the case as an example where the first transistor T1 to the seventh transistor T7 are all P-type transistors, the working process of the driving circuit may include a first stage P1 (a reset stage), a second stage P2 (a writing stage) and a third stage P3 (a light emission stage).

In the first stage P1 (the reset stage), the reset signal line Reset provides an effective level, the first transistor T1 and the seventh transistor T7 are turned on, and an initial signal provided by the initial signal line Vinit initializes a signal of the second pole of the sixth transistor T6 and a signal of the first electrode C1.

In the second stage P2 (the writing stage), the gate line G provides an effective level, the second transistor T2 and the fourth transistor T4 are turned on, a data signal provided by the data line D is written to the first pole of the third transistor T3, and signals of the gate electrode and the second pole of the second transistor T2 are made to have the same potential, to enable the third transistor T3 to be turned on.

In the third stage P3 (the light emission stage), the light emission control line EM provides an effective level, the fifth transistor T5 and the sixth transistor T6 are turned on, and the power line VDD provides a driving current to the light-emitting device OLED to drive the light-emitting device to emit light.

In some possible implementations, as shown in FIG. 4A, the light-emitting device in the present application may be an OLED.

The display substrate according to the present application is provided with a gate line, a data line, a power line, a reset signal line, a light emission control line, an initial signal line and a plurality of sub-pixels. Each sub-pixel includes: a light-emitting device and a driving circuit configured to drive the light-emitting device to emit light. The driving circuit may include: a plurality of transistors and a storage capacitor. The display substrate may include: a base substrate, and a semiconductor layer, a first metal layer, a second metal layer, a third metal layer, a fourth metal layer and a fifth metal layer which are sequentially arranged on the base substrate and are insulated from each other. The semiconductor layer includes active regions of the plurality of transistors. The first metal layer includes: the gate line, the light emission control line, the reset signal line, the first electrode of the storage capacitor, and gate electrodes of the plurality of transistors. The second metal layer includes: the initial signal line and the second electrode of the storage capacitor. The third metal layer includes: source and drain electrodes of the plurality of transistors. The fourth metal layer includes: the data line and the power line. The fifth metal layer includes: the anode of the light-emitting device. The i-th column of sub-pixels are connected with the i-th column of data line. Each column of data line includes a first sub-data line and a second sub-data line. A first sub-data line and a second sub-data line in the i-th column of data line are located on two sides of the i-th column sub-pixels, respectively, 1≤i≤N, N being the number of total columns of sub-pixels.

In the present application, five metal layers are arranged, and by arranging the data line and the power line in different layers from the source and drain electrodes of the plurality of transistors, the volume occupied by the sub-pixels and the data lines connected with the sub-pixels can be reduced, thereby improving the resolution of the OLED display substrate driven by high frequency.

In some possible implementations, as shown in FIG. 3, each sub-pixel in the display substrate according to the present application may be divided into a first region R1, a second region R2 and a third region R3 which are sequentially arranged in the extension direction of the data line.

The storage capacitor is located in the second region R2. The first region R1 and the third region R3 are located on two sides of the second region R2, respectively. The initial signal line Vinit, the gate line G and the reset signal line Reset connected to the driving circuit of the sub-pixel are located in the first region R1. The light emission control line EM connected to the driving circuit of the sub-pixel is located in the third region R3.

The driving circuits of adjacent sub-pixels in the same column are connected to different sub-data lines, i.e., if the sub-pixel in the i-th row and the j-th column is connected to the first sub-data line DOj in the j-th column of data line, the sub-pixel in the i+1-th row and the j-th column is connected to the second sub-data line Dej in the j-th column of data line; and if the sub-pixel in the i-th row and the j-th column is connected to the second sub-data line DEj in the j-th column of data line, the sub-pixel in the i+1-th row and the j-th column is connected to the first sub-data line DOj in the j-th column of data line.

In some possible implementations, as can be seen from FIG. 1 and FIG. 3, the driving circuits of the i-th column of sub-pixels are also connected with the i-th column of power line, 1≤i≤N. The i-th column of power line VDDi is located between the first sub-data line DOi and the second sub-data line DEi in the i-th column of data line.

Figure 5:
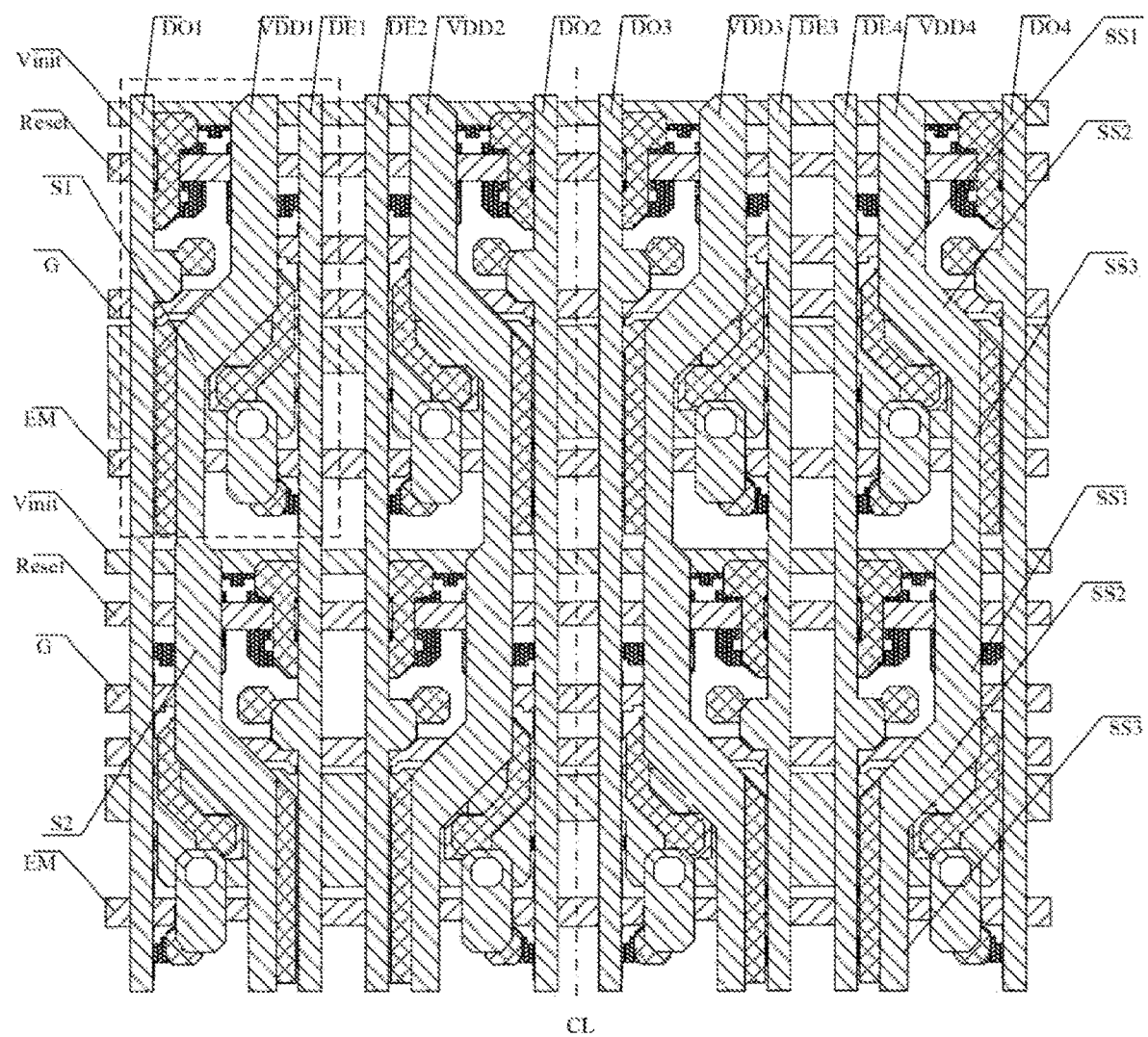
FIG. 5 is a top view of a plurality of sub-pixels in a display substrate according to the present application.

FIG. 5 is a top view of a plurality of sub-pixels in a display substrate according to the present application. As shown in FIG. 5, the pixel structures of adjacent sub-pixels in the same row are mirror symmetrical with each other about a center line CL of two sub-data lines between the adjacent sub-pixels. The pixel structure of the sub-pixel located in the i-th row and the j-th column is the same as the pixel structure of the sub-pixel located in the i-th row and the j+2-th column. The pixel structure of the sub-pixel located in the i-th row and the j+1-th column is the same as the pixel structure of the sub-pixel located in the i-th row and the j+3-th column. The pixel structure of the sub-pixel located in the i-th row and the j-th column is the same as the pixel structure of the sub-pixel located in the i+1-th row and the j+1-th column. The pixel structure of the sub-pixel located in the i-th row and the j+1-th column is the same as the pixel structure of the sub-pixel located in the i+1-th row and the j-th column. Here, the pixel structures being the same includes, but is not limited to, that the overall shapes, the connection relationship of respective parts and the trends of signal flow being the same.

As shown in FIG. 5, the power lines in two adjacent columns are mirror symmetric about a center line between the power lines in the two adjacent columns, i.e., the power lines of adjacent sub-pixels are symmetrical with each other. The center line CL of two sub-data lines located between the sub-pixel in the i-th row and the j-th column and the sub-pixel in the i-th row and the j+1-th column and the center line located between the power line in the j-th column and the power line in the j+1-th column may be the same center line.

In some possible implementations, as shown in FIG. 5, taking eight sub-pixels in two rows and four columns (an area including 2*4 sub-pixels) as an example, the power line in the i-th column includes a plurality of interconnected sub-power lines, Si to SN. The plurality of sub-power lines correspond to all sub-pixels in each column of sub-pixels one by one, and the plurality of sub-power lines are respectively arranged in the plurality of sub-pixels in the column.

In an exemplary embodiment, the shape of the sub-power line corresponding to the sub-pixel in the i-th row and the j-th column after being mirrored along the center line of the first sub-data line and the second sub-data line in the data line in the j-th column is the same as the shape of the sub-power line corresponding to the sub-pixel in the i+1-th row and the j-th column. Here, the shapes of the power lines being the same includes, but is not limited to, that the overall shapes, the connection relationship of respective parts and the trends of signal flow being the same.

In an exemplary embodiment, each sub-power line may include a first power supply part SS1, a second power supply part SS2 and a third power supply part SS3 sequentially arranged in a second direction. The second power supply part SS2 is configured to connect the first power supply part SS1 and the third power supply part SS3. The first power supply part SS1 and the third power supply part SS3 may be arranged in parallel with the data line. An included angle between the second power supply part SS2 and the first power supply part SS1 is greater than 90 degrees and smaller than 180 degrees to form a zigzag sub-power line. The second direction is the extension direction of the data line.

Herein, "parallel" refers to a state in which two straight lines form an angle of −10 degrees or more and 10 degrees or less, and thus also includes a state in which the angle is −5 degrees or more and 5 degrees or less. In addition, "vertical" refers to a state in which two straight lines form an angle of 80 degrees or more and 100 degrees or less, and thus also includes a state of an angle being 85 degrees or more and 95 degrees or less. Herein, the first power supply part being parallel to the data line means that a main body part of the first power supply part is parallel to a main body part of the data line, without limiting that an edge of the first power supply part is parallel to an edge of the data line. The edge of the first power supply part and the edge of the data line are allowed to be uneven due to process errors. A connection area where the first power supply part and the second power supply part are connected with each other may belong to the first power supply part or may belong to the second power supply part.

In an exemplary embodiment, the first power supply part SS1, the second power supply part SS2, and the third power supply part SS3 may be an integrated structure.

As shown in FIG. 5, an extension length of the first power supply part SS1 in the second direction is greater than the average width of the first power supply part SS1, an extension length of the second power supply part SS2 in an oblique direction is greater than an average width of the second power supply part SS2, and an extension length of the third power supply part SS3 in the second direction is greater than an average width of the third power supply part SS3. The oblique direction is a direction in which the second power supply part and the first power supply part have the included angle therebetween. The average width of the third power supply part SS3 is smaller than the average width of the first power supply part SS1. This, on the one hand, is for the layout of the pixel structure, and on the other hand, is because the third power supply part SS3 is relatively close to the data line, and the third power supply part SS3 with a relatively small average width can reduce parasitic capacitance. In the present application, the widths of the first power supply part SS1 and the third power supply part SS3 refer to the dimensions of the first power supply part SS1 and the third power supply part SS3 in a first direction, the width of the second power supply part SS2 refers to the dimension in a direction perpendicular to the oblique direction, the average width refers to an average value of the widths at multiple positions, and the first direction is the extension direction of the gate line.

In an exemplary embodiment, in the first direction, the distance between the center line of the first power supply part SS1 and the center line of the third power supply part SS3 is equivalent to the average width of the third power supply part SS3.

In an exemplary embodiment, the first power supply part SS1 in the sub-power line corresponding to the sub-pixel in the i-th row and the j-th column is connected with the third power supply part SS3 in the sub-power line corresponding to the sub-pixel in the i−1-th row and the j-th column. The power supply part SS3 in the sub-power line corresponding to the sub-pixel in the i-th row and the j-th column is connected with the first power supply part SS1 in the sub-power line corresponding to the sub-pixel in the i+1-th row and the j-th column. The power supply parts connected with each other are sequentially arranged in the second direction (the extension direction of the data line).

As shown in FIG. 5, the power line in the present application may have a zigzag shape.

In an exemplary embodiment, with reference to FIG. 5, the working process of each sub-pixel includes a reset stage, a writing stage and a light emission stage. In the reset stage, the reset signal line Reset located in the first metal layer and the initial signal line Vinit located in the second metal layer provide signals to initialize the driving circuit. In the writing stage, the gate line G located in the first metal layer and the data line D located in the fourth metal layer provide signals to write data signals provided by the data line D into the driving circuit. In the light emission stage, the light emission control line EM located in the first metal layer provides signals, and the power line VDD provides power signals, to enable the driving circuit to provide a driving current to the light-emitting device OLED to drive the light-emitting device to emit light.

Pixels in the same row are turned on at the same time, and pixels in adjacent rows are turned on in sequence.

In some possible implementations, as shown in FIG. 2, the display substrate according to the present application may further include a first insulating layer 11, a second insulating layer 12, a third insulating layer 13 and a fourth insulating layer 14.

The first insulating layer 11 is arranged between the semiconductor layer 20 and the first metal layer 30, the second insulating layer 12 is arranged between the first metal layer 30 and the second metal layer 40, the third insulating layer 13 is arranged between the second metal layer 40 and the third metal layer 50, and the fourth insulating layer 14 is arranged between the third metal layer 50 and the fourth metal layer 60.

In some possible implementations, materials of the first insulating layer 11, the second insulating layer 12, the third insulating layer 13 and the fourth insulating layer 14 may be silicon oxide, silicon nitride, or a composite of silicon oxide and silicon nitride, which is not limited in the present application.

In an exemplary embodiment, as shown in FIG. 4A, the plurality of transistors of each sub-pixel may include a first transistor to a seventh transistor. The first pole of the fifth transistor is respectively connected with the power line VDD and the second electrode C2 of the storage capacitor.

In the present application, for each sub-pixel, the power line in each sub-pixel is connected with the second electrode of the storage capacitor through the first pole of the fifth transistor.

Second electrodes of storage capacitors of adjacent sub-pixels located in the second metal layer may be reused as power signal lines, which are configured to ensure that power signals provided by power lines of adjacent sub-pixels are the same, thereby avoiding poor display of the display substrate and ensuring the display effect of the display substrate.

In an exemplary embodiment, every four continuous sub-pixels constitute a pixel. In the j-th pixel, four continuous sub-pixels are sequentially the i-th sub-pixel, the i+1-th sub-pixel, the i+2-th sub-pixel and the i+3-th sub-pixel in the first direction, wherein i may take the value of 4j−3 in sequence and j is a positive integer.

In an exemplary embodiment, there are multiple implementations for connecting the second electrodes of the storage capacitors of a plurality of sub-pixels to the power lines.

Figure 6A:
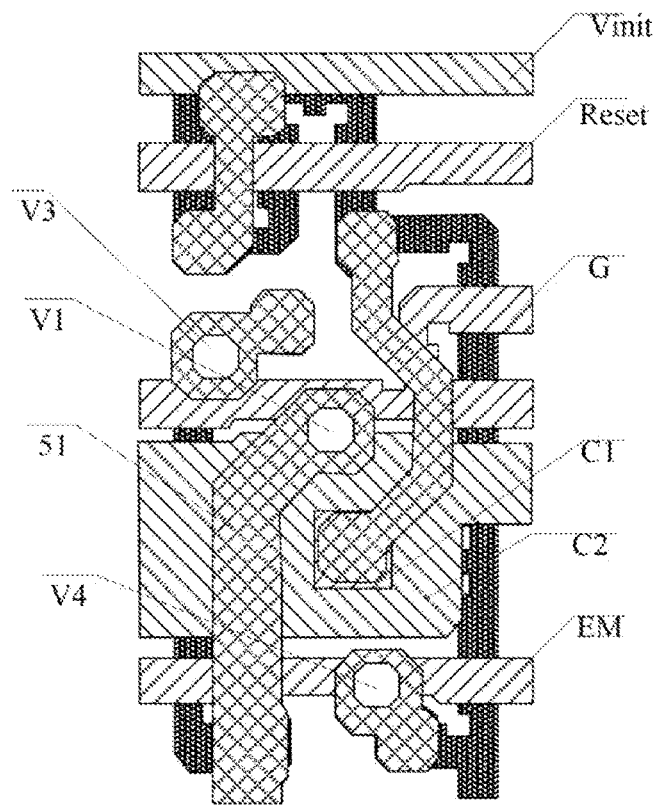
FIG. 6A is a top view of a sub-pixel corresponding to Implementation I.
Figure 6B:
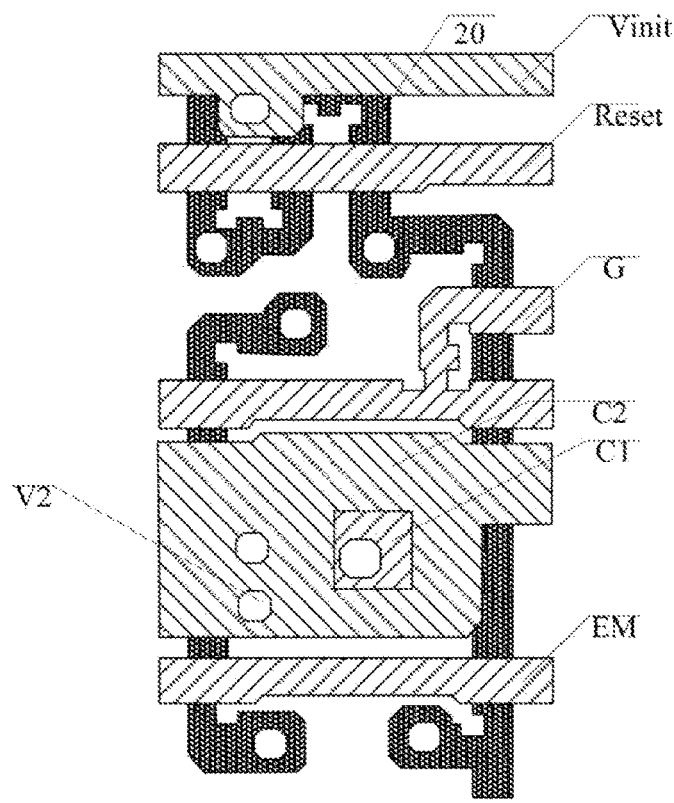
FIG. 6B is another top view of a sub-pixel corresponding to Implementation I.

As one implementation, FIG. 6A is a top view of sub-pixels corresponding to Implementation I, and FIG. 6B is another top view of sub-pixels corresponding to Implementation I. As shown in FIG. 6A, the fourth insulating layer is provided with a first via V1 exposing first poles 51 of partial fifth transistors, and the power line is connected with the first pole 51 of the fifth transistor through the first via V1. As shown in FIG. 6B, the third insulating layer is provided with a second via V2 exposing second electrodes C2 of partial storage capacitors, and the first pole 51 of the fifth transistor is connected with the second electrode C2 of the storage capacitor through the second via V2. It should be noted that in FIG. 3 and FIG. 5, Implementation I is taken as an example.

An orthographic projection of the power lines connected with the sub-pixels on the base substrate includes an orthographic projection of the first via V1 on the base substrate 10, and an orthographic projection of the second electrode of the storage capacitor includes an orthographic projection of the second via on the base substrate. Herein, "an orthographic projection of A including an orthographic projection of B" or "an orthographic projection of B is located within the range of an orthographic projection of A" means that the boundary of the orthographic projection of B falls within the range of the boundary of the orthographic projection of A, or the boundary of the orthographic projection of A overlaps with the boundary of the orthographic projection of B.

In some possible implementations, the number of first vias V1 may be one.

In some possible implementations, the number of second vias V2 may be at least one. Because the width of the first pole of the fifth transistor is relatively small, when there are multiple second vias V2, the multiple second vias are arranged in the extension direction of the data line. The more the vias are, the better the conductivity of the components connected through the vias is. In FIG. 6A, there is one first via V1, and FIG. 6B illustrates an example where there are two second vias V2, which is not limited in the present application.

In an exemplary embodiment, as shown in FIG. 6A, the fourth insulating layer further includes a third via V3 exposing the first pole of the fourth transistor T4. The data line is connected with the first pole of the fourth transistor T4 through the third via V3. The fourth insulating layer further includes a fourth via V4 exposing the second pole of the sixth transistor T6.

In an exemplary embodiment, as shown in FIG. 6B, the first insulating layer, the second insulating layer and the third insulating layer further include vias exposing partial active regions, so that the source and drain electrodes of the transistors are connected with the active regions through these vias. The source and drain electrodes of the transistors include first poles of the transistors and second poles of the transistors.

In an exemplary embodiment, the first pole of the fifth transistor is also connected with an active region through vias on the first insulating layer, the second insulating layer and the third insulating layer.

Figure 7A:
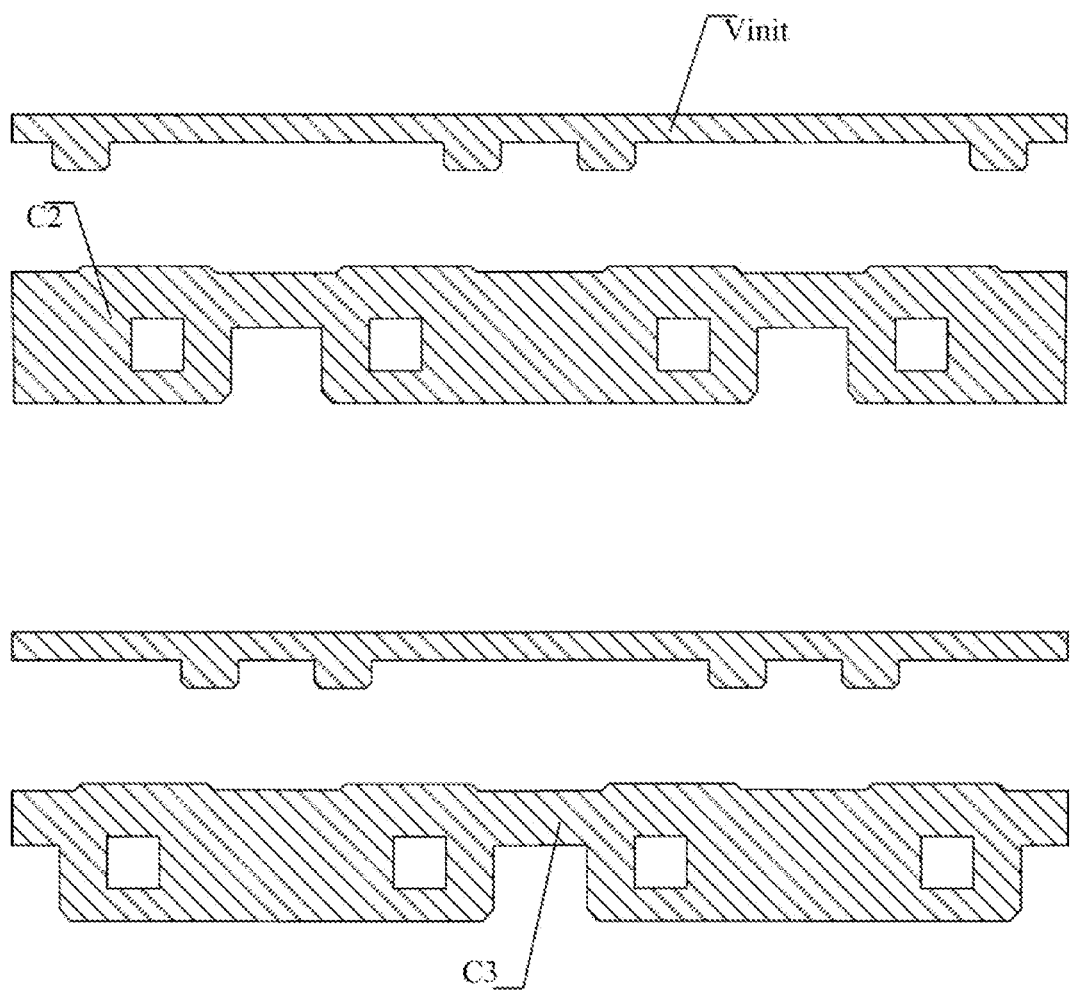
FIG. 7A is a top view of a second metal layer corresponding to Implementation I.
Figure 7B:
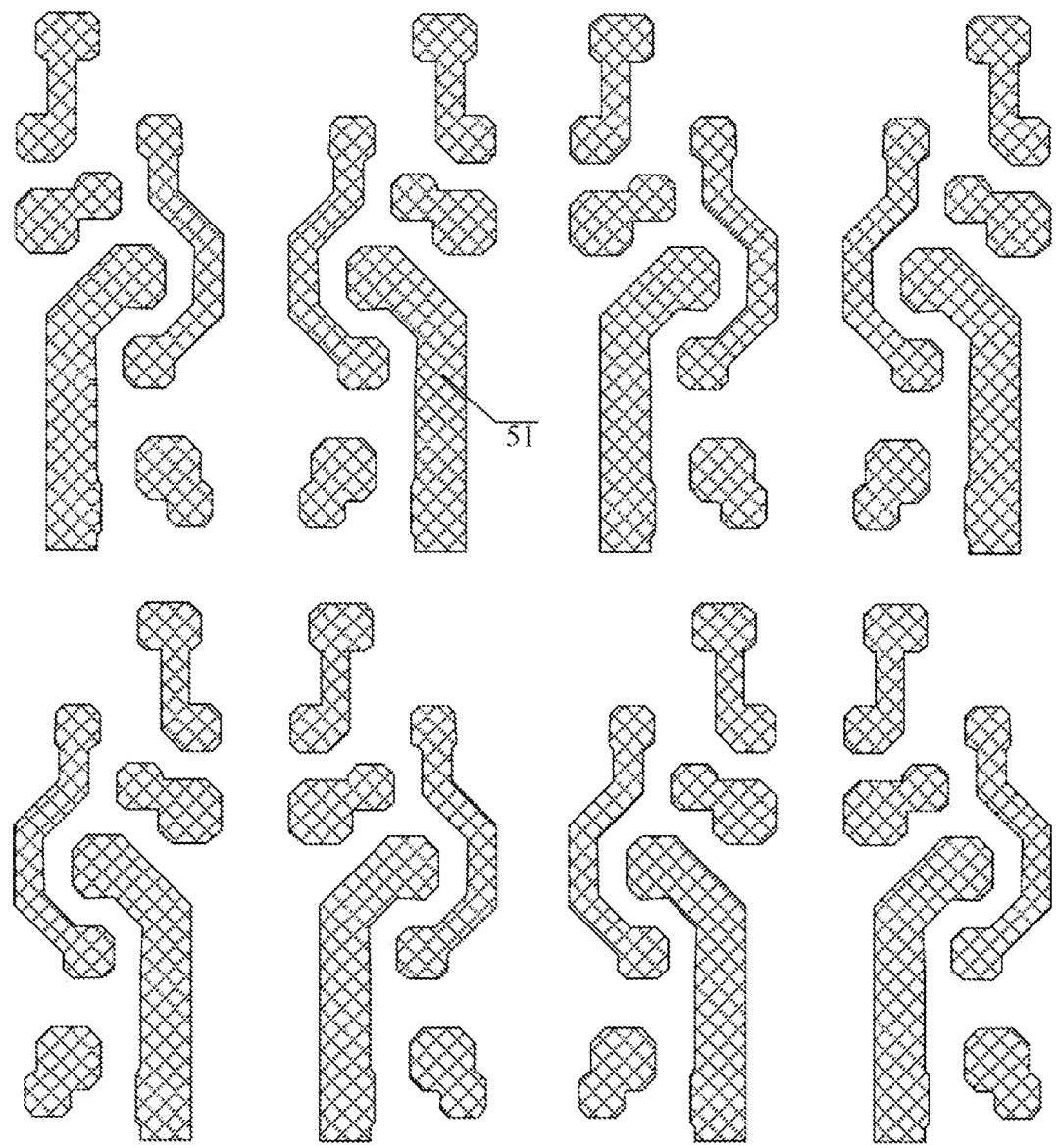
FIG. 7B is a top view of a third metal layer corresponding to Implementation I.

In an exemplary embodiment, each pixel may include four sub-pixels. FIG. 7A is a top view of a second metal layer corresponding to Implementation I, and FIG. 7B is a top view of a third metal layer corresponding to Implementation I. In order to explain the structure of the display substrate more clearly, FIGS. 7A and 7B illustrate an example of two pixels arranged in the column direction.

As shown in FIG. 7A, the second electrodes of the storage capacitors in adjacent sub-pixels in the same row are directly connected. As shown in FIG. 7B, the first poles 51 of the fifth transistors in adjacent sub-pixels in the same row are arranged at intervals.

In Implementation I, by interconnecting the second electrodes of the storage capacitors, which are arranged on the second metal layer, in a plurality of sub-pixels, the power signals provided by the power lines of adjacent sub-pixels are the same, thereby avoiding poor display of the display substrate and ensuring the display effect of the display substrate.

In an exemplary embodiment, through reasonable design of layout, interconnection of conductive layers of multiple sub-pixels can be realized only by the semiconductor layer, or interconnection of conductive layers of multiple sub-pixels can be realized only by the first metal layer, or interconnection of conductive layers of multiple sub-pixels can be realized only by the second metal layer, or interconnection of conductive layers of multiple sub-pixels can be realized only by the third metal layer, thus realizing that the power lines of sub-pixels located in the same row are interconnected in the extension direction of the gate lines through functional layers, which will not be described in detail here.

As shown in FIG. 7A, at least one sub-pixel further includes a first connection part C3, which is arranged on a side of the second electrode C2 in the first direction.

In an exemplary embodiment, in two adjacent rows of pixels, in one row of pixels, the second electrode C2 of the i-th sub-pixel and the second electrode C2 of the i+1-th sub-pixel are connected through the first connection part C3, the second electrode C2 of the i+1-th sub-pixel is directly connected with the second electrode C2 of the i+2-th sub-pixel, and the second electrode C2 of the i+2-th sub-pixel and the second electrode C2 of the i+3-th sub-pixel are connected through the first connection part C3. In the other row of pixels, the second electrode C2 of the i-th sub-pixel and the second electrode C2 of the i+1-th sub-pixel are directly connected, the second electrode C2 of the i+1-th sub-pixel and the second electrode C2 of the i+2-th sub-pixel are connected through the first connection part C3, and the second electrode C2 of the i+2-th sub-pixel and the second electrode C2 of the i+3-th sub-pixel are directly connected.

Figure 8A:
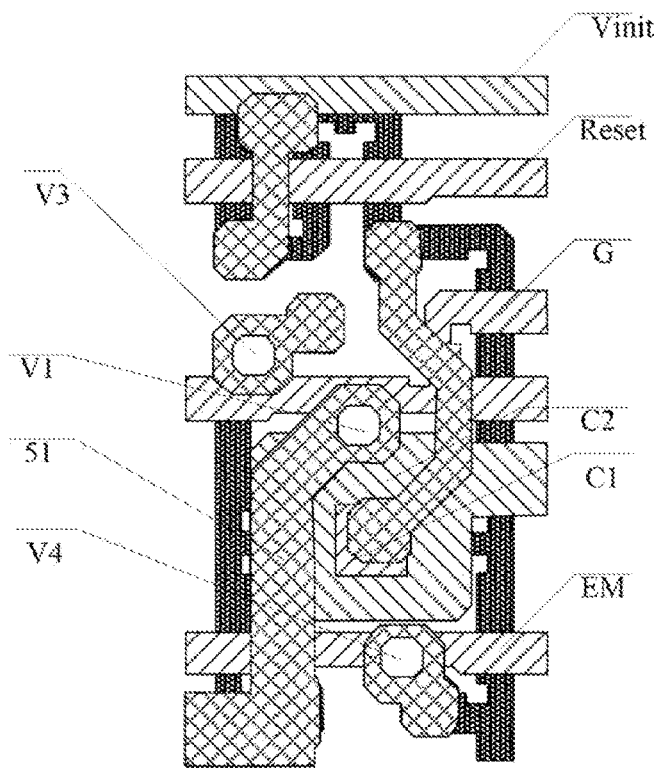
FIG. 8A is a top view of a sub-pixel corresponding to Implementation II.
Figure 8B:
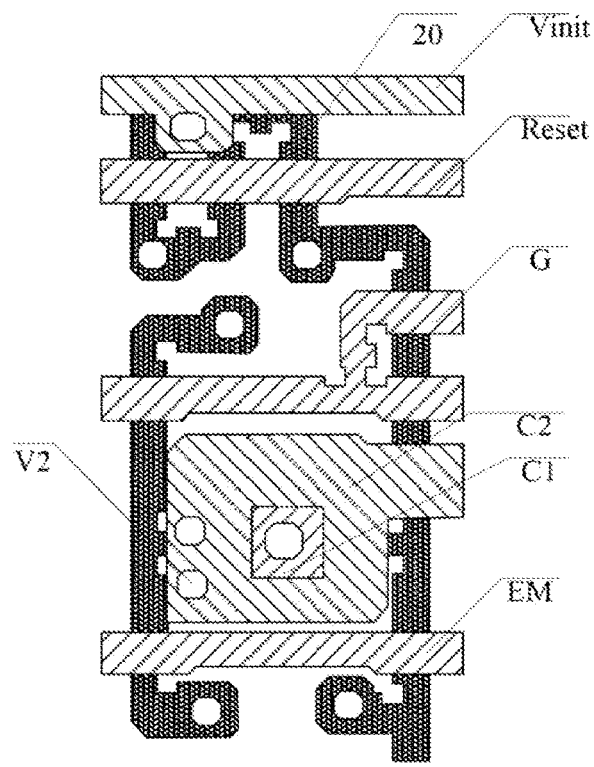
FIG. 8B is another top view of a sub-pixel corresponding to Implementation II.

As another implementation, FIG. 8A is a top view of a sub-pixel corresponding to Implementation II, and FIG. 8B is another top view of a sub-pixel corresponding to Implementation II. As shown in FIG. 8A, the fourth insulating layer is provided with a first via V1 exposing first poles 51 of partial fifth transistors T5, and the power line is connected with the first pole 51 of the fifth transistor T5 through the first via V1. As shown in FIG. 8B, the third insulating layer is provided with a second via V2 exposing second electrodes C2 of partial storage capacitors, and the first pole 51 of the fifth transistor T5 is connected with the second electrode C2 of the storage capacitor through the second via V2.

As shown in FIG. 8A and FIG. 8B, compared with Implementation I, in Implementation II, the area occupied by the second electrode of the storage capacitor of each sub-pixel provided is different, and the shape of the first pole 51 of the fifth transistor T5 of each sub-pixel is also different.

In an exemplary embodiment, as shown in FIG. 8A, the fourth insulating layer further includes a third via V3 exposing the first pole of the fourth transistor T4. The data line is connected with the first pole of the fourth transistor T4 through the third via V3. The fourth insulating layer further includes a fourth via V4 exposing the second pole of the sixth transistor T6.

As shown in FIGS. 3 and 8B, the first insulating layer, the second insulating layer and the third insulating layer may further include vias exposing partial active regions, so that the source and drain electrodes of the transistors are connected with the active regions through these vias. The first pole of the fifth transistor may also be connected with an active region through vias on the first insulating layer, the second insulating layer and the third insulating layer.

An orthographic projection of the power lines in the sub-pixels on the base substrate includes an orthographic projection of the first via V1 on the base substrate 10, and an orthographic projection of the second electrode of the storage capacitor on the base substrate includes an orthographic projection of the second via on the base substrate.

In some possible implementations, the number of first vias V1 may be one.

In some possible implementations, the number of second vias V2 is at least one. Because the width of the first pole of the fifth transistor is relatively small, the arrangement of multiple second vias in the extension direction of the data line can ensure the number of vias arranged. The more the vias are, the better the conductivity of the components connected through the vias is. In FIG. 8A, there is one first via V1, and FIG. 8B illustrates an example where there are two second vias V2, which is not limited in the present application.

Figure 9A:
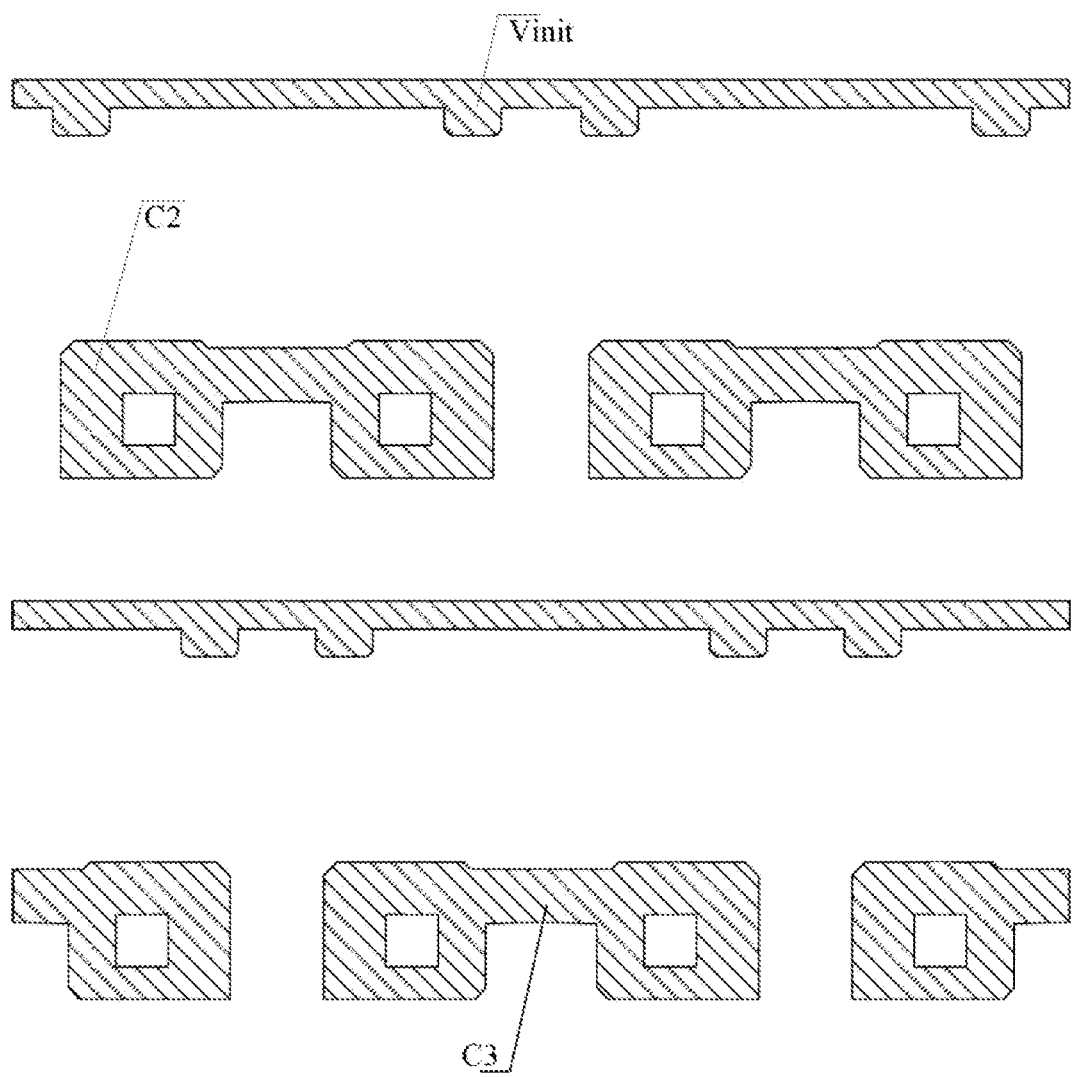
FIG. 9A is a top view of a second metal layer corresponding to Implementation II.
Figure 9B:
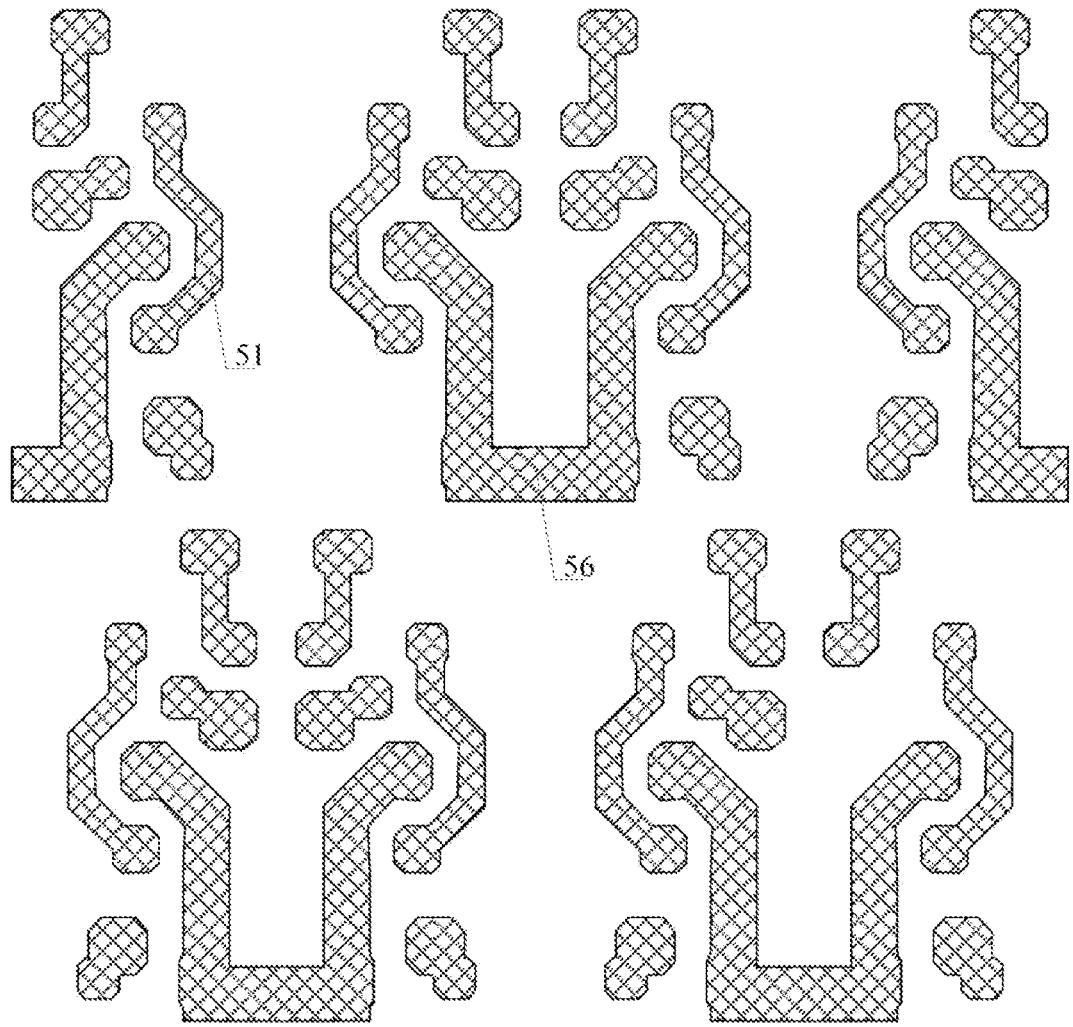
FIG. 9B is a top view of a third metal layer corresponding to Implementation II.
Figure 10:
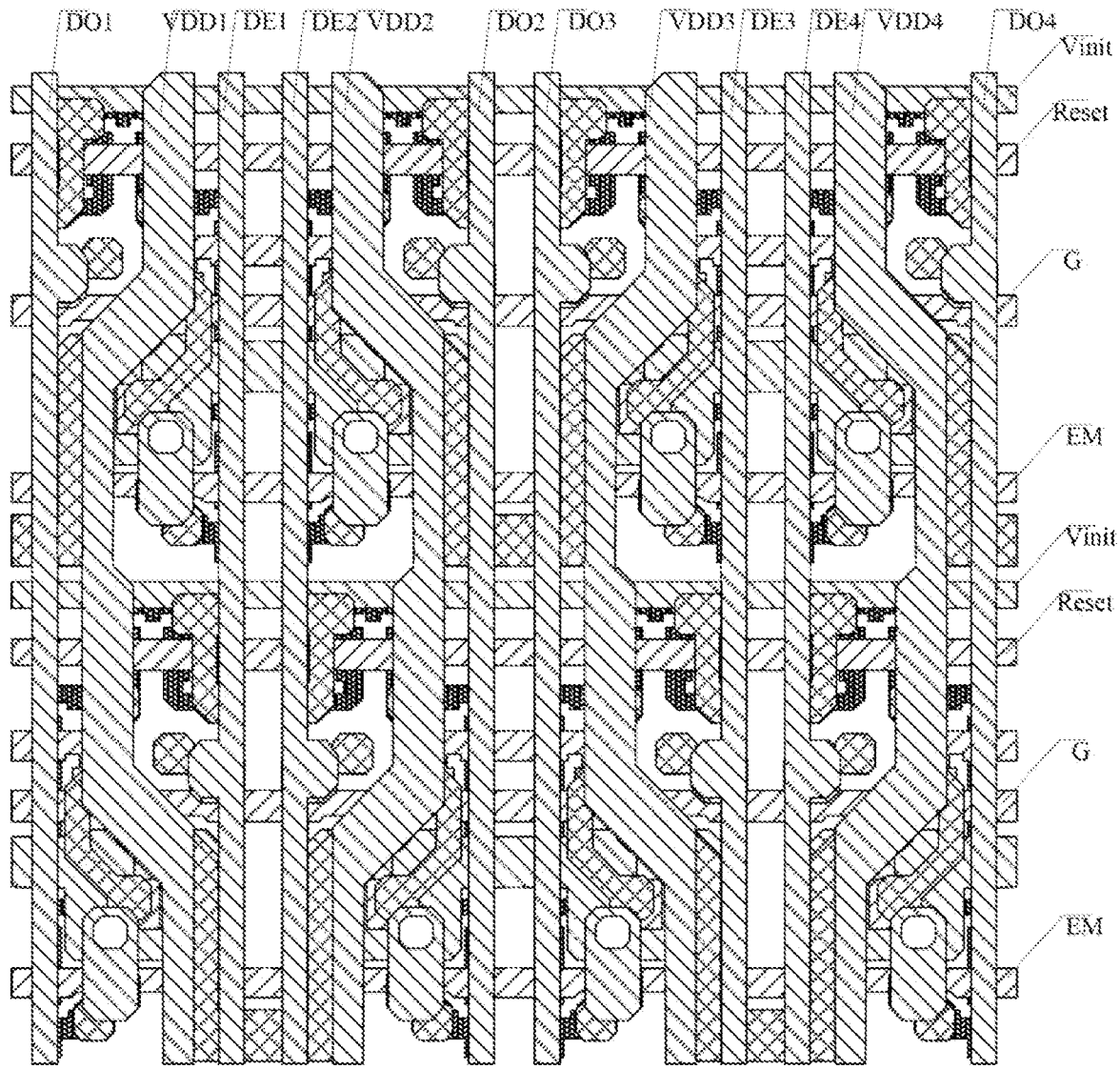
FIG. 10 is another top view of a plurality of sub-pixels in a display substrate according to the present application.

FIG. 9A is a top view of a second metal layer corresponding to Implementation II, FIG. 9B is a top view of a third metal layer corresponding to Implementation II, and FIG. 10 is another top view of a plurality of sub-pixels in a display substrate according to the present application. In order to explain the structure of the display substrate more clearly, FIGS. 9A and 9B illustrate an example of two pixels arranged in the column direction, FIG. 10 includes other film layers than the anode of the light-emitting device, and a plurality of sub-pixels included in FIG. 10 are sub-pixels corresponding to Implementation II.

As shown in FIG. 9A and FIG. 9B, in each pixel in one of two adjacent rows of pixels, the second electrode of the storage capacitor of the i-th sub-pixel and the second electrode of the storage capacitor of the i+1-th sub-pixel are connected through the first connection part C3, the second electrode of the storage capacitor of the i+1-th sub-pixel and the second electrode of the storage capacitor of the i+2-th sub-pixel are arranged at intervals, and the second electrode of the storage capacitor of the i+2-th sub-pixel and the second electrode of the storage capacitor of the i+3-th sub-pixel are connected through the first connection part C3. In each pixel in the other of the two adjacent rows of pixels, the second electrode of the storage capacitor of the i-th sub-pixel and the second electrode of the storage capacitor of the i+1-th sub-pixel are arranged at intervals, the second electrode of the storage capacitor of the i+1-th sub-pixel and the second electrode of the storage capacitor of the i+2-th sub-pixel are connected through the first connection part C3, and the second electrode of the storage capacitor of the i+2-th sub-pixel and the second electrode of the storage capacitor of the i+3-th sub-pixel are arranged at intervals.

As shown in FIG. 8A, the second electrode C2 of the storage capacitor in at least one sub-pixel may be rectangular, the first connection part C3 may be strip-shaped, and the first connection part C3 is arranged on a side of the second electrode C2 in the first direction.

In an exemplary embodiment, in two adjacent rows of pixels, in one row of pixels, the second electrode C2 of the i-th sub-pixel and the second electrode C2 of the i+1-th sub-pixel are connected with each other through the first connection part C3, the second electrode C2 of the i+1-th sub-pixel and the second electrode C2 of the i+2-th sub-pixel are arranged at intervals, and the second electrode C2 of the i+2-th sub-pixel and the second electrode C2 of the i+3-th sub-pixel are connected with each other through the first connection part C3. In the other row of pixels, the second electrode C2 of the i-th sub-pixel and the second electrode C2 of the i+1-th sub-pixel are arranged at intervals, the second electrode C2 of the i+1-th sub-pixel and the second electrode C2 of the i+2-th sub-pixel are connected with each other through the first connection part C3, and the second electrode C2 of the i+2-th sub-pixel and the second electrode C2 of the i+3-th sub-pixel are arranged at intervals.

It should be noted that FIG. 9A illustrates an example where the second electrode of the storage capacitor of the i-th sub-pixel and the second electrode of the storage capacitor of the i+1-th sub-pixel in the first row of pixels are directly connected through the first connection part C3, and the second electrode of the storage capacitor of the i+2-th sub-pixel and the second electrode of the storage capacitor of the i+3-th sub-pixel in the second row of pixels are directly connected through the first connection part C3.

In some possible implementations, as shown in FIG. 10, for each sub-pixel, there is an overlapping area between the orthographic projection of the first pole of the fifth transistor on the base substrate and the orthographic projection of the data line connected thereto on the base substrate.

In an exemplary embodiment, with reference to FIGS. 9A, 9B and 10, for the j-th pixel, a second connection part 56 may be included. Under the condition that the second electrode C2 of the storage capacitor of the i-th sub-pixel is connected with the second electrode C2 of the storage capacitor of the i+1-th sub-pixel, the first pole 51 of the fifth transistor T5 in the i+1-th sub-pixel is connected with the first pole 51 of the fifth transistor T5 in the i+2-th sub-pixel through the second connection part 56. The second electrode C2 of the storage capacitor in the i-th sub-pixel that is located in the second metal layer is connected with the second electrode C2 of the storage capacitor in the i+3-th sub-pixel that is located in the second metal layer through the first pole 51 of the fifth transistor T5 in the i+1-th sub-pixel that is located in the third metal layer, the second connection part 56, and the first pole 51 of the fifth transistor T5 in the i+2-th sub-pixel.

In an exemplary embodiment, for the j-th pixel, under the condition that the second electrode C2 of the storage capacitor of the i+1-th sub-pixel is connected with the second electrode C2 of the storage capacitor of the i+2-th sub-pixel, the first pole 51 of the fifth transistor T5 in the i-th sub-pixel is connected with the first pole 51 of the fifth transistor T5 in the i+1-th sub-pixel through the second connection part 56, and the first pole 51 of the fifth transistor T5 in the i+2-th sub-pixel is connected with the first pole 51 of the fifth transistor T5 in the i+3-th sub-pixel through the second connection part 56. The second electrode C2 of the storage capacitor of the i-th sub-pixel that is located in the second metal layer is connected with the second electrode C2 of the storage capacitor of the i+1-th sub-pixel that is located in the second metal layer through the first pole 51 of the fifth transistor T5 in the i-th sub-pixel that is located in the third metal layer, the second connection part 56, and the first pole 51 of the fifth transistor T5 in the i+1-th sub-pixel. The second electrode C2 of the storage capacitor of the i+2-th sub-pixel that is located in the second metal layer is connected with the second electrode C2 of the storage capacitor of the i+3-th sub-pixel that is located in the second metal layer through the first pole 51 of the fifth transistor T5 in the i+2-th sub-pixel that is located in the third metal layer, the second connection part 56, and the first pole 51 of the fifth transistor T5 in the i+3-th sub-pixel.

In Implementation II, the second metal layer and the third metal layer jointly complete transverse (first direction) bridging in the present application to realize the function of power supply connection lines, so that the power signals provided to each sub-pixel are the same, thereby ensuring the display effect of the display substrate.

It should be noted that since the resistivity of the third metal layer is smaller than that of the second metal layer, the display substrate provided in Implementation II can further reduce dynamic crosstalk, as compared with the display substrate provided in Implementation I.

In some possible implementations, as shown in FIG. 2, the display substrate provided by the present application may further include: a fifth insulating layer 15 and a flat layer 16 arranged between the fourth metal layer 60 and the fifth metal layer 70, and an organic light-emitting layer and a cathode (not shown in the figure) of the light-emitting device arranged on a side of the fifth metal layer 70 away from the base substrate 10. The fifth insulating layer 15 is arranged on a side of the flat layer 16 close to the base substrate 10. The cathode is arranged on a side of the organic light-emitting layer away from the base substrate 10.

As shown in FIG. 3, the fourth metal layer provided by the present application may further include a connection electrode 61. The connection electrode 61 is respectively connected with the fifth metal layer and the second pole of the sixth transistor. The fifth insulating layer and the flat layer are provided with a fifth via V5 exposing the connection electrode, and the fifth metal layer is connected with the connection electrode 61 through the fifth via V5 exposing the connection electrode 61. The fourth insulating layer is provided with a fourth via V4 exposing the second pole of the sixth transistor, and the connection electrode 61 is connected with the second pole of the sixth transistor through the fourth via V4 exposing the second pole of the sixth transistor.

In an exemplary embodiment of the present application, by arranging the data lines and power lines in different layers from the first poles and the second poles of a plurality of transistors, the area occupied by the sub-pixels and the data lines connected with the sub-pixels can be reduced, thereby improving the resolution of the OLED display substrate driven by high frequency.

Based on the same inventive concept, the present application further provides a method for manufacturing a display substrate, to manufacture the display substrates provided in the above embodiments. In an exemplary embodiment, in a plane parallel to the display substrate, the display substrate includes gate lines, data lines, power lines and a plurality of sub-pixels arranged on a base substrate, at least one sub-pixel includes a light-emitting device and a driving circuit configured to drive the light-emitting device to emit light, and the driving circuit includes a plurality of transistors and a storage capacitor.

The manufacturing method may include: providing a base substrate; and forming a plurality of functional layers on the base substrate, the plurality of functional layers including a semiconductor layer, a first conductive layer, a second conductive layer, a third conductive layer and a fourth conductive layer which are sequentially arranged, a first insulating layer, a second insulating layer, a third insulating layer and a fourth insulating layer being respectively arranged between the plurality of functional layers, and in an extension direction of the gate lines, the power lines being connected with each other through at least one functional layer.

Figure 11:
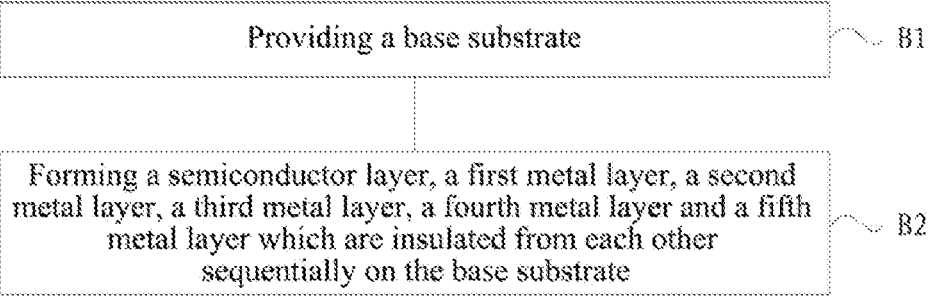
FIG. 11 is a flowchart of a method for manufacturing a display substrate according to the present application.

FIG. 11 is a flowchart of a method for manufacturing a display substrate according to the present application. As shown in FIG. 11, the method for manufacturing a display substrate provided by the present application may include step B1 and step B2.

In step B1, a base substrate is provided.

In step B2, a semiconductor layer, a first metal layer, a second metal layer, a third metal layer, a fourth metal layer and a fifth metal layer which are insulated from each other are sequentially formed on the base substrate.

In an exemplary embodiment, the semiconductor layer may include active regions of a plurality of transistors. The first metal layer may include a gate line, a light emission control line, a reset signal line, a first electrode of a storage capacitor, and gate electrodes of the plurality of transistors. The second metal layer may include an initial signal line and a second electrode of the storage capacitor. The third metal layer may include: source and drain electrodes of the plurality of transistors. The fourth metal layer may include: a data line and a power line. The fifth metal layer may include: an anode of a light-emitting device. Driving circuits of the i-th column of sub-pixels are connected with the i-th column of data line. Each column of data line includes: a first sub-data line and a second sub-data line. The first sub-data line and the second sub-data line in the i-th column of data line are located on two sides of the i-th column of sub-pixels, respectively. All sub-data lines between adjacent two columns of sub-pixels are merely the first sub-data lines or the second sub-data lines.

In the above, $1 \le i \le N$, N being the number of total columns of sub-pixels.

The display substrates manufactured by the method for manufacturing a display substrate according to the present application have similar implementation principles and implementation effects, which will not be described further here.

In some possible implementations, step B2 may include: sequentially forming a semiconductor layer and a first insulating layer on a base substrate; sequentially forming a first metal layer and a second insulating layer on the first insulating layer; sequentially forming a second metal layer and a third insulating layer on the second insulating layer; sequentially forming a third metal layer and a fourth insulating layer on the third insulating layer; sequentially forming a fourth metal layer, a fifth insulating layer and a flat layer on the fourth insulating layer; and sequentially forming a fifth metal layer, an organic light-emitting layer of a light-emitting device and a cathode of the light-emitting device on the flat layer.

Figure 12:
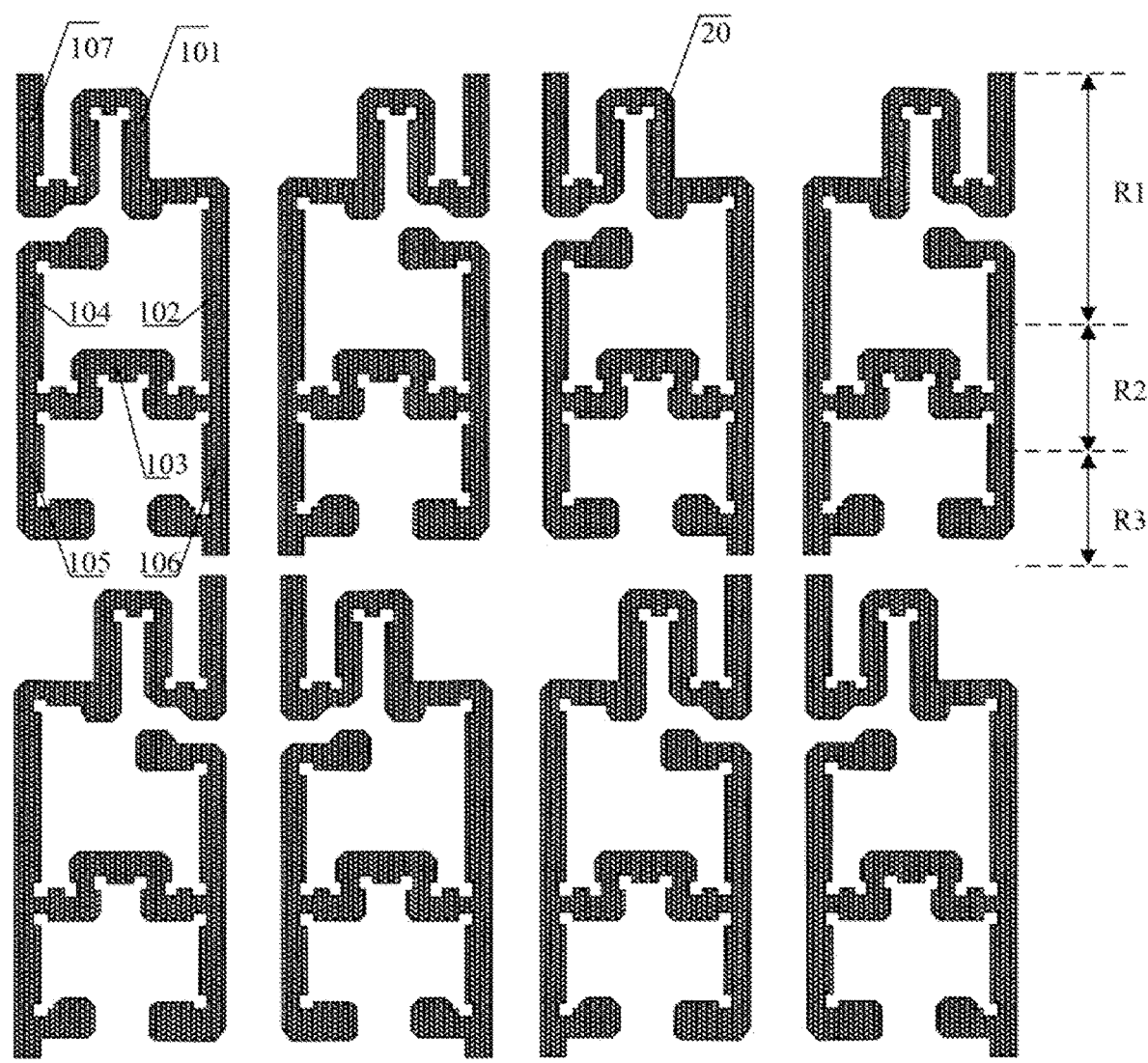
FIG. 12 is a first manufacturing schematic diagram of a display substrate according to the present application.
Figure 13:
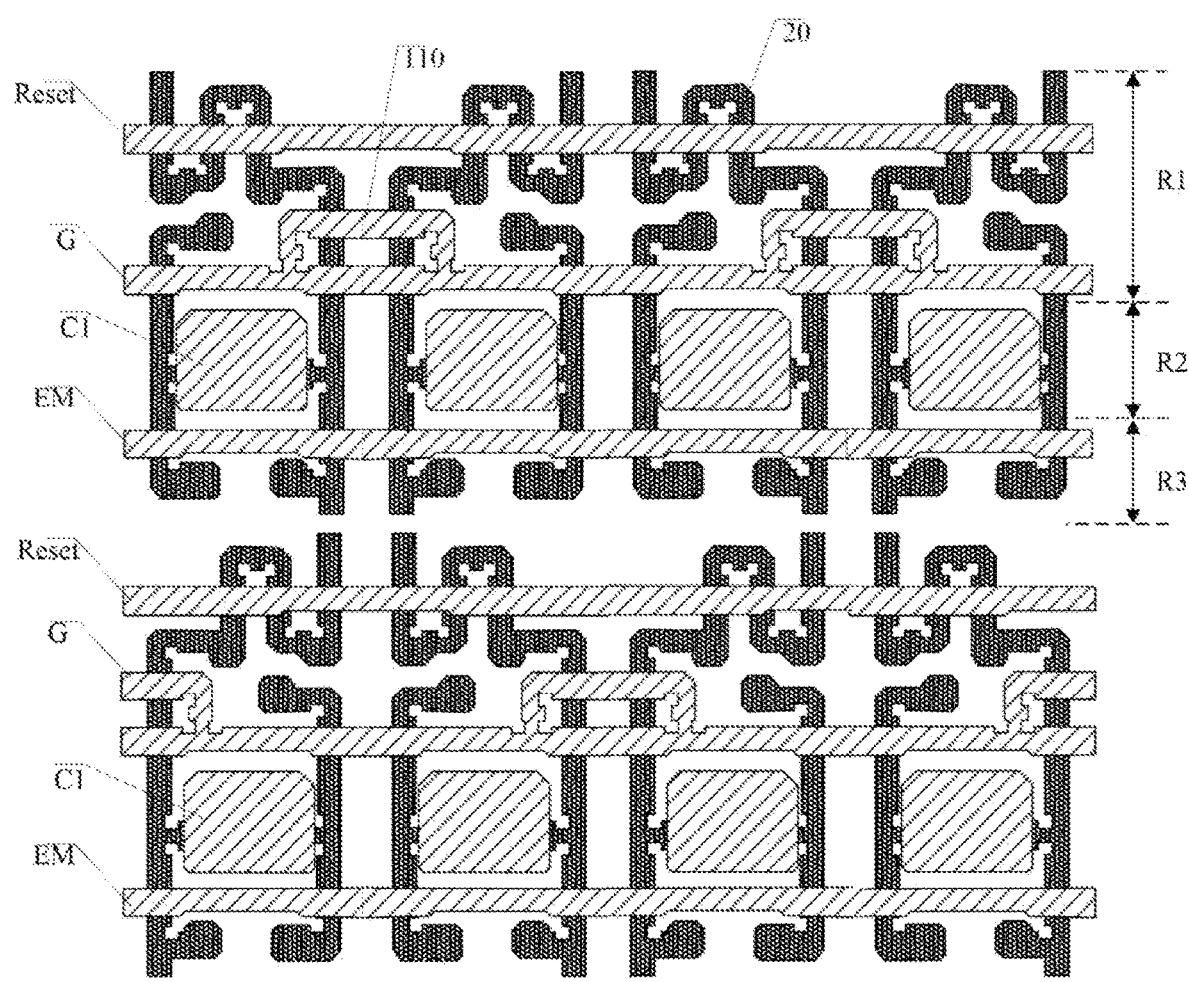
FIG. 13 is a second manufacturing schematic diagram of a display substrate according to the present application.
Figure 14A:
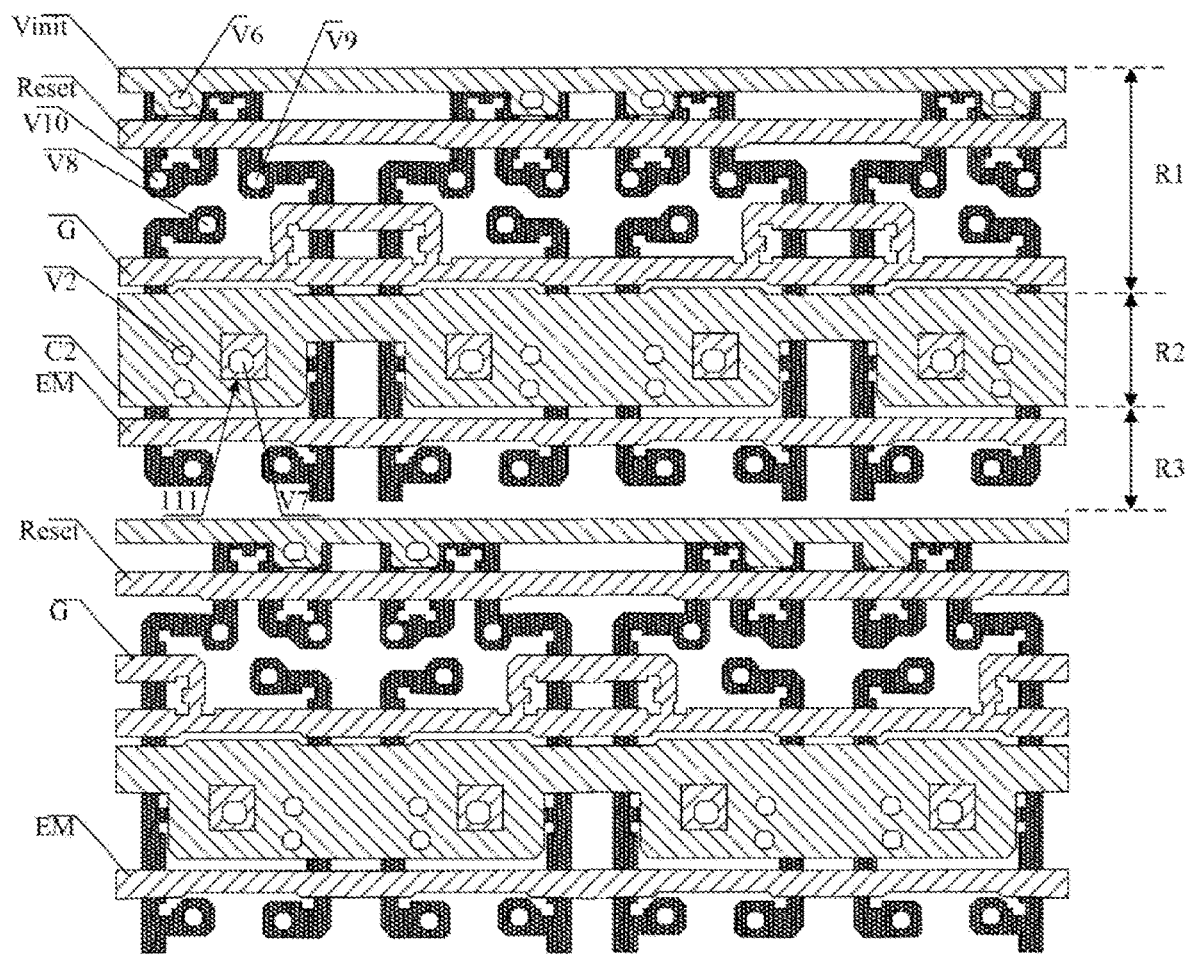
FIG. 14A is a third manufacturing schematic diagram of a display substrate according to the present application.
Figure 14B:
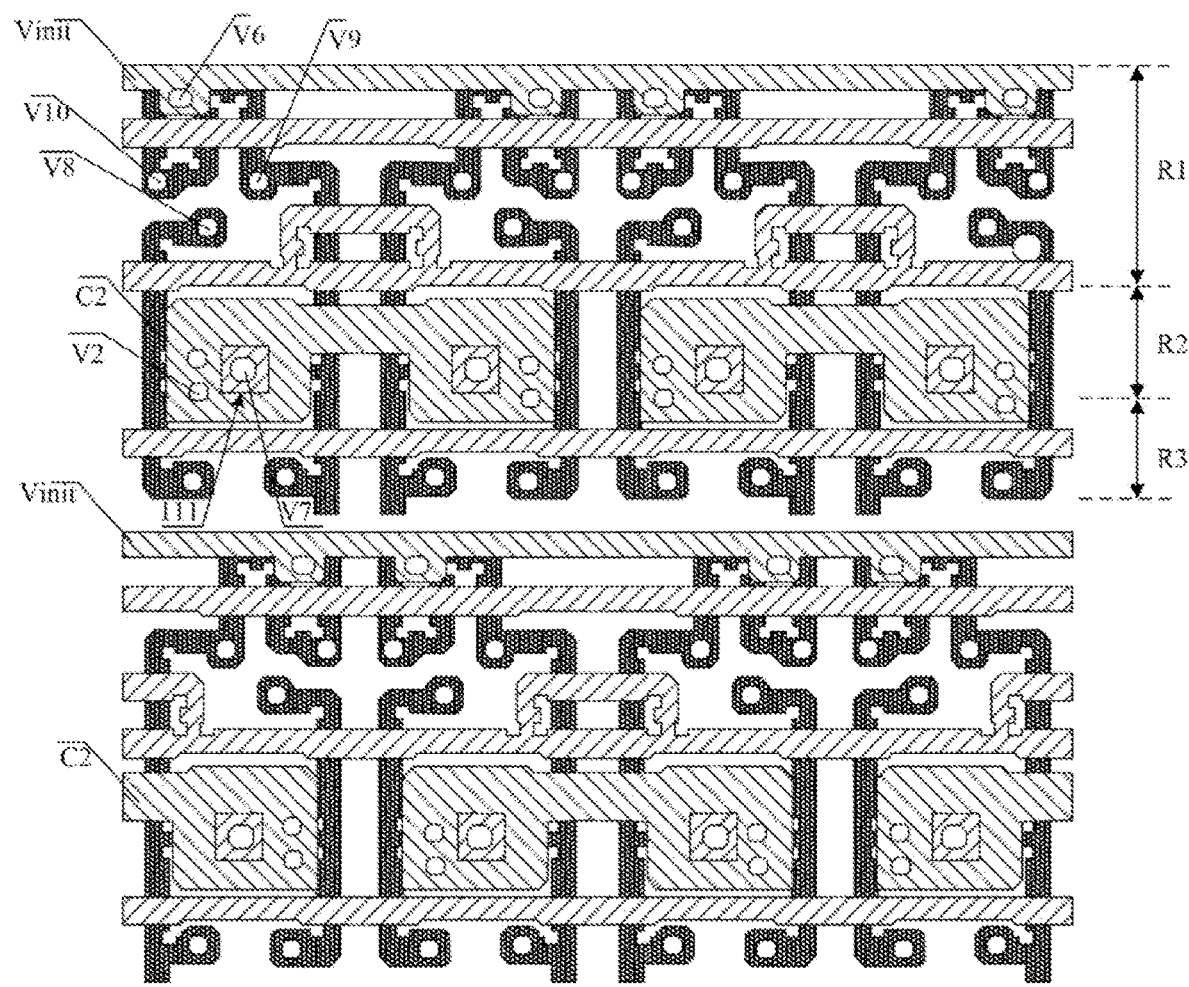
FIG. 14B is another third manufacturing schematic diagram of a display substrate according to the present application.
Figure 15A:
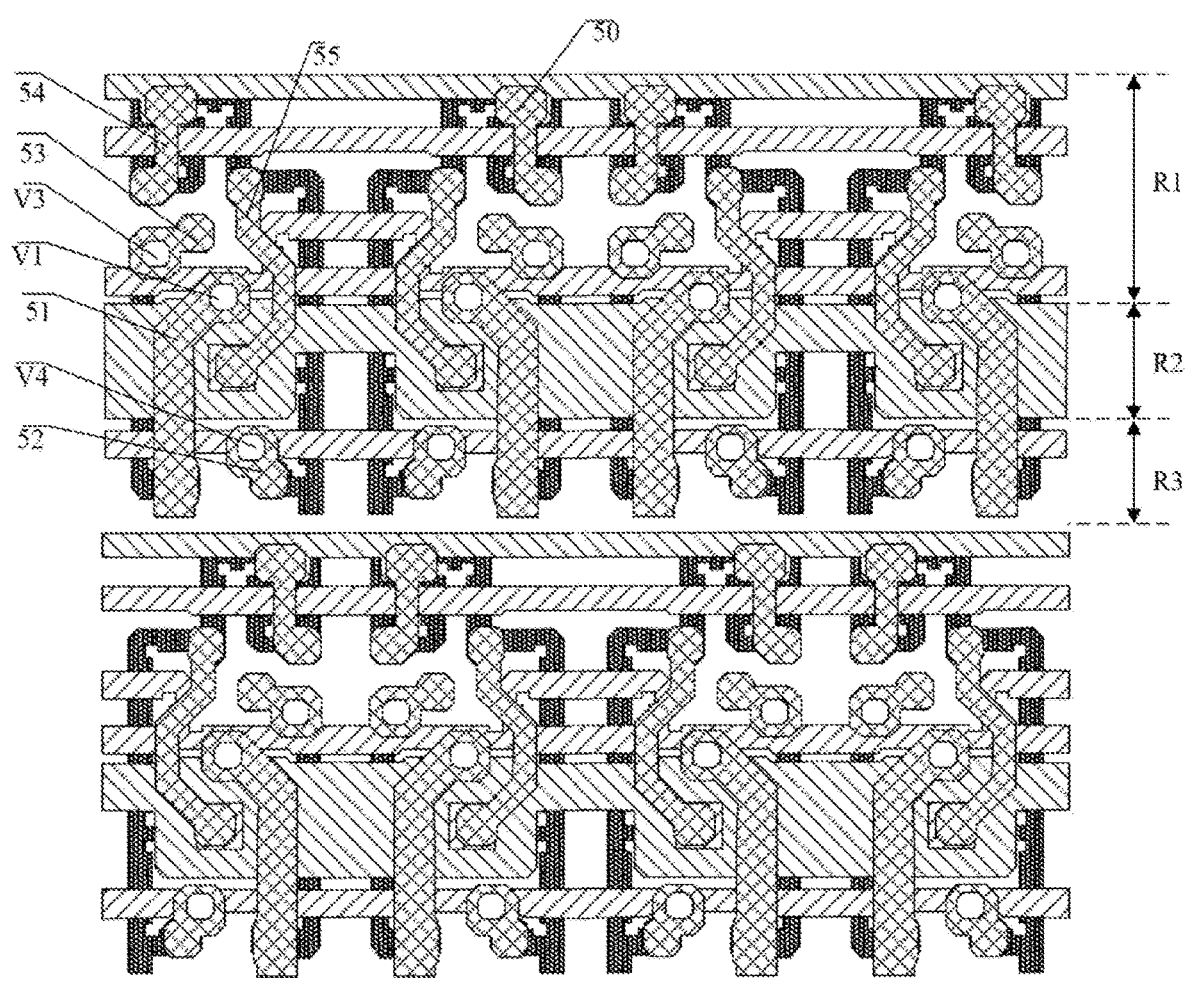
FIG. 15A is a fourth manufacturing schematic diagram of a display substrate according to the present application.
Figure 15B:
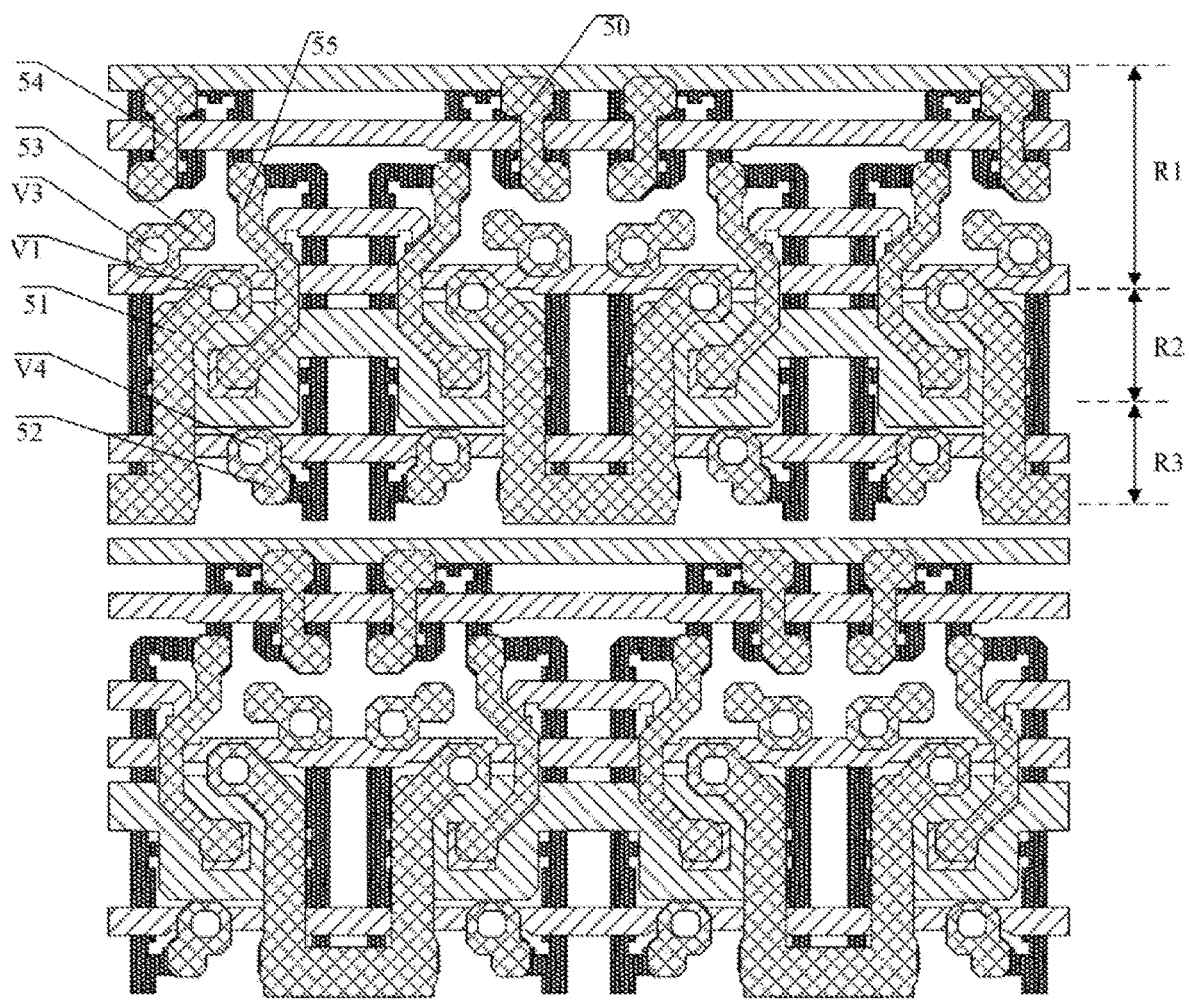
FIG. 15B is another fourth manufacturing schematic diagram of a display substrate according to the present application.
Figure 16A:
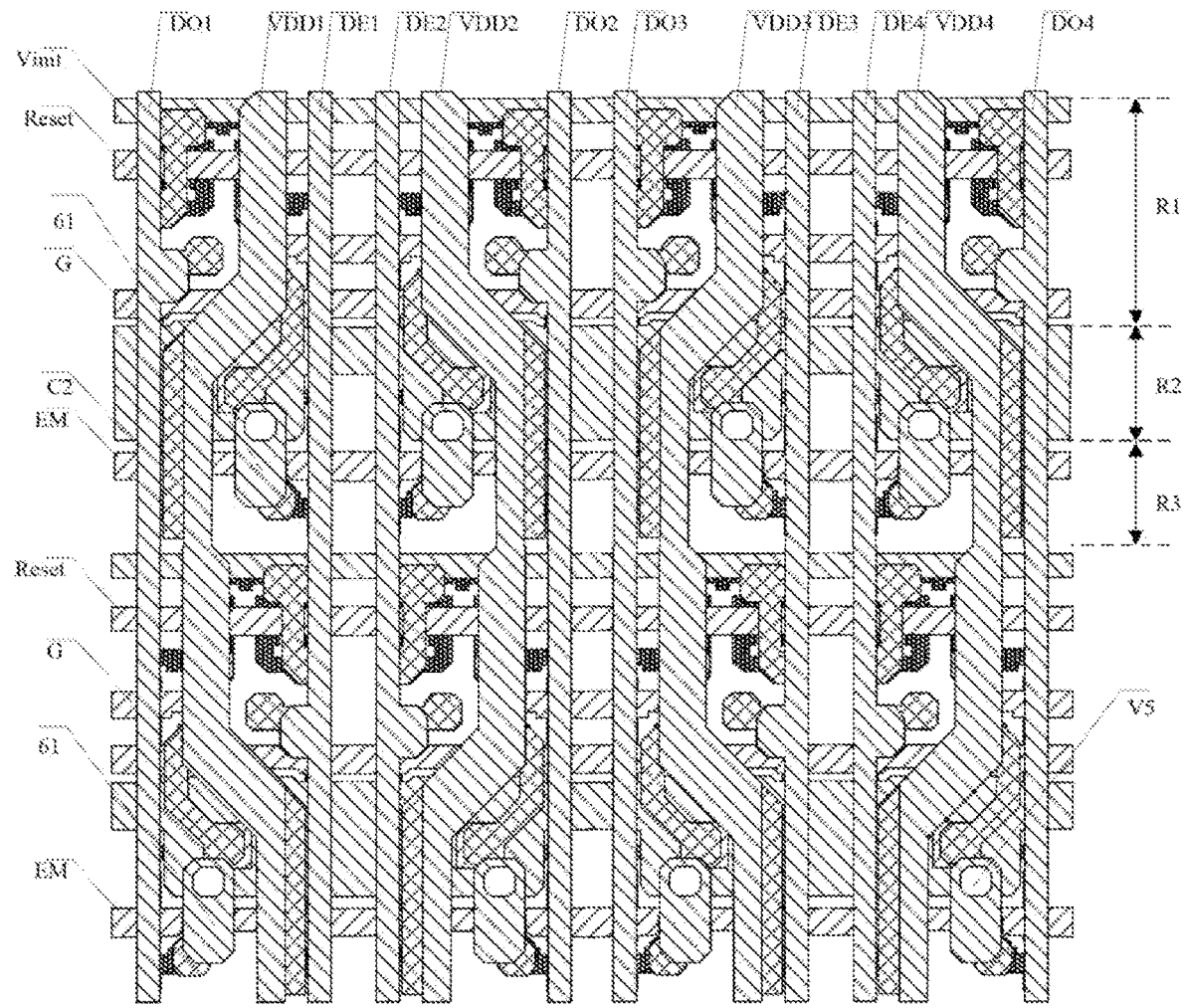
FIG. 16A is a fifth manufacturing schematic diagram of a display substrate according to the present application.
Figure 16B:
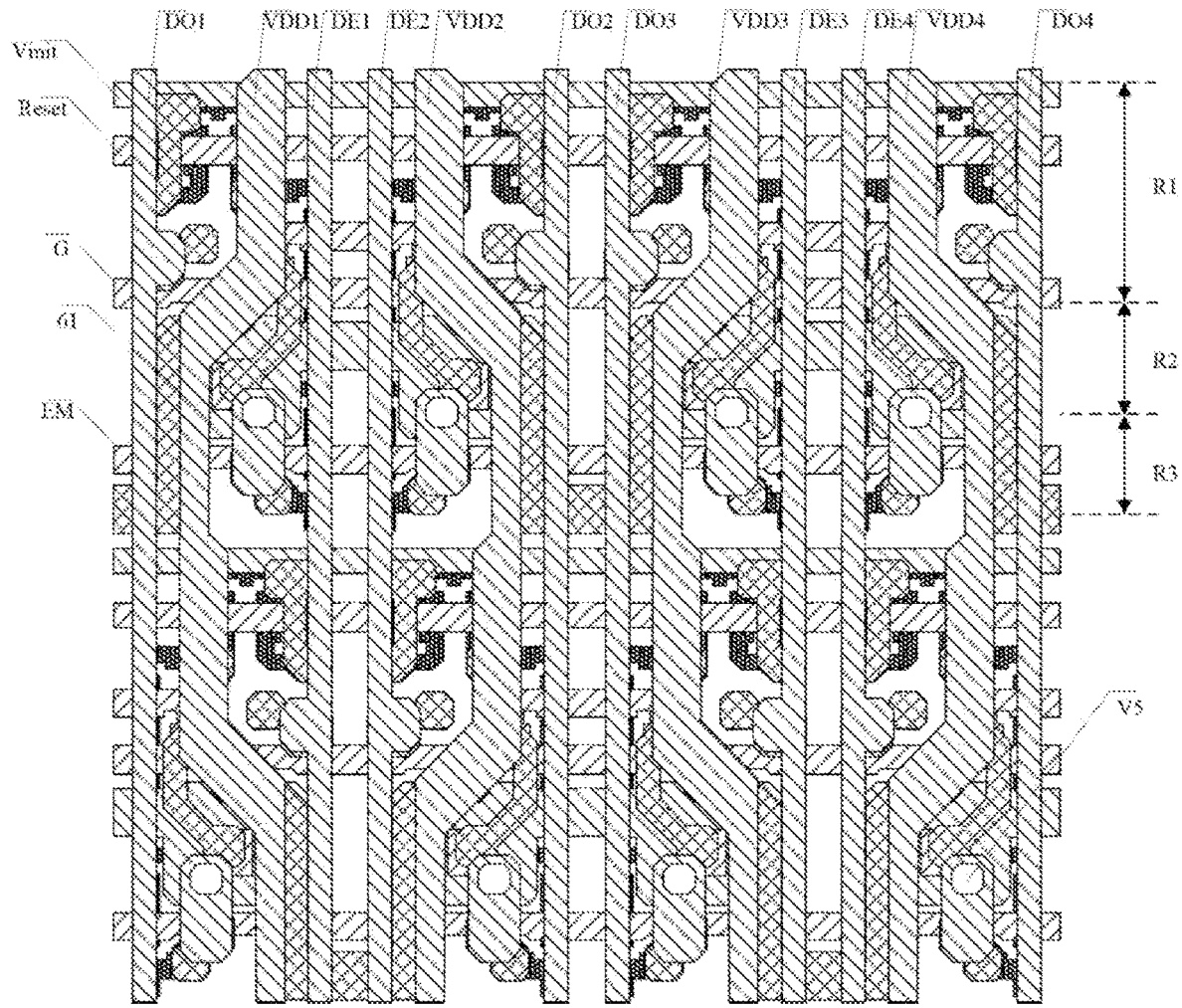
FIG. 16B is another fifth manufacturing schematic diagram of a display substrate according to the present application.

FIG. 12 is a first manufacturing schematic diagram of a display substrate according to the present application, FIG. 13 is a second manufacturing schematic diagram of a display substrate according to the present application, FIG. 14A is a third manufacturing schematic diagram of a display substrate according to the present application, FIG. 14B is another third manufacturing schematic diagram of a display substrate according to the present application, FIG. 15A is a fourth manufacturing schematic diagram of a display substrate according to the present application, FIG. 15B is another fourth manufacturing schematic diagram of a display substrate according to the present application, FIG. 16A is a fifth manufacturing schematic diagram of a display substrate according to the present application, and FIG. 16B is another fifth manufacturing schematic diagram of a display substrate according to the present application.

The "patterning process" mentioned in the present application includes processing, such as film layer deposition, photoresist coating, mask exposure, development, etching, and photoresist stripping. Deposition may be implemented by any one or more of sputtering, evaporation and chemical vapor deposition, coating may be implemented by any one or more of spraying coating, spin coating and ink-jet printing, and etching may be implemented by any one or more of dry etching and wet etching, and these are not limited in the present application. "Thin film" refers to a layer of thin film fabricated by a certain material on a base substrate by using deposition or another process. If the "thin film" does not need a patterning process during the whole manufacturing process, the "thin film" may also be called a "layer". If the "thin film" needs a patterning process throughout the whole manufacturing process, it is referred to as a "thin film" before the patterning process and as a "layer" after the patterning process. The "layer" after the patterning process contains at least one "pattern".

Referring to FIGS. 12 to 16B, the manufacturing process of a display substrate provided by the present application may include the following operations.

In step 100, a base substrate 10 is provided, a semiconductor thin film is deposited on the base substrate 10, and the semiconductor thin film is processed by a patterning process to form a semiconductor layer 20, as shown in FIG. 12.

In an exemplary embodiment, the semiconductor layer 20 of each sub-pixel may include a first active region 101 at a position where the first transistor T1 is located, a second active region 102 at a position where the second transistor T2 is located, a third active region 103 at a position where the third transistor T3 is located, a fourth active region 104 at a position where the fourth transistor T4 is located, a fifth active region 105 at a position where the fifth transistor T5 is located, a sixth active region 106 at a position where the sixth transistor T6 is located, and a seventh active region 107 at a position where the seventh transistor T7 is located. The first active region 101 to the seventh active region 107 are an integrated structure in which they are connected with each other.

In an exemplary embodiment, the first active region 101 and the seventh active region 107 are arranged on a side of the first region R1 away from the second region R2, the second active region 102 and the fourth active region 104 are arranged on a side of the first region R1 close to the second region R2, the third active region 103 is arranged in the second region R2, and the fifth active region 105 and the sixth active region 106 are arranged in the third region R3.

In an exemplary embodiment, the first active region 101 is connected with the second active region 102 and the seventh active region 107, the second active region 102 is connected with the third active region 103 and the sixth active region 106, and the fourth active region 104 is connected with the third active region 103 and the fifth active region 105.

In an exemplary embodiment, the first active region 101 is "n"-shaped, the seventh active region 107 is "L"-shaped, and the seventh active region 107 is located on a side of the first active region 101 away from a center line of sub-pixels. The center line of sub-pixels is a straight line equally dividing the sub-pixels in the first direction and extending in the second direction. The second active region 102 is "7"-shaped and located on one side of the center line of sub-pixels, and the fourth active region 104 is "l"-shaped and located on the other side of the center line of sub-pixels. The third active region 103 has a "几" shape, and the "几" shape may be mirror symmetric with respect to the center line of sub-pixels. The fifth active region 105 is "L"-shaped, and the shape of the sixth active region 106 and the shape of the fifth active region 105 are mirror symmetric with respect to the center line of sub-pixels. Herein, an active region of a transistor having a certain shape refers to the shape of the active region in the vicinity of the gate of the transistor, including, but not limited to, a channel area, source and drain areas of the active region of the transistor, and a partial extension region of the active region used for connection with source and drain areas of other transistors.

In an exemplary embodiment, the active region of each transistor includes a first area, a second area, and a channel area located between the first area and the second area. In an exemplary embodiment, the first area of the first active region 101 also serves as the first area of the seventh active region 107, and the second area of the first active region 101 also serves as the first area of the second active region 102. The second area of the second active region 102, the second area of the third active region 103 and the first area of the sixth active region 106 are connected with each other, and the first area of the third active region 103, the second area of the fourth active region 104 and the second area of the fifth active region 105 are connected with each other. The first area of the fourth active region 104 is arranged on one side away from the third active region 103, and the first area of the fifth active region 105 is arranged on the other side away from the third active region 103. The second area of the sixth active region 106 also serves as the second area of the seventh active region 107.

In an exemplary embodiment, the distance between the second active region 102 and the first active region 101 in the first direction is smaller than the distance between the second active region 102 and the seventh active region 107 in the first direction. The distance between the second active region 102 and the third active region 103 in the first direction is smaller than the distance between the second active region 102 and the fourth active region 104 in the first direction. The distance between the second active region 102 and the third active region 103 in the first direction is smaller than the distance between the second active region 102 and the fifth active region 105 in the first direction. The distance between the second active region 102 and the first active region 101 in the first direction is equivalent to the distance between the second active region 102 and the third active region 103 in the first direction.

In an exemplary embodiment, the seventh active region 107 and the first active region 101 are sequentially arranged in the direction from the data line to the power line in which a data signal is written.

In an exemplary embodiment, the shape of the semiconductor layer 20 of the sub-pixel in the i-th row and the j-th column is the same as the shape of the semiconductor layer 20 of the sub-pixel in the i+1-th row and the j+1-th column, and the shape of the semiconductor layer 20 of the sub-pixel in the i-th row and the j+1-th column is the same as the shape of the semiconductor layer 20 of the sub-pixel in the i+1-th row and the j-th column. In the first direction, for the center line between adjacent sub-pixels, semiconductor layers 20 of the adjacent sub-pixels are mirror symmetric about the center line, that is, in the first direction, the semiconductor layers of adjacent sub-pixels are symmetrical with each other. Here, the shapes of the semiconductor layers being the same includes, but is not limited to, that the overall shapes, the connection relationship of respective parts and the trends of signal flow being the same.

In an exemplary embodiment, the manufacturing schematic diagram of the active region in Implementation I is the same as the manufacturing schematic diagram of the active region in Implementation II.

The semiconductor layers of the exemplary embodiments of the present application have a reasonable layout and a simple structure, and can ensure the display effect of the display substrate.

In step 200, a first insulating thin film and a first metal thin film are sequentially deposited on the semiconductor layer 20, and the first metal thin film is processed by a patterning process to form a first insulating layer covering the semiconductor layer 20 and a first metal layer 30 arranged on the first insulating layer, as shown in FIG. 13.

In an exemplary embodiment, the first metal layer 30 may include: a gate line G, a reset signal line Reset, a light emission control line EM, and a first electrode C1 of a storage capacitor.

In an exemplary embodiment, the gate line G, the reset signal line Reset and the light emission control line EM extend in the first direction, the gate line G and the reset signal line Reset are arranged in the first region R1, and the light emission control line EM is arranged in the third region R3. The first electrode C1 of the storage capacitor may be rectangular, and the corners of the rectangle may be chamfered. The first electrode C1 is arranged in the second region R2 and located between the gate line G and the light emission control line EM. There is an overlapping area between the orthographic projection of the first electrode C1 on the base substrate and the orthographic projection of the third active region on the base substrate. In an exemplary embodiment, a first pole plate C1 also serves as the gate electrode of the third transistor.

In an exemplary embodiment, the reset signal line Reset of the first region R1 may be arranged with unequal widths, and the width of the reset signal line Reset is the dimension of the reset signal line Reset in the second direction. The reset signal line Reset includes an area overlapping with the semiconductor layer 20 and an area not overlapping with the semiconductor layer 20, and the width of the reset signal line Reset in the area overlapping with the semiconductor layer 20 may be greater than the width of the reset signal line Reset in the area not overlapping with the semiconductor layer 20.

In an exemplary embodiment, the gate line G in the first region R1 may be arranged with unequal widths, and the width of the gate line G is the dimension of the gate line G in the second direction. In an area of the gate line G overlapping with the semiconductor layer 20 and an area of the gate line G not overlapping with the semiconductor layer 20, the width of the gate line G in the area overlapping with the semiconductor layer 20 may be greater than the width of the gate line Gin the area not overlapping with the semiconductor layer 20.

In an exemplary embodiment, the light emission control line EM in the third region R3 may be arranged with unequal widths, and the width of the light emission control line EM is the dimension of the light emission control line EM in the second direction. The light emission control line EM includes an area overlapping with the semiconductor layer 20 and an area not overlapping with the semiconductor layer 20, and the width of the light emission control line EM in the area overlapping with the semiconductor layer 20 may be greater than the width of the light emission control line EM in the area not overlapping with the semiconductor layer 20.

In an exemplary embodiment, the gate line G in the i-th row may include a first gate line segment extending from the j-th column of sub-pixels to the j+l-th column of sub-pixels in the first direction. A first end of the first gate line segment is connected with the gate line G through a connection strip in the sub-pixel in the i-th row and the j-th column, and a second end of the first gate line segment is connected with the gate line G through a connection strip in the sub-pixel in the i-th row and the j+l-th column, to form a dual gate structure simultaneously in the sub-pixel in the i-th row and the j-th column and in the sub-pixel in the i-th row and j+1 column. The gate line G in the i+1-th row may include a second gate line segment extending from the j+l-th column of sub-pixels to the j+2-th column of sub-pixels in the first direction. A first end of the second gate line segment is connected with the gate line G through a connection strip in the sub-pixel in the i+1-th row and the j+1-th column, and a second end of the second gate line segment is connected with the gate line G through a connection strip in the sub-pixel in the i+1-th row and the j+2-th column, to form a dual gate structure simultaneously in the sub-pixel in the i+1-th row and the j+1-th column and in the sub-pixel in the i+1-th row and the j+2-th column. In this way, second transistors T2 of dual gate structure are formed simultaneously in the j-th column of sub-pixels and the j+1-th column of sub-pixels, and the second transistors T2 of the j-th column of sub-pixels and the second transistors T2 of the j+1-th column of sub-pixels form a dual gate region 110.

In an exemplary embodiment, an area of the first electrode C1 overlapping with the third active region serves as a third gate electrode (a dual gate structure), an area of the gate line G overlapping with the second active region serves as a second gate electrode (a dual gate structure), an area of the reset signal line Reset overlapping with the first active region serves as a first gate electrode (a dual gate structure), an area of the gate line G overlapping with the fourth active region serves as a fourth gate electrode, an area of the reset signal line Reset overlapping with the seventh active region serves as a seventh gate electrode, an area of the light emission control line EM overlapping with the fifth active region serves as a fifth gate electrode, and an area of the light emission control line EM overlapping with the sixth active region serves as a sixth gate electrode.

In an exemplary embodiment, since the first transistor T1, the second transistor T2 and the third transistor T3 are all dual gate transistors, the distance between the dual-gate second transistor T2 and other dual-gate transistors (the first transistor T1 and the third transistor T3) in the first direction is smaller than the distance between the second transistor T2 and the single-gate fourth transistor T4, fifth transistor T5 and seventh transistor T7 in the first direction.

In an exemplary embodiment, after the pattern of the first metal layer 30 is formed, the semiconductor layer may be subjected to a conductive treatment by using the first metal layer 30 as a shield. The semiconductor layer in an area shielded by the first metal layer 30 forms channel areas of the first transistor T1 to the seventh transistor T7, and the semiconductor layer in an area not shielded by the first metal layer 30 is made to be conductive, that is, the first areas and the second areas of the first transistor T1 to the seventh transistor T7 are made to be conductive.

In an exemplary embodiment, the manufacturing schematic diagram of the first metal layer in Implementation I is the same as the manufacturing schematic diagram of the first metal layer in Implementation II.

The first metal layers of the exemplary embodiments of the present application have a reasonable layout and a simple structure, and can ensure the display effect of the display substrate.

In step 300, a second insulating thin film and a second metal thin film are sequentially deposited on the first metal layer 30, and the second metal thin film is processed by a patterning process to form a second insulating layer covering the first metal layer 30 and a second metal layer 40 arranged on the second insulating layer. The second metal layer 40 at least includes an initial signal line Vinit and a second electrode C2 of the storage capacitor. Then, a third insulating thin film is deposited on the second metal layer 40, and the third insulating thin film is processed by a patterning process to form a third insulating layer covering the second metal layer 40. The third insulating layer is provided with a plurality of vias, as shown in FIGS. 14A and 14B.

In an exemplary embodiment, the plurality of vias on the third insulating layer at least include: a second via V2 exposing the second electrode C2, a sixth via V6 exposing the initial signal line Vinit, a seventh via V7 exposing the first electrode C1, an eighth via V8 exposing the fourth active region, a ninth via V9 exposing the second active region, a tenth via V10 exposing the first active region, and a plurality of vias exposing other active regions in the semiconductor layer. The third insulating layer in the second via V2 exposing the second electrode C2 and in the sixth via V6 exposing the initial signal line Vinit is etched away, the second insulating layer and the third insulating layer in the seventh via V7 exposing the first electrode C1 are etched away, and the first insulating layer, the second insulating layer and the third insulating layer in the eighth via V8 exposing the fourth active region, in the ninth via V9 exposing the second active region, in the tenth via V10 exposing the first active region, and in the vias exposing other active regions in the semiconductor layer are etched away.

In an exemplary embodiment, the second via V2 is configured to connect the second electrode C2 with the first pole of the fifth transistor T5 that is formed subsequently, the sixth via V6 is configured to connect the initial signal line Vinit with the first pole of the first transistor T1 that is formed subsequently, the seventh via V7 is configured to connect the first electrode C1 with the first pole of the second transistor T2 that is formed subsequently, the eighth via V8 is configured to connect the active layer of the fourth transistor T4 with the first pole of the fourth transistor T4 that is formed subsequently, the ninth via V9 is configured to connect the active layer of the second transistor T2 with the first pole of the second transistor T2 that is formed subsequently, and the tenth via V10 is configured to connect the active layer of the first transistor T1 with the first pole of the first transistor T1 that is formed subsequently. Since the first pole of the fourth transistor T4 that is formed subsequently is connected with the data line D that is formed subsequently, the eighth via V8 is a data writing hole.

In an exemplary embodiment, the distance between the data writing hole and the second transistor T2 in the first direction is greater than the distance between the data writing hole and the first transistor T1 in the first direction, and is greater than the distance between the data writing hole and the seventh transistor T7 in the first direction. The distance between the data writing hole and the third transistor T3 in the second direction is smaller than the distance between the data writing hole and the fifth transistor T5 in the second direction, and is smaller than the distance between the data writing hole and the sixth transistor T6 in the second direction.

In an exemplary embodiment, the number of second vias V2 may be two, and the two second vias are sequentially arranged in the second direction. Since the width of a fifth first pole is relatively small, the arrangement of two second vias V2 may improve the reliability of connection between the second electrode and the fifth first pole.

In an exemplary embodiment, the initial signal line Vinit extends in the first direction, and is arranged in the first region R1 and located on a side of the reset signal line Reset away from the second region R2. The second electrode C2 of the storage capacitor in each sub-pixel may have a rectangular profile, and is arranged in the second region R2 and located between the gate line G and the light emission control line EM.

In an exemplary embodiment, the profile of the second electrode C2 may be rectangular, and the corners of the rectangle may be chamfered. There is an overlapping area between the orthographic projection of the second electrode C2 on the base substrate and the orthographic projection of the first electrode C1 on the base substrate. The middle of the second electrode C2 is provided with an opening 111 which can be rectangular, so that the second electrode C2 forms an annular structure. The opening 111 exposes the second insulating layer covering the first electrode C1, and the orthographic projection of the first electrode C1 on the base substrate includes the orthographic projection of the opening 111 on the base substrate. In an exemplary embodiment, the orthographic projection of the opening 111 on the base substrate includes the orthographic projection of the seventh via V7 exposing the first electrode C1 on the base substrate.

The orthographic projection of an edge of the second electrode C2 close to the first region R1 on the base substrate overlaps with the orthographic projection of the boundary line between the first region R1 and the second region R2 on the base substrate, and the orthographic projection of an edge of the second electrode C2 close to the third region R3 on the base substrate overlaps with the orthographic projection of the boundary line between the second region R2 and the third region R3 on the base substrate, that is, a second length of the second electrode C2 is equal to a second length of the second region R2, the second length referring to the dimension in the second direction.

In Implementation I, the second electrodes C2 of adjacent sub-pixels in one row are an integrated structure in which they are connected with each other. With this structure, the second electrodes C2 of adjacent sub-pixels may be reused as power signal lines, which can ensure that power signals provided by the power lines of adjacent sub-pixels are the same, thereby avoiding poor display of the display substrate and ensuring the display effect of the display substrate.

In Implementation II, the second electrode C2 of the sub-pixel in the i-th row and the j+1-th column and the second electrode C2 of the sub-pixel in the i-th row and the j+1-th column are an integrated structure in which they are connected with each other by the first connection part. The second electrode C2 of the sub-pixel in the i-th row and the j+1-th column is disconnected from the second electrode C2 of the sub-pixel in the i-th row and the j+2-th column. The second electrode C2 of the sub-pixel in the i-th row and the j+2-th column and the second electrode C2 of the sub-pixel in the i-th row and the j+3-th column are an integrated structure in which they are connected with each other by the first connection part. The second electrode C2 of the sub-pixel in the i+1-th row and the j-th column is disconnected from the second electrode C2 of the sub-pixel in the i+1-th row and the j+1-th column. The second electrode C2 of the sub-pixel in the i+1-th row and the j+1-th column and the second electrode C2 of the sub-pixel in the i+1-th row and the j+2-th column are an integrated structure in which they are connected with each other by the first connection part. The second electrode C2 of the sub-pixel in the i+1-th row and the j+2-th column is disconnected from the second electrode C2 of the sub-pixel in the i+1-th row and the j+3-th column. With this structure, the second electrodes C2 of adjacent sub-pixels may be reused as power signal lines, which can ensure that power signals provided by the power lines of adjacent sub-pixels are the same, thereby avoiding poor display of the display substrate and ensuring the display effect of the display substrate.

FIG. 14A is a manufacturing schematic diagram of Implementation I, and FIG. 14B is a manufacturing schematic diagram of Implementation II.

The second metal layers and the vias of the exemplary embodiments of the present application have a reasonable layout and a simple structure, and can ensure the display effect of the display substrate.

In step 400, a third metal thin film is deposited on the third insulating layer, and the third meal thin film is processed by a patterning process to form a third metal layer 50. The third meal layer 50 at least includes the first pole 51 of the fifth transistor T5, the second pole 52 of the sixth transistor T6, the first pole 53 of the fourth transistor T4, the first pole 54 of the first transistor T1 and the first pole 55 of the second transistor T2. The first pole 51 of the fifth transistor T5 is connected with the second electrode C2 through the second via V2. The second pole 52 of the sixth transistor T6 is connected with the active layer of the sixth transistor through a via. The first pole 53 of the fourth transistor T4 is connected with the active layer of the fourth transistor T4 through the eighth via V8. One end of the first pole 54 of the first transistor T1 is connected with the initial signal line Vinit through the sixth via V6, and the other end is connected with the active layer of the first transistor T1 through the tenth via V10. One end of the first pole 55 of the second transistor T2 is connected with the first electrode C1 through the seventh via V7, and the other end is connected with the active layer of the second transistor T2 through the ninth via V9. A fourth insulating thin film is then deposited on the third metal layer 50, the fourth insulating thin film is processed by a patterning process to form a fourth insulating layer covering the third metal layer 50, and the fourth insulating layer is provided with a plurality of vias, as shown in FIGS. 15A and 15B.

In an exemplary embodiment, the plurality of vias on the fourth insulating layer at least include: a first via V1 exposing the first pole 51 of the fifth transistor T5, a fourth via V4 exposing the second pole 52 of the sixth transistor T6, and a third via V3 exposing the first pole 53 of the fourth transistor T4. The first via V1 exposing the first pole 51 of the fifth transistor T5 is configured to connect the first pole 51 of the fifth transistor T5 with a power line VDD that is formed subsequently, the fourth via V4 exposing the second pole 52 of the sixth transistor T6 is configured to connect the second pole 52 of the sixth transistor T6 with a connection electrode that is formed subsequently, and the third via V3 exposing the first pole 53 of the fourth transistor T4 is configured to connect the first pole 53 of the fourth transistor T4 with a data line D that is formed subsequently.

In an exemplary embodiment, there is an overlapping area between the orthographic projection of the first via V1 on the base substrate and the orthographic projection of the gate line G on the base substrate.

In an exemplary embodiment, there is an overlapping area between the orthographic projection of the first via V1 on the base substrate and the orthographic projection of the second electrode C2 on the base substrate.

In an exemplary embodiment, there is an overlapping area between the orthographic projection of the third via V3 on the base substrate and the orthographic projection of the gate line G on the base substrate.

In an exemplary embodiment, there is an overlapping area between the orthographic projection of the fourth via V4 on the base substrate and the orthographic projection of the light emission control line EM on the base substrate.

In Implementation I, the first poles 51 of the fifth transistors T5 of adjacent sub-pixels in the same row are arranged at intervals.

In Implementation II, the first pole 51 of the fifth transistor T5 in the sub-pixel in the i-th row and the j+1-th column is connected with the first pole 51 of the fifth transistor T5 in the sub-pixel in the i-th row and the j+2-th column by the second connection part, the first pole 51 of the fifth transistor T5 in the sub-pixel in the i+1-th row and the j-th column is connected with the first pole 51 of the fifth transistor T5 in the sub-pixel in the i-th row and the j+1-th column by the second connection part, and the first pole 51 of the fifth transistor T5 in the sub-pixel in the i+1-th row and the j+2-th column is connected with the first pole 51 of the fifth transistor T5 in the sub-pixel in the i-th row and the j+3-th column by the second connection part.

FIG. 15A is a manufacturing schematic diagram of Implementation I, and FIG. 15B is a manufacturing schematic diagram of Implementation II.

The third metal layers and the vias of the exemplary embodiments of the present application have a reasonable layout and a simple structure, and can ensure the display effect of the display substrate.

In step 500, a fourth metal thin film is deposited on the fourth insulating layer, and the fourth metal thin film is processed by a patterning process to form a fourth metal layer 60 including a first sub-data line DO, a second sub-data line DE, a power line VDD and a connection electrode 61. The first sub-data line DO and the second sub-data line DE are respectively connected to the first pole 53 of the fourth transistor T4 through the third vias V3 in the sub-pixels, in which the first sub-data line DO and the second sub-data line DE are located, exposing the first pole 53 of the fourth transistor T4. The power line VDD is connected to the first pole 51 of the fifth transistor T5 through the first via V1 exposing the first pole 51 of the fifth transistor T5. The connection electrode 61 is connected to the second pole 52 of the sixth transistor T6 through the fourth via V4 exposing the second pole 52 of the sixth transistor T6. A fifth insulating thin film is then deposited on the fourth metal layer 60, a flat thin film is coated onto the fifth insulating thin film, and the flat thin film and the fifth insulating thin film are processed by a patterning process to form a fifth insulating layer covering the fourth metal layer 60 and a flat layer arranged on the fifth insulating layer, the flat layer being provided with a plurality of vias, as shown in FIGS. 16A and 16B.

In an exemplary embodiment, the first sub-data line DO, the second sub-data line DE and the power line VDD extend in the second direction. The first sub-data line DO is located on one side of a sub-pixel and the second sub-data line DE is located on the other side of the sub-pixel. The power line VDD is located between the first sub-data line DO and the second sub-data line DE.

In an exemplary embodiment, the first sub-data line DO and the second sub-data line DE may be straight lines with equal widths, and the widths of the first sub-data line DO and the second sub-data line DE are the dimensions of the first sub-data line DO and the second sub-data line DE in the first direction.

In an exemplary embodiment, the first poles of the fourth transistors of adjacent sub-pixels located in the same column are connected to different sub-data lines. For example, the sub-pixel in the i-th row and the j-th column is connected to the first sub-data line in the j-th column of data line, and the sub-pixel in the i+1-th row and the j-th column is connected to the second sub-data line in the j-th column of data line. Alternatively, the sub-pixel in the i-th row and the j-th column is connected to the second sub-data line in the j-th column of data line, and the sub-pixel in the i+1-th row and the j-th column is connected to the first sub-data line in the j-th column of data line.

In an exemplary embodiment, in at least one sub-pixel, the first sub-data line DO is connected with the first pole 53 of the fourth transistor T4 through the third via V3 in the sub-pixel where the first sub-data line DO is located, and the first pole 53 of the fourth transistor T4 is connected with the fourth active region through the eighth via V8. The eighth via V8 is a data writing hole, and the first sub-data line DO is the data line of the sub-pixel for writing data signals. In at least one sub-pixel, the second sub-data line DE is connected with the first pole 53 of the fourth transistor T4 through the third via V3 in the sub-pixel where the second sub-data line DE is located, and the first pole 53 of the fourth transistor T4 is connected with the fourth active region through the eighth via V8. The eighth via V8 is a data writing hole, and the second sub-data line DE is the data line of the sub-pixel for writing data signals.

In an exemplary embodiment, the power line VDD of each sub-pixel is connected with the first pole 51 of the fifth transistor T5 through the first via V1. Since the first pole 51 of the fifth transistor T5 is connected with the second electrode C2 of the storage capacitor, and the second electrodes C2 of the storage capacitors of adjacent sub-pixels are connected with each other, the connection between the power line VDD and the second electrode C2 is realized, and the function of power supply connection line of the second electrode C2 is also realized, so that the power signals provided to each sub-pixel are the same, thereby ensuring the display effect of the display substrate.

In an exemplary embodiment, the power line VDD of each sub-pixel may be a zigzag line. In the second direction, the power line VDD of each sub-pixel may include a first power supply part, a second power supply part and a third power supply part connected in sequence. In the power line corresponding to the sub-pixel in the i-th row and the j-th column, a first end of the first power supply part is connected with a second end of the third power supply part in the sub-pixel located in the i−1-th row and the j-th column, and a second end of the first power supply part extends in the second direction and is connected with a first end of the second power supply part. A second end of the second power supply part extends in an oblique direction and is connected with a first end of the third power supply part. There is an included angle between the oblique direction and the second direction, and the included angle may be greater than 0 degree and smaller than 90 degrees. The second end of the third power supply part extends in the second direction, and is connected with a first end of the first power supply part in the sub-pixel located in the i+1-th row and the j-th column.

In an exemplary embodiment, the first power supply part may be a straight line with equal widths, the second power supply part may be an oblique line with equal widths, and the third power supply part may be a straight line with equal widths. The first power supply part and the second power supply part are parallel to the first sub-data line (or the second sub-data line), an included angle between the second power supply part and the first power supply part may be greater than 90 degrees and smaller than 180 degrees, and an included angle between the second power supply part and the third power supply part may be greater than 90 degrees and smaller than 180 degrees.

In an exemplary embodiment, an extension length of the first power supply part in the first direction is greater than an average width of the first power supply part, an extension length of the second power supply part in the oblique direction is greater than an average width of the second power supply part, and an extension length of the third power supply part in the first direction is greater than an average width of the third power supply part. The oblique direction is a direction in which the second power supply part and the first power supply part have an included angle therebetween.

In an exemplary embodiment, the average width of the third power supply part may be smaller than that of the first power supply part, and the average width of the third power supply part may be smaller than that of the second power supply part. The power line VDD is provided as a zigzag line with variable width, which not only can facilitate the layout of pixel structures, but also can reduce the parasitic capacitance of the power line VDD and the data line. Since the distance between the third power supply part and the data line is relatively small, to reduce the average width of the third power supply part can reduce the parasitic capacitance of the third power supply part and the data line.

In an exemplary embodiment, the average width of the first power supply part may be greater than or equal to that of the second power supply part, or the average width of the first power supply part may be smaller than that of the second power supply part.

In an exemplary embodiment, the length of the second power supply part in the extension direction is equivalent to a second length of the first electrode C1. The second length of the first electrode C1 is the dimension of the first electrode C1 in the second direction. The length of the first power supply part in the extension direction is equivalent to a second length of the second electrode C2, and the length of the third power supply part in the extension direction is equivalent to the second length of the second electrode C2. The second length of the second electrode C2 is the dimension of the second electrode C2 in the second direction.

As shown in FIGS. 3, 16A and 16B, in an exemplary embodiment, there is an overlapping area between the orthographic projection of the first power supply part on the base substrate and orthographic projections of the first pole 55 of the second transistor T2 and the ninth via V9 on the base substrate, so there is an overlapping area between the orthographic projection of the first power supply part on the base substrate and the orthographic projection of the second transistor T2 on the base substrate. There is an overlapping area between the orthographic projection of the second power supply part on the base substrate and the orthographic projection of the first via V1 on the base substrate, and there is an overlapping area between the orthographic projection of the third power supply part on the base substrate and the orthographic projection of the first pole 51 of the fifth transistor T5 on the base substrate, so the orthographic projections of the second power supply part and the third power supply part on the base substrate both have an overlapping area with the first pole 51 of the fifth transistor T5.

In an exemplary embodiment, there is an overlapping area between the orthographic projection of the first via V1 on the base substrate and the orthographic projection of an extension line of the first power supply part in the second direction on the base substrate, and there is an overlapping area between the orthographic projection of the first via V1 on the base substrate and the orthographic projection of an extension line of the third power supply part in the second direction on the base substrate, so in the first direction, the distance between the first power supply part and the third power supply part in the first direction is smaller than a first length of the first via V1 or the average width of the third power supply part. That is, the distance between an edge of a side of the first power supply part close to the third power supply part and an edge of a side of the third power supply part close to the first power supply part is smaller than the first length of the first via V1 or the width of the third power supply part. The first length of the first via V1 refers to the dimension of the first via V1 in the first direction. Therefore, for the second power supply part extending in the oblique direction, it can be understood as the second power supply part bending the power line VDD. In the first direction, the degree of bending is equivalent to the first length of the first via V1 or the width of the third power supply part; and in the second direction, the degree of bending is equivalent to the second length of the first electrode C1. Herein, edges of two power supply parts refer to the edges of the overall profiles of the two power supply parts.

In an exemplary embodiment, there is an overlapping area between the orthographic projection of the second power supply part on the base substrate and the orthographic projection of the second electrode on the base substrate.

In an exemplary embodiment, there is an overlapping area between the orthographic projection of the second power supply part on the base substrate and the orthographic projection of the first connection part on the base substrate.

In an exemplary embodiment, there is an overlapping area between the orthographic projection of the second power supply part on the base substrate and the orthographic projection of the first electrode C1 on the base substrate.

In an exemplary embodiment, there is an overlapping area between the orthographic projection of the second power supply part on the base substrate and the orthographic projection of the gate line G on the base substrate. That is, there is an overlapping area between the orthographic projection of the second power supply part on the base substrate and the orthographic projections of the gate electrode of the second transistor T2 and the gate electrode of the fourth transistor T4 on the base substrate.

In an exemplary embodiment, the connection electrode 61 has a strip shape extending in the second direction, and the extension direction of the connection electrode 61 is parallel to the extension direction of the third power supply part, and the length of the connection electrode 61 in the second direction is equivalent to that of the third power supply part in the second direction.

In an exemplary embodiment, there is an overlapping area between the orthographic projection of the connection electrode 61 on the base substrate and the orthographic projection of the second electrode C2 on the base substrate.

In an exemplary embodiment, there is an overlapping area between the orthographic projection of the connection electrode 61 on the base substrate and the orthographic projection of the opening 111 in the middle of the second electrode C2 on the base substrate.

In an exemplary embodiment, there is an overlapping area between the orthographic projection of the connection electrode 61 on the base substrate and the orthographic projection of a second first pole 55 on the base substrate.

In an exemplary embodiment, the extension direction of the connection electrode 61 overlaps with that of the first power supply part. That is, there is an overlapping area between the orthographic projection of the connection electrode 61 on the base substrate and the orthographic projection of the virtual extension line of the first power supply part in the second direction on the base substrate.

In an exemplary embodiment, the eighth via V8 (i.e., the data writing hole) is located on the virtual extension line of the third power supply part in the second direction. That is, there is an overlapping area between the orthographic projection of the eighth via V8 on the base substrate and the orthographic projection of the virtual extension line of the third power supply part in the second direction on the base substrate.

In an exemplary embodiment, the power line VDD of each sub-pixel is connected with the first pole 51 of the fifth transistor T5 through the first via V1, and the first pole 51 of the fifth transistor T5 is connected with the second electrode C2 of the storage capacitor through the second via V2, so that the power line VDD is connected with the second electrode C2 of the storage capacitor. Thus, the first via V1 is called a power supply writing hole.

In an exemplary embodiment, the orthographic projection of the power supply writing hole on the base substrate is located within the range of the orthographic projection of the second power supply part on the base substrate. The distance between the power supply writing hole and the fourth transistor T4 in the first direction is equivalent to the distance between the power supply writing hole and the second transistor T2 in the first direction. The distance between the power supply writing hole and the second transistor T2 in the second direction is smaller than the distance between the power supply writing hole and the first transistor T1 in the second direction, and smaller than the distance between the power supply writing hole and the seventh transistor T7 in the second direction. The distance between the power supply writing hole and the third transistor T3 in the second direction is smaller than the distance between the power supply writing hole and the fifth transistor T5 in the second direction, and smaller than the distance between the power supply writing hole and the sixth transistor T6 in the second direction.

In an exemplary embodiment, the plurality of vias on the fifth insulating layer and the flat layer at least include: a fifth via V5 exposing the connection electrode 61. The fifth via V5 exposing the connection electrode 61 is configured to connect the connection electrode 61 with a fifth metal layer (anode) subsequently formed. Due to the connection between the connection electrode 61 and the sixth second pole 52, the connection between the sixth second pole 52 and the fifth metal layer is realized, and the driving circuit can drive the light-emitting device to emit light.

In an exemplary embodiment, the connection electrode 61 is connected to the second pole 52 of the sixth transistor T6 through a fourth via V4 located at an end of the connection electrode 61 away from the second power supply part. The connection electrode 61 is connected with the subsequently formed anode through the fifth via V5. The fifth via V5 is located at an end of the connection electrode 61 close to the second power supply part, and there is an overlapping area between the orthographic projection of the fifth via V5 on the base substrate and the orthographic projection of the second electrode C2 of the storage capacitor on the base substrate.

In an exemplary embodiment, the fifth via V5 is located on the virtual extension line of the first power supply part in the second direction. That is, there is an overlapping area between the orthographic projection of the fifth via V5 on the base substrate and the orthographic projection of the virtual extension line of the first power supply part in the second direction on the base substrate.

FIG. 16A is a manufacturing schematic diagram of Implementation I, and FIG. 16B is a manufacturing schematic diagram of Implementation II.

The fourth metal layers and the vias of the exemplary embodiments of the present application have a reasonable layout and a simple structure, and can ensure the display effect of the display substrate.

In step 600, a fifth metal thin film is deposited on the flat layer, and the fifth metal thin film is processed by a patterning process to form a fifth metal layer 70. The fifth metal layer 70 at least includes an anode connected with the connection electrode 61 through the fifth via exposing the connection electrode 61. As the anode is connected with the connection electrode 61 and the connection electrode 61 is connected with the second pole 52 of the sixth transistor T6, the connection between the second pole 52 of the sixth transistor T6 and the anode is realized, and the sixth transistor can drive the light-emitting device to emit light. Then, a pixel definition thin film is coated onto the fifth metal layer, and the pixel definition thin film is processed by a patterning process to form a pixel definition layer. The pixel definition layer of each sub-pixel is provided with a pixel opening exposing the anode. Subsequently, an organic light-emitting layer is formed by an evaporation process, and a cathode is formed on the organic light-emitting layer.

The structure shown in the present application and the preparation process thereof are merely an exemplary description. In an exemplary implementation, corresponding structures may be changed and patterning processes may be added or reduced according to actual needs. For example, the power lines VDD and the first poles or the second poles of some transistors may be located on the third metal layer 50, and the data lines D and the first poles or the second poles of some transistors may be located on the fourth metal layer 60. In another example, the data lines D and the first poles or the second poles of some transistors may be located on the third metal layer 50, and the power lines VDD and the first poles or the second poles of some transistors may be located on the fourth metal layer 60. In a further example, the power lines VDD and the data lines D may be located on the third metal layer 50, and the first poles and the second poles of the first to seventh transistors may be located on the fourth metal layer 60, which is not limited in the present application.

Figure 17:
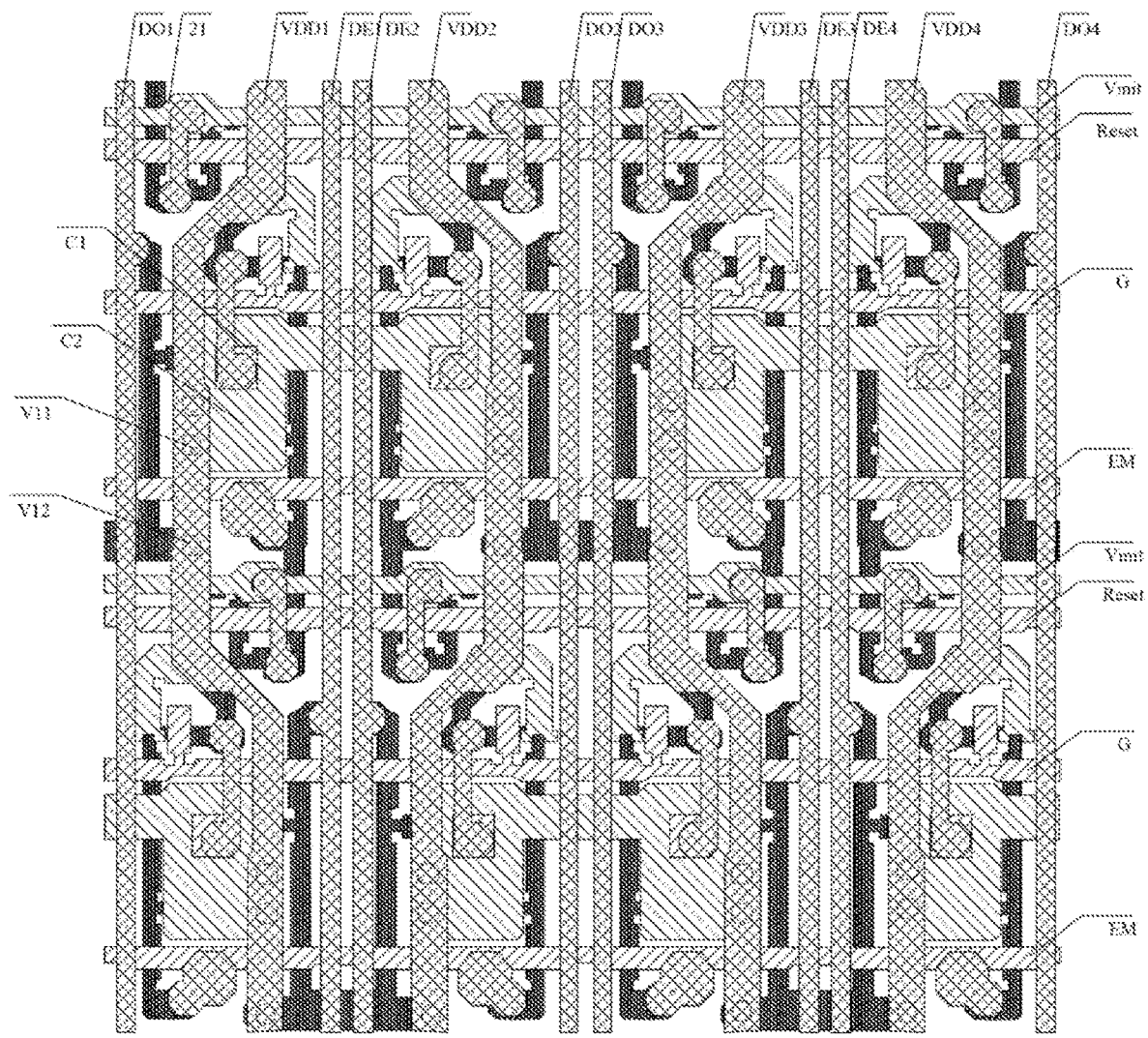
FIG. 17 is a top view of a plurality of sub-pixels in another display substrate according to the present application.
Figure 18:
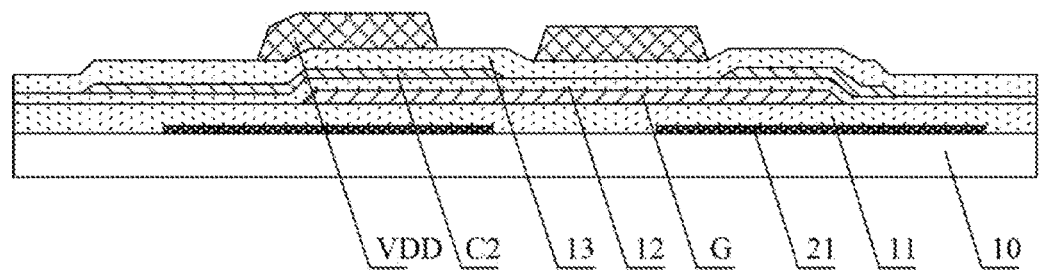
FIG. 18 is a sectional view of a plurality of sub-pixels in another display substrate according to the present application.

FIG. 17 is a top view of a plurality of sub-pixels in another display substrate according to the present application, and FIG. 18 is a sectional view of a plurality of sub-pixels in another display substrate according to the present application. FIG. 17 schematically illustrates an example where there are 8 sub-pixels (sub-pixels in the first four columns and the first two rows). As shown in FIG. 1, FIG. 17 and FIG. 18, the display substrate according to the present application includes: a base substrate 10, and a plurality of sub-pixels P, a plurality of columns of power lines VDD, and data lines D arranged on the same layer as the power lines VDD, which are arranged on the base substrate 10. Each sub-pixel P includes a driving circuit. The driving circuit may include a plurality of transistors and a storage capacitor. The storage capacitor includes a first electrode C1 and a second electrode C2 which are oppositely arranged. An active region 21 of the transistor is located on a side of the second electrode C2 of the storage capacitor close to the base substrate 10. The power lines VDD are located on a side of the second electrode C2 of the storage capacitor away from the base substrate 10.

In an exemplary embodiment, at least one sub-pixel and the power lines VDD are respectively connected with the second electrode C2 of the storage capacitor and the third connection part of the semiconductor layer. The second electrode C2 of the storage capacitor of each sub-pixel is connected with the second electrode C2 of the storage capacitor of an adjacent sub-pixel in the same row, and the semiconductor layer of each sub-pixel is connected with the semiconductor layer of the other adjacent sub-pixel in the same row through the third connection part.

In some possible implementations, as shown in FIG. 17, the driving circuits of the i-th column of sub-pixels are connected with the i-th column of data line and the i-th column of power line, 1≤i≤N. Each column of data line includes a first sub-data line and a second sub-data line. The first sub-data line DOi and the second sub-data line DEi in the i-th column of data line Di are located on the two sides of the i-th column of sub-pixels, respectively. The i-th column of power line VDDi is located between the first sub-data line DOi and the second sub-data line DEi in the i-th column of data line Di.

In some possible implementations, adjacent sub-pixels in the same column are connected to different sub-data lines. That is, if the sub-pixel in the i-th row and the j-th column is connected to the first sub-data line DOj in the j-th column of data line, the sub-pixel in the i+1-th row and the j-th column is connected to the second sub-data line DEj in the j-th column of data line; and if the sub-pixel in the i-th row and the j-th column is connected to the second sub-data line DEj in the j-th column of data line, the sub-pixel in the i+1-th row and the j-th column is connected to the first sub-data line DOj in the j-th column of data line. In some possible implementations, the arrangement modes of the first sub-data lines and the second sub-data lines in adjacent data lines are opposite.

That is, when the first sub-data line DOi of the i-th column of data line Di is located on a first side of the i-th column of sub-pixels, and the second sub-data line DEi of the i-th column of data line Di is located on a second side of the i-th column of sub-pixels, the second sub-data line DEi+1 of the i+1-th column of data line Di+1 is located on a first side of the i+1-th column of sub-pixels, and the first sub-data line DOi+1 of the i+1-th column of data line Di+1 is located on a second side of the i+1-th column of sub-pixels. Alternatively, when the first sub-data line DOi of the i-th column of data line Di is located on the second side of the i-th column of sub-pixels, and the second sub-data line DEi of the i-th column of data line Di is located on the first side of the i-th column of sub-pixels, the second sub-data line DEi+1 of the i+1-th column of data line Di+1 is located on the second side of the i+1-th column of sub-pixels, and the first sub-data line DOi+1 of the i+1-th column of data line Di+1 is located on the first side of the i+1-th column of sub-pixels.

As shown in FIGS. 17 and 18, in an exemplary embodiment, the display substrate may include: a first insulating layer 11, a second insulating layer 12 and a third insulating layer 13 which are sequentially arranged on the base substrate 10, a gate line G, a reset signal line Reset, a light emission control signal line EM, and an initial signal line Vinit. The gate line G, the reset signal line Reset, the light emission control signal line EM, the first electrode C1 of the storage capacitor and the gate electrode of the transistor are arranged on the same layer. The second electrode C2 of the storage capacitor and the initial signal line Vinit are arranged on the same layer. The data line D, the power line VDD and the source and drain electrodes of the transistor are arranged on the same layer. The source and drain electrodes of the transistors include first poles and second poles of the transistors.

In an exemplary embodiment, the first insulating layer 11 is arranged between the active region 21 of the transistor and the gate electrode of the transistor, the second insulating layer 12 is arranged between the gate electrode of the transistor and the second electrode C2 of the storage capacitor, and the third insulating layer 13 is arranged between the second electrode C2 of the storage capacitor and the data line.

In an exemplary embodiment, manufacturing materials of the gate electrode of the transistor, the source and drain electrodes of the transistor, the data line D and the power line VDD are all metals, which, for example, may be metal materials such as silver, aluminum or copper, which is not limited in the present application.

In an exemplary embodiment, a manufacturing material of the active region 21 is polysilicon, which is not limited in the present application.

In the present application, by the interconnected second electrodes of the storage capacitors and the interconnected semiconductor layers, it is ensured that power signals provided by the power lines in all sub-pixels in the same row are the same, thereby avoiding poor display of the display substrate and ensuring the display effect of the display substrate.

In the present application, the second electrodes of the storage capacitors and the semiconductor layers are reused as power supply connection lines to transmit power signals of the power lines, and the distance between the active region of the transistor and the data line is greater than the distance between the second electrode of the storage capacitor and the data line. Thus, the technical solutions of the present application increase the distance between partial power lines and data lines, reduce the load of the data lines, and therefore reduce the power consumption of the display substrate and reduce the writing time of data signals.

In an exemplary embodiment, the active regions of adjacent sub-pixels located in the same column are connected with each other through the third connection part.

In an exemplary embodiment, the pixel structure of the sub-pixel located in the i-th row and the j-th column is the same as that of the sub-pixel located in the i+1-th row and the j+1-th column.

In an exemplary embodiment, adjacent power lines are symmetrical with each other, and the power line VDDi in the i-th column and the power line VDDi+1 in the i+1-th column are symmetrically arranged in the extension direction of the data lines.

In an exemplary embodiment, the power lines VDD are in a zigzag shape.

In an exemplary embodiment, each pixel in the display substrate may include four sub-pixels. The pixels may include first pixels and second pixels. In a first pixel, the second electrode of the storage capacitor in the i-th sub-pixel and the second electrode of the storage capacitor in the i+1-th sub-pixel are connected with each other through the first connection part, the active region of the transistor in the i-th sub-pixel is disconnected from the active region of the transistor in the i+1-th sub-pixel, the active region of the transistor in the second sub-pixel and the active region of the transistor in the third sub-pixel are connected with each other through the third connection part, and the second electrode of the storage capacitor in the second sub-pixel is disconnected from the second electrode of the storage capacitor in the third sub-pixel. In a second pixel, the second electrode of the storage capacitor in the second sub-pixel and the second electrode of the storage capacitor in the third sub-pixel are connected with each other through the first connection part, the active region of the transistor in the second sub-pixel is disconnected from the active region of the transistor in the third sub-pixel, the active region of the transistor in the i-th sub-pixel and the active region of the transistor in the i+1-th sub-pixel are connected with each other through the third connection part, and the second electrode of the storage capacitor in the i-th sub-pixel is disconnected from the second electrode of the storage capacitor in the i+1-th sub-pixel. In the above, i is an odd number smaller than 4.

FIG. 17 illustrates an example of two pixels arranged in the column direction. The upper pixel is the first pixel, and the lower pixel is the second pixel, which is not limited in the present application. Since the pixel structures of adjacent sub-pixels are symmetrical, in the display substrate, the first pixel is arranged between adjacent second pixels, and the second pixel is arranged between adjacent first pixels.

Figure 19:
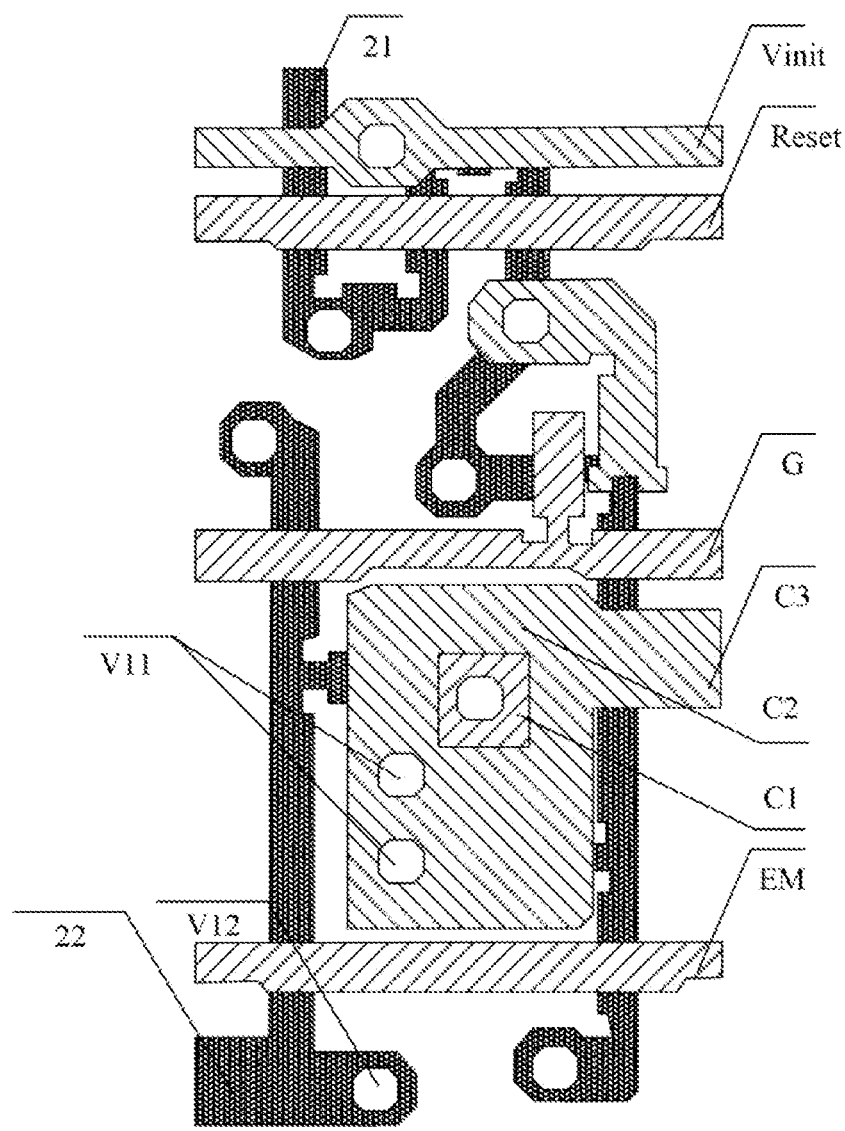
FIG. 19 is a partial top view of a sub-pixel in another display substrate according to the present application.
Figure 20:
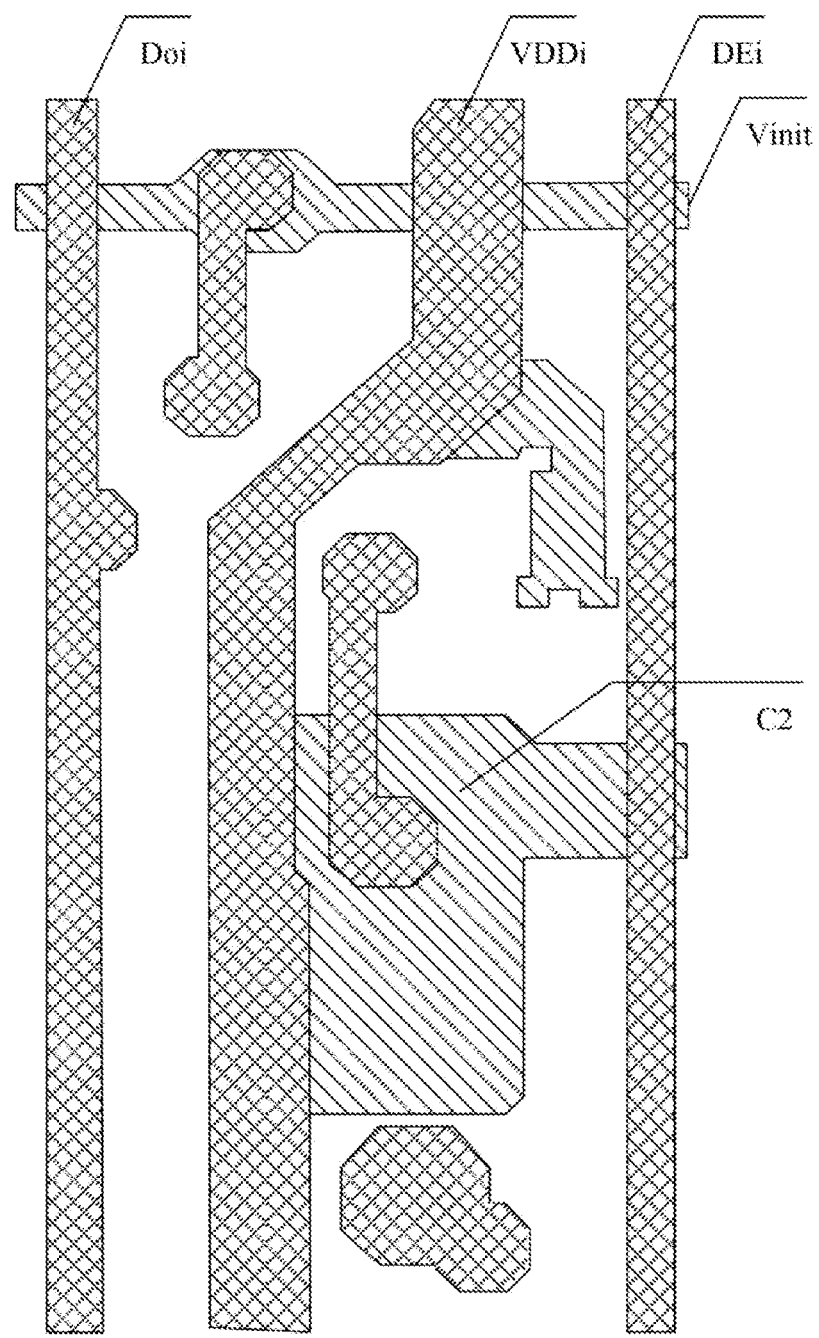
FIG. 20 is another partial top view of a sub-pixel in another display substrate according to the present application.
Figure 21:
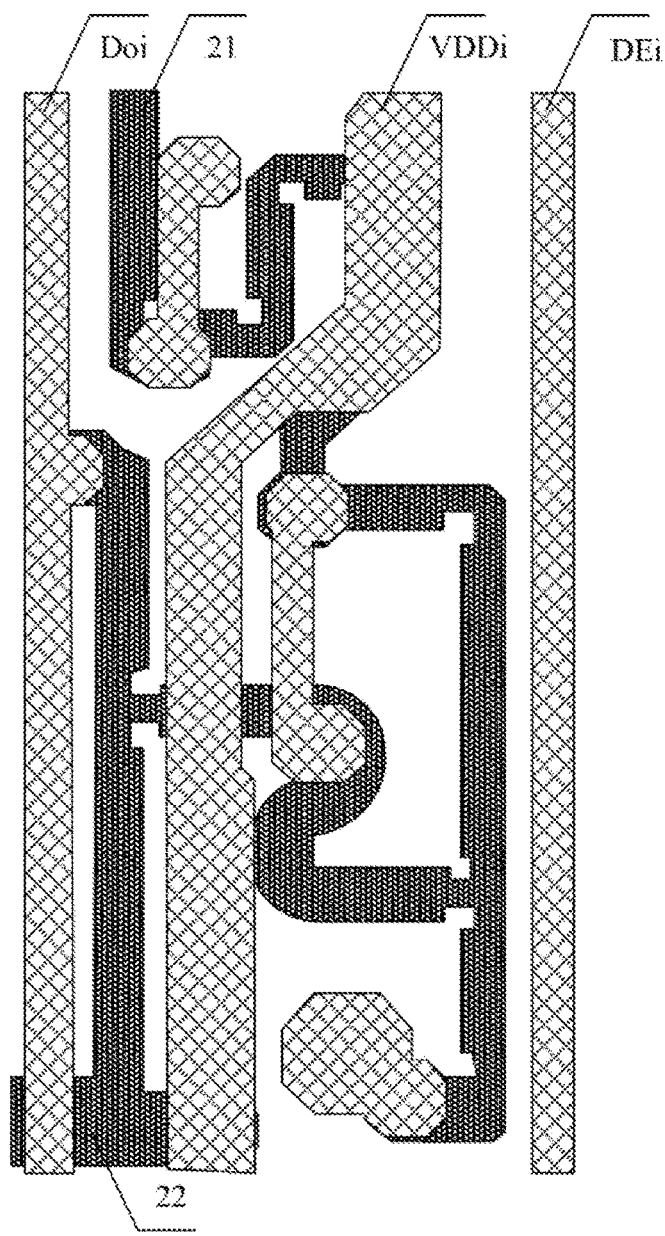
FIG. 21 is a further partial top view of a sub-pixel in another display substrate according to the present application.

FIG. 19 is a partial top view of sub-pixels in another display substrate according to the present application, not including power lines, data lines and source and drain electrodes of transistors. FIG. 20 is another partial top view of sub-pixels in another display substrate according to the present application, only including the film layer where the second electrode of the storage capacitor is located and the film layer where the data lines are located. FIG. 21 is a further partial top view of sub-pixels in another display substrate according to the present application, only including the film layers where the active regions of the transistors and the data lines are located. As shown in FIG. 19, eleventh vias V11 are provided on the third insulating layer in the display substrate.

In an exemplary embodiment, with reference to FIGS. 19 and 21, in each sub-pixel, the orthographic projection of the second electrode C2 of the storage capacitor on the base substrate includes the orthographic projection of the eleventh via V11 on the base substrate, and the power line is connected with the second electrode C2 of the storage capacitor through the eleventh via V11.

In an exemplary embodiment, the number of eleventh vias V11 is at least one.

Specifically, the more the eleventh vias V11 are, the better the conductivity between the power line and the second electrode of the storage capacitor is.

In an exemplary embodiment, as shown in FIG. 19, a twelfth via V12 is provided in the first insulating layer, the second insulating layer and the third insulating layer in the display substrate.

In an exemplary embodiment, with reference to FIG. 19 and FIG. 21, in each sub-pixel, there is an overlapping area between the orthographic projection of the twelfth via V12 on the base substrate and the orthographic projection of the third connection part 22 on the base substrate, and the power line is connected with the third connection part 22 of the transistor through the twelfth via V12.

In an exemplary embodiment, the number of twelfth vias V12 is at least one. The more the vias are, the better the conductivity of components connected through the vias is.

FIGS. 19 to 21 illustrate an example where there are two eleventh vias V11 and one twelfth via V12, which is not limited in the present application.

In an exemplary embodiment, through a reasonable design of layout, interconnection of conductive layers of multiple sub-pixels may be realized only by the semiconductor layers, or interconnection of conductive layers of multiple sub-pixels may be realized only by the first metal layers, or interconnection of conductive layers of multiple sub-pixels may be realized only by the second metal layers, or interconnection of conductive layers of multiple sub-pixels may be realized only by the third metal layers, thus realizing that the power lines of sub-pixels located in the same row are interconnected in the extension direction of the gate lines through the driving circuits, which will not be described in detail here.

Figure 22:
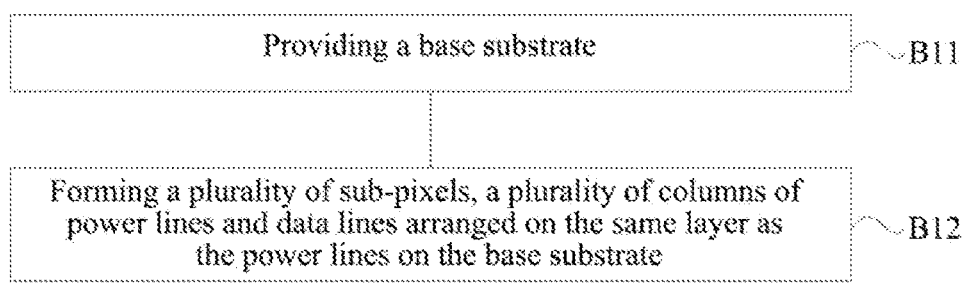
FIG. 22 is a flowchart of a method for manufacturing another display substrate according to the present application.

The present application further provides a method for manufacturing another display substrate, which is used to manufacture another display substrate provided in the above embodiments. FIG. 22 is a flowchart of a method for manufacturing another display substrate according to the present application. As shown in FIG. 22, the method for manufacturing another display substrate provided by the present application includes step B11 and step B12.

In step B11, a base substrate is provided.

In step B12, a plurality of sub-pixels, a plurality of columns of power lines and data lines arranged on the same layer as the power lines are formed on the base substrate.

In an exemplary embodiment, each sub-pixel may include a driving circuit. The driving circuit may include a plurality of transistors and a storage capacitor. The storage capacitor may include a first electrode and a second electrode which are oppositely arranged. The active region of the transistor is located on a side of the second electrode of the storage capacitor close to the base substrate, and the power line is located on a side of the second electrode of the storage capacitor away from the base substrate.

In an exemplary embodiment, for each sub-pixel, the power line is respectively connected with the second electrode of the storage capacitor and the third connection part of the semiconductor layer. The second electrode of the storage capacitor of each sub-pixel is connected with the second electrode of the storage capacitor of an adjacent sub-pixel in the same row through the first connection part, and the active region of the transistor of each sub-pixel is connected with the active region of the transistor of the other adjacent sub-pixel in the same row through the third connection part.

The method for manufacturing another display substrate provided by the present application is used to manufacture another display substrate provided by the above embodiments, and has a similar implementation principle and similar implementation effect, which will not be described further here.

Figure 23:
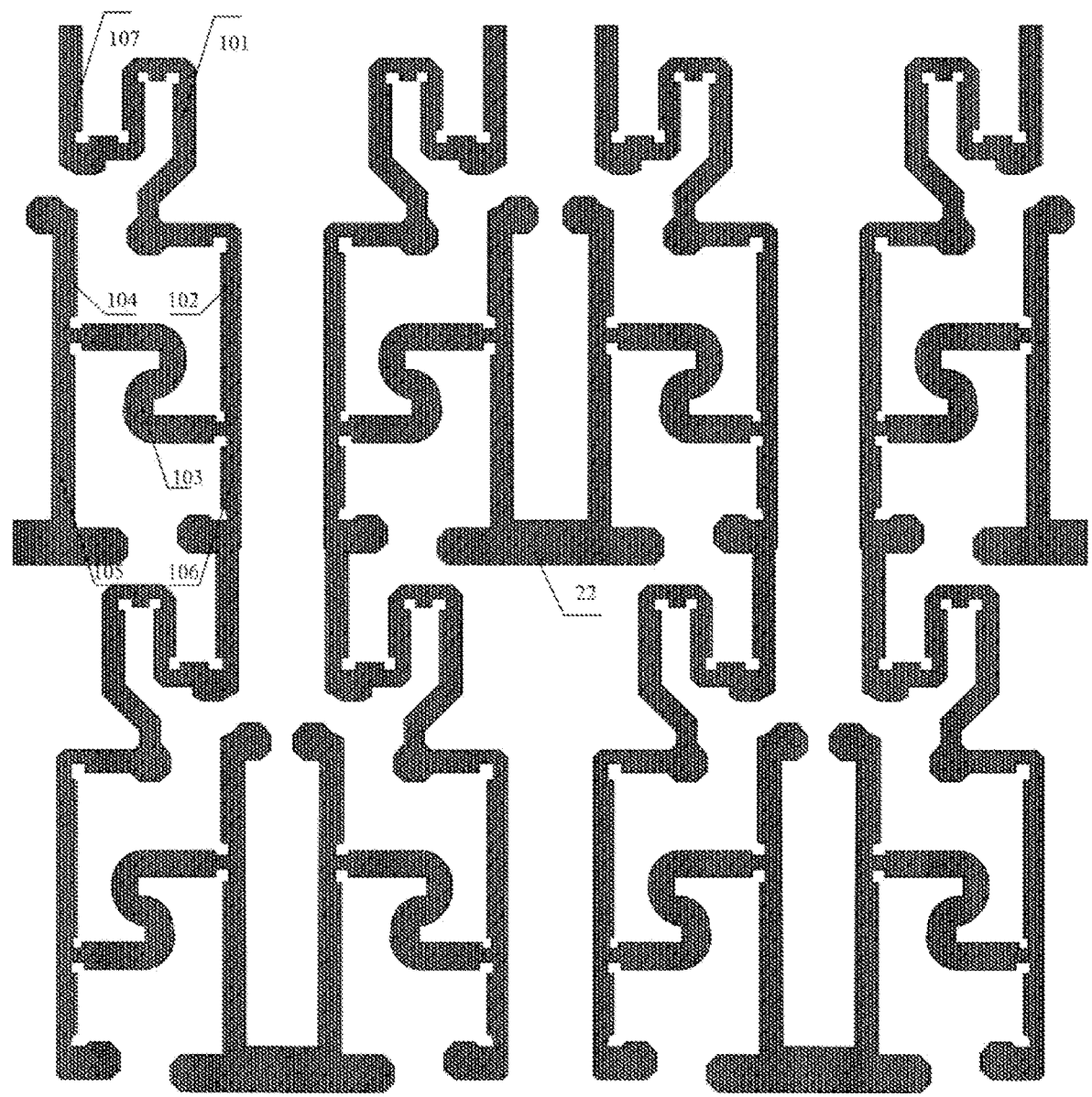
FIG. 23 is a schematic diagram of manufacturing of an active region of another display substrate according to the present application.
Figure 24:
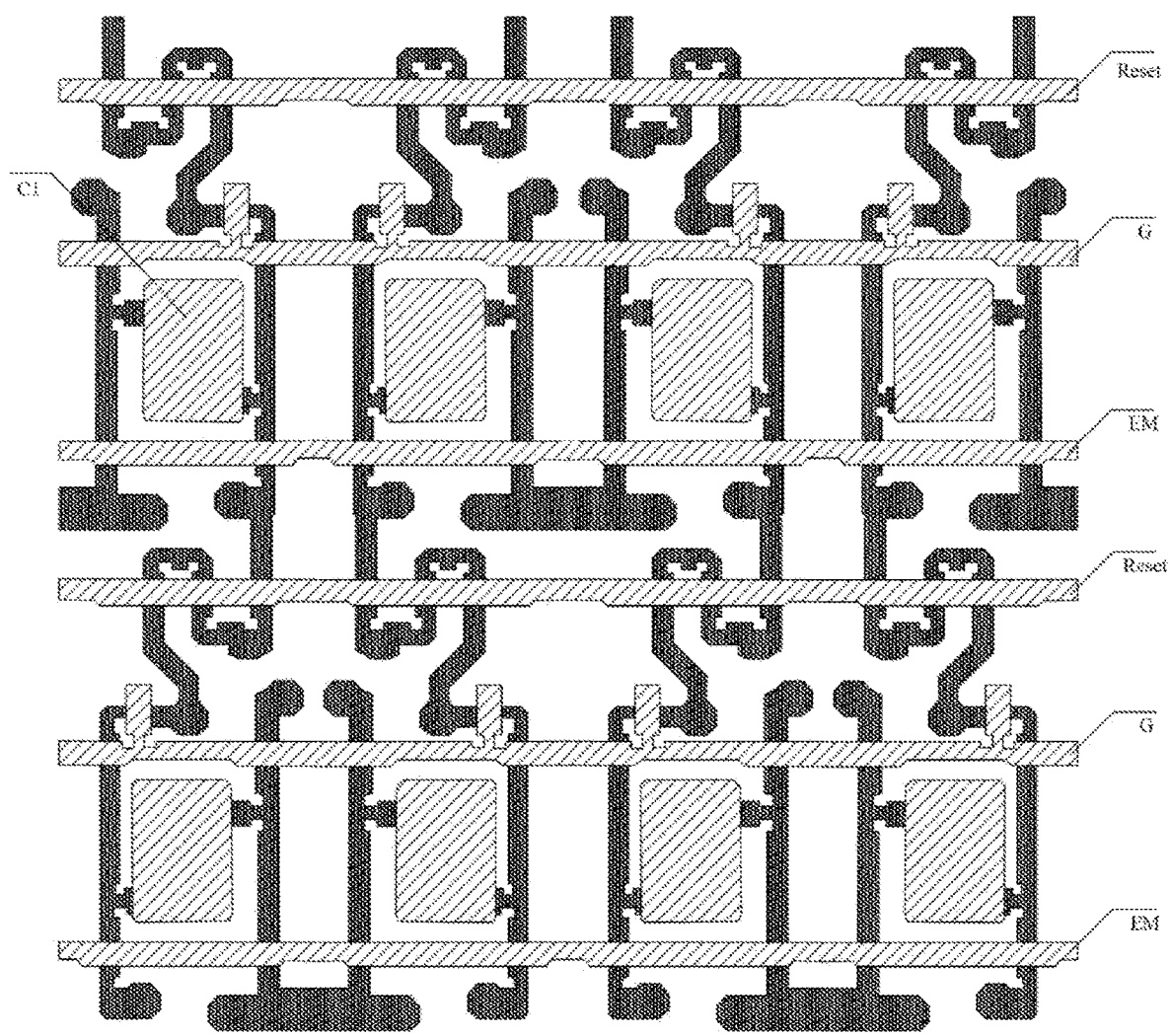
FIG. 24 is a schematic diagram of manufacturing of a first insulating layer and a first metal layer of another display substrate according to the present application.
Figure 25:
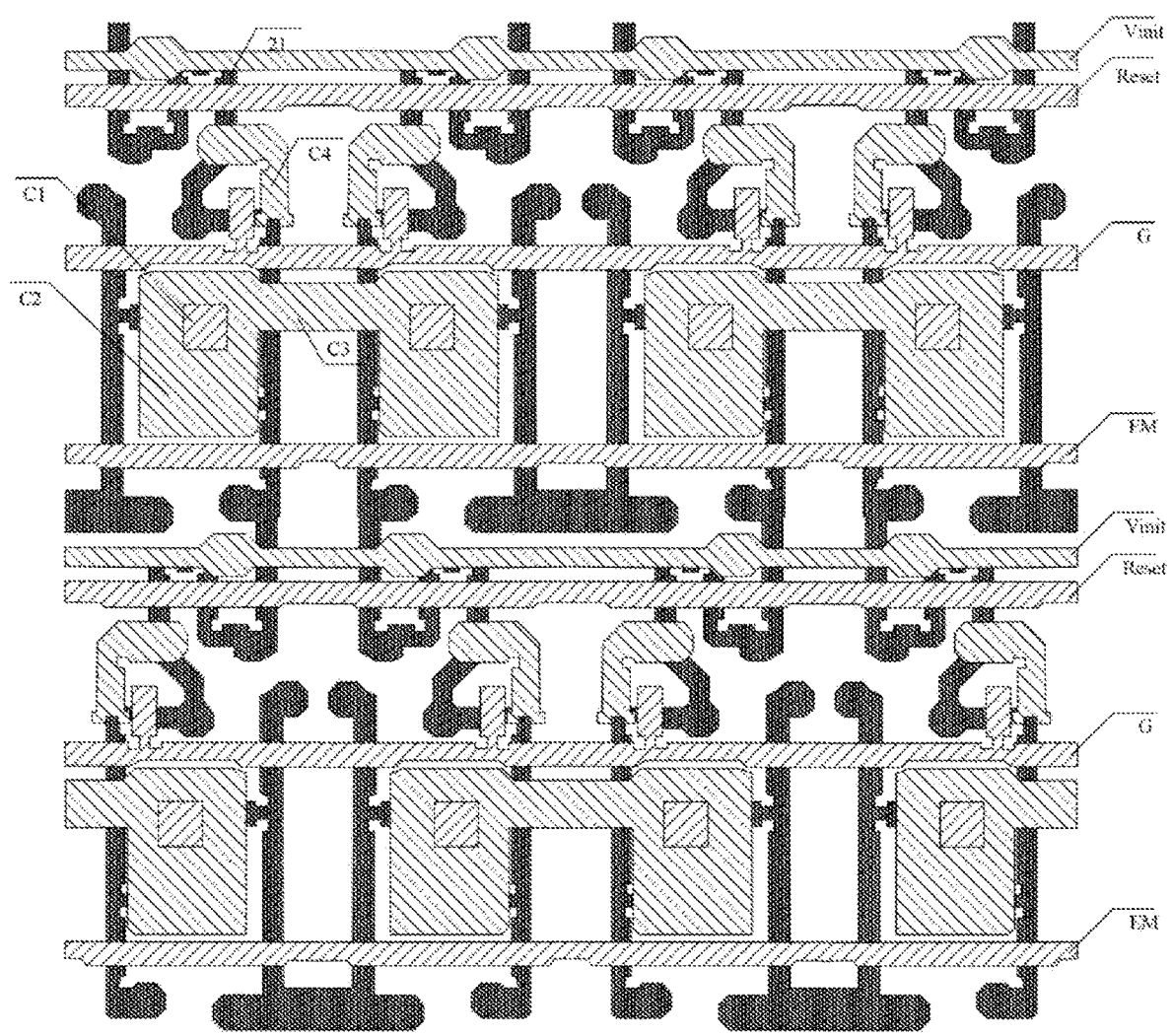
FIG. 25 is a schematic diagram of manufacturing of a second insulating layer and a second metal layer of another display substrate according to the present application.
Figure 26:
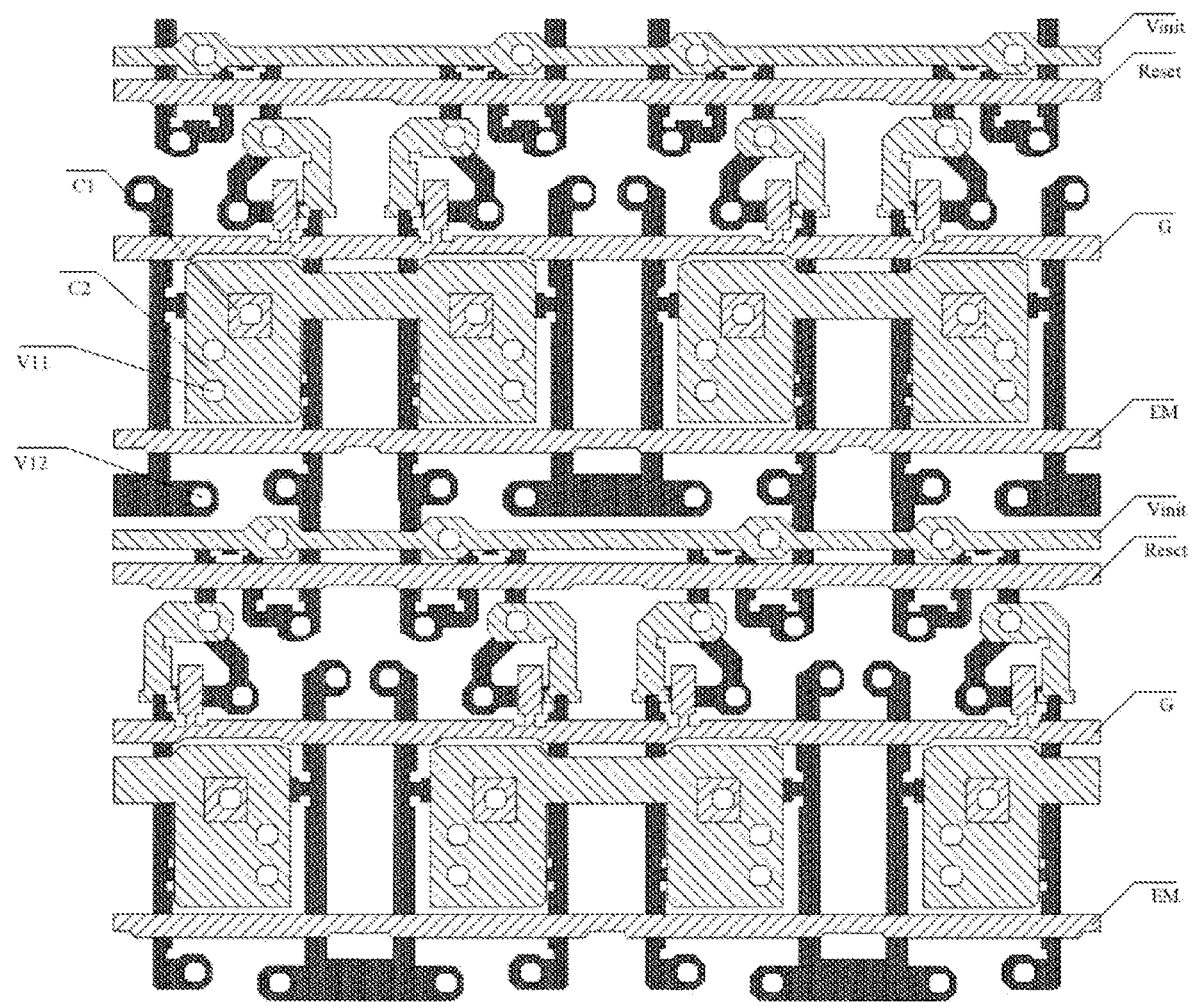
FIG. 26 is a schematic diagram of manufacturing of a third insulating layer of another display substrate according to the present application.

Taking the case of forming two pixels arranged in the extension direction of the data line as an example, each pixel includes four sub-pixels. FIG. 23 is a schematic diagram of manufacturing of an active region of another display substrate according to the present application, FIG. 24 is a schematic diagram of manufacturing of the first insulating layer and the first metal layer of another display substrate according to the present application, FIG. 25 is a schematic diagram of manufacturing of the second insulating layer and the second metal layer of another display substrate according to the present application, and FIG. 26 is a schematic diagram of manufacturing of the third insulating layer of another display substrate according to the present application. With reference to FIGS. 23 to 26, the method for manufacturing the display substrate may include step 1001 to step 1005.

In step 1001, a base substrate is provided, and a semiconductor layer is formed on the base substrate, as shown in FIG. 23.

In an exemplary embodiment, the semiconductor layer of each sub-pixel may include a first active region to a seventh active region, and the first active region to the seventh active region are an integrated structure in which they are connected with each other. In an exemplary embodiment, the positions of the first active region to the seventh active region are similar to those in the preceding embodiments, and thus will not be described in detail here.

In an exemplary embodiment, in the first direction, for the center line between adjacent sub-pixels, the semiconductor layers of the adjacent sub-pixels are mirror symmetric about the center line. The shape of the semiconductor layer of the sub-pixel in the i-th row and the j-th column is the same as the shape of the semiconductor layer of the sub-pixel in the i+1-th row and the j+1-th column, and the shape of the semiconductor layer of the sub-pixel in the i-th row and the j+1-th column is the same as the shape of the semiconductor layer of the sub-pixel in the i+1-th row and the j-th column.

In an exemplary embodiment, the semiconductor layer of each sub-pixel is connected with the semiconductor layer of another adjacent sub-pixel in the same row through the third connection part, and the semiconductor layer of each sub-pixel and the semiconductor layer of another adjacent sub-pixel located in the same column are connected with each other.

In an exemplary embodiment, the semiconductor layer of at least one sub-pixel further includes a third connection part 22. In the i-th row of sub-pixels, the semiconductor layers of the j-th column of sub-pixels are disconnected from the semiconductor layers of the j+1-th column of sub-pixels, the semiconductor layers of the j+1-th column of sub-pixels and the semiconductor layers of the j+2-th column of sub-pixels are connected with each other through the third connection part 22, and the semiconductor layers of the j+2-th column of sub-pixels are disconnected from the semiconductor layers of the j+3-th column of sub-pixels. In the i+1-th row of sub-pixels, the semiconductor layers of the j-th column of sub-pixels and the semiconductor layers of the j+1-th column of sub-pixels are connected with each other through the third connection part 22, the semiconductor layers of the j+1-th column of sub-pixels are disconnected from the semiconductor layers of the j+2-th column of sub-pixels, and the semiconductor layers of the j+2-th column of sub-pixels and the semiconductor layers of the j+3-th column of sub-pixels are connected with each other through the third connection part 22.

In an exemplary embodiment, a first end of the third connection part 22 is connected with the active region 105 of the fifth transistor in the same sub-pixel, and a second end of the third connection part 22 is connected with the active region 105 of the fifth transistor in an adjacent sub-pixel.

In an exemplary embodiment, there is an overlapping area between the orthographic projection of the third connection part 22 on the base substrate and the orthographic projections of the subsequently formed data lines and power lines on the base substrate.

In an exemplary embodiment, by arranging the semiconductor layers of adjacent sub-pixels to be connected with each other, the third connection part 22 of the semiconductor layer may be reused as a power supply connection line to transmit power signals of the power lines.

The semiconductor layers of the exemplary embodiments of the present application have a reasonable layout and a simple structure, and can ensure the display effect of the display substrate.

In step 1002, a first insulating layer is formed on the semiconductor layer, and a first metal layer is formed on the first insulating layer, as shown in FIG. 24.

In an exemplary embodiment, the first metal layer may include: a gate line G, a reset signal line Reset, a light emission control signal line EM, and a first electrode C1 of a storage capacitor.

In an exemplary embodiment, the gate line G, the reset signal line Reset and the light emission control line EM extend in the first direction, and the gate line G is arranged between the reset signal line Reset and the light emission control line EM. The first electrode C1 of the storage capacitor may have a shape of rectangle whose corners may be chamfered, and is arranged between the gate line G and the light emission control line EM. There is an overlapping area between the orthographic projection of the first electrode C1 on the base substrate and the orthographic projection of the third active region on the base substrate. In an exemplary embodiment, a first pole plate C1 also serves as the gate electrode of the third transistor.

In an exemplary embodiment, the gate line G, the reset signal line Reset and the light emission control line EM may be arranged with unequal widths. The gate line G is provided with a gate block protruding towards a side of the reset signal line Reset, and there is an overlapping area between the orthographic projection of the gate block on the base substrate and the orthographic projection of the second active region on the base substrate, to form a dual gate structure.

In an exemplary embodiment, after the pattern of the first metal layer is formed, the semiconductor layer may be subjected to a conductive treatment by using the first metal layer as a shield. The semiconductor layer in an area shielded by the first metal layer forms channel areas of the first transistor T1 to the seventh transistor T7, and the semiconductor layer in an area not shielded by the first metal layer is made to be conductive.

The first metal layers of the exemplary embodiments of the present application have a reasonable layout and a simple structure, and can ensure the display effect of the display substrate.

In step 1003, a second insulating layer is formed on the first metal layer, and a second metal layer is formed on the second insulating layer, as shown in FIG. 25.

In an exemplary embodiment, the second metal layer may include: an initial signal line Vinit and a second electrode C2 of the storage capacitor.

In an exemplary embodiment, the initial signal line Vinit extends in the first direction and is arranged on a side of the reset signal line Reset away from the gate line G. The second electrode C2 of the storage capacitor in each sub-pixel may have a rectangular profile, and is located between the gate line G and the light emission control line EM.

In an exemplary embodiment, the profile of the second electrode C2 may be rectangular, and the corners of the rectangle may be chamfered. There is an overlapping area between the orthographic projection of the second electrode C2 on the base substrate and the orthographic projection of the first electrode C1 on the base substrate. The middle of the second electrode C2 is provided with an opening which may be rectangular, so that the second electrode C2 forms an annular structure. The opening exposes the second insulating layer covering the first electrode C1, and the orthographic projection of the first electrode C1 on the base substrate includes the orthographic projection of the opening on the base substrate.

In an exemplary embodiment, the second electrode C2 of the sub-pixel in the i-th row and the j-th column and the second electrode C2 of the sub-pixel in the i-th row and the j+1-th column are an integrated structure in which they are connected with each other by the first connection part C3. The second electrode C2 of the sub-pixel in the i-th row and the j+1-th column is disconnected from the second electrode C2 of the sub-pixel in the i-th row and the j+2-th column. The second electrode C2 of the sub-pixel in the i-th row and the j+2-th column and the second electrode C2 of the sub-pixel in the i-th row and the j+3-th column are an integrated structure in which they are connected with each other by the first connection part C3. The second electrode C2 of the sub-pixel in the i+1-th row and the j-th column is disconnected from the second electrode C2 of the sub-pixel in the i+1-th row and the j+1-th column. The second electrode C2 of the sub-pixel in the i+1-th row and the j+1-th column and the second electrode C2 of the sub-pixel in the i+1-th row and the j+2-th column are an integrated structure in which they are connected with each other by the first connection part C3. The second electrode C2 of the sub-pixel in the i+1-th row and the j+2-th column is disconnected from the second electrode C2 of the sub-pixel in the i+1-th row and the j+3-th column. With this structure, the second electrodes C2 of adjacent sub-pixels may be reused as power supply signal lines, which can ensure that power signals provided by the power lines of adjacent sub-pixels are the same, thereby avoiding poor display of the display substrate and ensuring the display effect of the display substrate.

In an exemplary embodiment, the second metal layer may further include a shield electrode C4. There is an overlapping area between the orthographic projection of the shield electrode C4 on the base substrate and the orthographic projection of the subsequently formed power lines on the base substrate. The power lines are connected with the shield electrode C4 through vias. In an exemplary embodiment, the shield electrode C4 is configured to shield the influence of the data line on the driving circuit.

In an exemplary embodiment, the shield electrode C4 is "7"-shaped and includes a first part extending in the first direction and a second part extending in the second direction, an end of the first part close to the second part being connected with an end of the second part close to the first part to form a zigzag line with a right angle.

In an exemplary embodiment, in the second direction, the shield electrode C4 is arranged between the gate line G and the reset signal line Reset, and in the first direction, the second part of the shield electrode C4 is arranged between the subsequently formed data line and power line.

In an exemplary embodiment, the second part of the shield electrode C4 and the gate block of the first metal layer both extend in the second direction, and they have opposite areas therebetween. That is, an edge of the shield electrode C4 close to a side of the gate block in the first direction and an edge of the gate block close to a side of the shield electrode C4 in the first direction have opposite areas therebetween.

The second metal layers of the exemplary embodiments of the present application have a reasonable layout and a simple structure, and can ensure the display effect of the display substrate.

In step 1004, a third insulating layer is formed on the second metal layer, the third insulating layer is provided with an eleventh via V11 exposing the second electrode of the storage capacitor, and the first insulating layer, the second insulating layer and the third insulating layer are provided with a twelfth via V12 exposing the third connection part, as shown in FIG. 26.

In an exemplary embodiment, the eleventh via V11 is configured to connect the second electrode C2 with the subsequently formed power lines, and the twelfth via V12 is configured to connect the third connection part of the semiconductor layer with the subsequently formed power lines, so that the interconnected second electrodes C2 in adjacent sub-pixels and the interconnected third connection parts in adjacent sub-pixels are reused as power supply connection lines.

In an exemplary embodiment, the number of eleventh vias V11 may be two, and the two eleventh vias V11 are sequentially arranged in the second direction, which can improve the reliability of connection between the second electrodes and the power lines.

The vias of the exemplary embodiments of the present application have a reasonable layout and a simple structure, and can ensure the display effect of the display substrate.

In step 1005, a third metal layer is formed on the third insulating layer, as shown in FIG. 17.

In an exemplary embodiment, the third metal layer includes a data line D, a power line VDD, and source and drain electrodes of a plurality of transistors. The data line D includes a first sub-data line DO and a second sub-data line DE.

In an exemplary embodiment, the first sub-data line DO, the second sub-data line DE and the power line VDD extend in the second direction. The first sub-data line DO is located on one side of a sub-pixel and the second sub-data line DE is located on the other side of the sub-pixel. The power line VDD is located between the first sub-data line DO and the second sub-data line DE.

In an exemplary embodiment, adjacent sub-pixels located in the same column are connected to different sub-data lines. For example, the sub-pixel in the i-th row and the j-th column is connected to the first sub-data line in the j-th column of data line, and the sub-pixel in the i+1-th row and the j-th column is connected to the second sub-data line in the j-th column of data line. Alternatively, the sub-pixel in the i-th row and the j-th column is connected to the second sub-data line in the j-th column of data line, and the sub-pixel in the i+1-th row and the j-th column is connected to the first sub-data line in the j-th column of data line.

In an exemplary embodiment, the power line VDD of each sub-pixel is connected to the second electrode C2 through the eleventh via V11, and the power line VDD of each sub-pixel is connected to the third connection part of the semiconductor layer through the twelfth via V12. In this way, in one row, the second electrodes C2 of the storage capacitors of an adjacent sub-pixel are connected with each other, the third connection parts of the semiconductor layers of another adjacent sub-pixel are connected with each other, and the interconnected second electrodes C2 in adjacent sub-pixels and the interconnected semiconductor layers in adjacent sub-pixels are reused together as power supply connection lines, so that the power signals provided to each sub-pixel are the same, thereby ensuring the display effect of the display substrate.

In an exemplary embodiment, the power line VDD of each sub-pixel may be a zigzag line. In the second direction, the power line VDD of each sub-pixel may include a first power supply part, a second power supply part and a third power supply part connected in sequence. In the power line corresponding to the sub-pixel in the i-th row and the j-th column, a first end of the first power supply part is connected with a second end of the third power supply part in the sub-pixel located in the i−1-th row and the j-th column, and a second end of the first power supply part extends in the second direction and is connected with a first end of the second power supply part. A second end of the second power supply part extends in an oblique direction and is connected with a first end of the third power supply part. There is an included angle between the oblique direction and the second direction, and the included angle may be greater than 0 degree and smaller than 90 degrees. The second end of the third power supply part extends in the second direction, and is connected with the first end of the first power supply part in the sub-pixel located in the i+1-th row and the j-th column.

In an exemplary embodiment, the first power supply part may be a straight line with equal widths, the second power supply part may be an oblique line with variable widths, and the third power supply part may be a straight line with equal widths. The first power supply part and the second power supply part are parallel to the first sub-data line (or the second sub-data line), an included angle between the second power supply part and the first power supply part may be greater than 90 degrees and smaller than 180 degrees, and an included angle between the second power supply part and the third power supply part may be greater than 90 degrees and smaller than 180 degrees.

In an exemplary embodiment, the width of the third power supply part may be smaller than that of the first power supply part. The power line VDD is provided as a zigzag line with variable widths, which not only can facilitate the layout of the pixel structures, but also can reduce the parasitic capacitance of the power line VDD and the data line.

In an exemplary embodiment, there is an overlapping area between the orthographic projection of the third power supply part on the base substrate and the orthographic projection of the second electrode C2 on the base substrate.

In an exemplary embodiment, there is an overlapping area between the orthographic projection of the third power supply part on the base substrate and the orthographic projection of the first electrode C1 on the base substrate.

In an exemplary embodiment, there is an overlapping area between the orthographic projection of the third power supply part on the base substrate and the orthographic projection of the gate line G on the base substrate.

The structure shown in the present application and the preparation process thereof are merely an exemplary description. In an exemplary implementation, corresponding structures may be changed and patterning processes may be added or reduced according to actual needs. For example, the display substrate may include a fourth metal layer, and the data lines D, the power lines VDD, and the source and drain electrodes of a plurality of transistors may be located on different metal layers, which is not limited in the present application.

In the present application, the second pole plates of the storage capacitors and the active regions of the transistors are reused as power supply connection lines to transmit power signals of the power lines, and the distance between the active regions of the transistors and the data lines is relatively larger. Thus, the solutions of the present application increase the distance between partial power supply connection lines and the data lines, reduce the load of the data lines, and therefore reduce the power consumption of the display substrate and reduce the writing time of data signals.

The present application further provides a display apparatus. In an exemplary embodiment, the display apparatus includes the aforementioned display substrate.

In some possible implementations, the display substrate may be an OLED display substrate. The display apparatus may be any product or component with a display function, such as a mobile phone, a tablet computer, a television, a display, a notebook computer, a digital photo frame, a navigator, etc., and the embodiments of the present invention are not limited thereto.

The display substrate is the display substrate provided in the preceding embodiments, and has a similar implementation principle and implementation effects, which will not be described further here.

For the sake of clarity, the thickness and size of layers or microstructures are exaggerated in the drawings used to describe the embodiments of the present application. It may be understood that when an element such as a layer, film, region or substrate is referred to as being "on" or "under" another element, the element may be "directly" "on" or "under" the another element, or there may be an intervening element.

Although implementations disclosed in the present application are as the above, the described contents are only implementations used for facilitating understanding the present application, and are not used to limit the present invention. Any person skilled in the art to which the present invention pertains can make any modifications and variations in the form and details of implementation without departing from the spirit and scope disclosed in the present invention. Nevertheless, the scope of patent protection of the present invention shall still be subject to the scope defined by the appended claims.

What I claim is:

1. A display substrate, wherein:
   in a plane parallel to the display substrate, the display substrate comprises a plurality of gate lines, a plurality of data lines, a plurality of power lines and a plurality of sub-pixels arranged on a base substrate, at least one sub-pixel comprising a light-emitting device and a driving circuit configured to drive the light-emitting device to emit light, the driving circuit comprising a plurality of transistors and a storage capacitor;

in a plane perpendicular to the display substrate, the display substrate comprises the base substrate and a plurality of functional layers arranged on the base substrate;

the plurality of functional layers comprises a semiconductor layer, a first conductive layer, a second conductive layer, a third conductive layer and a fourth conductive layer which are sequentially arranged;

a first insulating layer, a second insulating layer, a third insulating layer and a fourth insulating layer are respectively arranged between the plurality of functional layers;

in an extension direction of the gate lines, the power lines are connected with each other through at least one functional layer;

in an extension direction of the data lines, the power lines comprise a plurality of sub-power lines connected sequentially;

the sub-power line comprises a first power supply part, a second power supply part and a third power supply part; and the second power supply part is configured to connect the first power supply part and the third power supply part, the first power supply part and the third power supply part are arranged in parallel with the data lines, an included angle between the second power supply part and the first power supply part is greater than 90 degrees and smaller than 180 degrees, and an included angle between the second power supply part and the third power supply part is greater than 90 degrees and smaller than 180 degrees.

2. The display substrate according to claim 1, wherein at least one sub-power line is arranged in one sub-pixel.

3. The display substrate according to claim 1, wherein the first power supply part is connected with a third power supply part in a sub-pixel located in a previous row in a same column, and the third power supply part is connected with a first power supply part in a sub-pixel located in a next row in the same column.

4. The display substrate according to claim 3, wherein
an extension length of the first power supply part in the extension direction of the data lines is greater than an average width of the first power supply parts, an extension length of the second power supply part in an oblique direction is greater than an average width of the second power supply parts, and an extension length of the third power supply part in the extension direction of the data lines is greater than an average width of the third power supply parts; and the oblique direction is a direction in which the second power supply part and the first power supply part have the included angle therebetween.

5. The display substrate according to claim 4, wherein the average width of the third power supply parts is smaller than the average width of the first power supply parts.

6. The display substrate according to claim 5, wherein an average distance between an edge of the first power supply part close to a side of the third power supply part in the extension direction of the gate lines and an edge of the third power supply part close to a side of the first power supply part in the extension direction of the gate lines is equivalent to the average width of the third power supply parts.

7. The display substrate according to claim 6, wherein the display substrate further comprises a first connection part, a second electrode of a storage capacitor in at least one sub-pixel and a second electrode of a storage capacitor in an adjacent sub-pixel in the extension direction of the gate lines are connected with each other through the first connection part; and in at least one sub-pixel, there is an overlapping area between an orthographic projection of the second power supply part on the base substrate and an orthographic projection of the second electrode of the storage capacitor on the base substrate, or there is an overlapping area between an orthographic projection of the second power supply part on the base substrate and an orthographic projection of the first connection part on the base substrate.

8. The display substrate according to claim 7, wherein there is an overlapping area between the orthographic projection of the second power supply part on the base substrate and an orthographic projection of a first electrode of the storage capacitor on the base substrate.

9. The display substrate according to claim 8, wherein there is an overlapping area between the orthographic projection of the second power supply part on the base substrate and an orthographic projection of the gate lines on the base substrate.

10. The display substrate according to claim 9, wherein the plurality of transistors comprise a second transistor, and there is an overlapping area between an orthographic projection of the first power supply part on the base substrate and an orthographic projection of the second transistor on the base substrate.

11. The display substrate according to claim 10, wherein the display substrate further comprises a fifth insulating layer arranged on the fourth conductive layer and a fifth conductive layer arranged on the fifth insulating layer, the fifth insulating layer is provided with a fifth via configured to connect the fifth conductive layer with the fourth conductive layer, and there is no overlapping area between an orthographic projection of the fifth via on the base substrate and an orthographic projection of the sub-power line on the base substrate.

12. The display substrate according to claim 11, wherein in at least one sub-pixel, there is an overlapping area between an orthographic projection of the fifth via on the base substrate and an orthographic projection of a virtual extension line of the first power supply part in the sub-power line in the extension direction of the data lines on the base substrate.

13. The display substrate according to claim 12, wherein the first insulating layer, the second insulating layer and the third insulating layer are provided with an eighth via configured to enable the data line to write a data signal to the semiconductor layer, and there is no overlapping area between an orthographic projection of the eighth via on the base substrate and orthographic projections of the first power supply part and the second power supply part in the sub-power line on the base substrate.

14. The display substrate according to claim 13, wherein in at least one sub-pixel, there is an overlapping area between the orthographic projection of the eighth via on the base substrate and an orthographic projection of a virtual extension line of the third power supply part in the sub-power line in the extension direction of the data lines on the base substrate.

15. The display substrate according to claim 14, wherein the power lines are arranged on the third conductive layer or on the fourth conductive layer, and the power lines are arranged on a same layer as the data lines.

16. The display substrate according to claim 15, wherein the power lines are arranged on the third conductive layer and the data lines are arranged on the fourth conductive layer, or the data lines are arranged on the third conductive layer and the power lines are arranged on the fourth conductive layer.

17. The display substrate according to claim 16, wherein the display substrate further comprises a first connection part, and a second electrode of a storage capacitor in at least one sub-pixel and a second electrode of a storage capacitor in an adjacent sub-pixel in the extension direction of the gate lines are connected with each other through the first connection part.

18. The display substrate according to claim 17, wherein there is at least one area comprising 2*4 sub-pixels, in one row, a second electrode of a storage capacitor in a first sub-pixel and a second electrode of a storage capacitor in a second sub-pixel are connected with each other through the first connection part, the second electrode of the storage capacitor in the second first sub-pixel is directly connected with a second electrode of a storage capacitor in a third sub-pixel, and the second electrode of the storage capacitor in the third sub-pixel and a second electrode of a storage capacitor in a fourth sub-pixel are connected with each other through the first connection part; and
in the other row, a second electrode of a storage capacitor in a first sub-pixel is directly connected with a second electrode of a storage capacitor in a second sub-pixel, the second electrode of the storage capacitor in the second sub-pixel and a second electrode of a storage capacitor in a third sub-pixel are connected with each other through the first connection part, and the second electrode of the storage capacitor in the third sub-pixel is directly connected with a second electrode of a storage capacitor in a fourth sub-pixel.

19. The display substrate according to claim 18, wherein a semiconductor layer in a first sub-pixel is spaced apart from a semiconductor layer in a second sub-pixel, the semiconductor layer in the second sub-pixel is spaced apart from a semiconductor layer in a third sub-pixel, and the semiconductor layer in the third sub-pixel is spaced apart from a semiconductor layer in a fourth sub-pixel.

20. The display substrate according to claim 18, wherein the third conductive layer comprises a first pole of a fifth transistor; and
a first pole of a fifth transistor in a first sub-pixel is spaced apart from a first pole of a fifth transistor in a second sub-pixel, the first pole of the fifth transistor in the second sub-pixel is spaced apart from a first pole of a fifth transistor in a third sub-pixel, and the first pole of the fifth transistor in the third sub-pixel is spaced apart from a first pole of a fifth transistor in a fourth sub-pixel.

21. The display substrate according to claim 17, wherein there is at least one area comprising 2*4 sub-pixels, in one row, a second electrode of a storage capacitor in a first sub-pixel and a second electrode of a storage capacitor in a second sub-pixel are connected with each other through the first connection part, the second electrode of the storage capacitor in the second sub-pixel is disconnected from a second electrode of a storage capacitor in a third sub-pixel, and the second electrode of the storage capacitor in the third sub-pixel and a second electrode of a storage capacitor in a fourth sub-pixel are connected with each other through the first connection part; and
in the other row, a second electrode of a storage capacitor in a first sub-pixel is disconnected from a second electrode of a storage capacitor in a second sub-pixel, the second electrode of the storage capacitor in the second sub-pixel and a second electrode of a storage capacitor in a third sub-pixel are connected with each other through the first connection part, and the second electrode of the storage capacitor in the third sub-pixel is disconnected from a second electrode of a storage capacitor in a fourth sub-pixel.

22. The display substrate according to claim 21, wherein the third conductive layer comprises a first pole of a fifth transistor and a second connection part;
in one row, a first pole of a fifth transistor in a first sub-pixel is disconnected from a first pole of a fifth transistor in a second sub-pixel, the first pole of the fifth transistor in the second sub-pixel and a first pole of a fifth transistor in a third sub-pixel are connected with each other through the second connection part, and the first pole of the fifth transistor in the third sub-pixel is disconnected from a first pole of a fifth transistor in a fourth sub-pixel; and
in the other row, a first pole of a fifth transistor in a first sub-pixel and a first pole of a fifth transistor in a second sub-pixel are connected with each other through the second connection part, the first pole of the fifth transistor in the second sub-pixel is disconnected from a first pole of a fifth transistor in a third sub-pixel, and the first pole of the fifth transistor in the third sub-pixel and a first pole of a fifth transistor in a fourth sub-pixel are connected with each other through the second connection part.

23. The display substrate according to claim 22, wherein in the extension direction of the gate lines, the power lines are connected with each other through the second electrodes of the storage capacitors and the first poles of the fifth transistors.

24. The display substrate according to claim 23, wherein the fourth insulating layer is provided with first vias exposing the first poles of the fifth transistors, the third insulating layer is provided with second vias exposing the second electrodes of the storage capacitors, the power lines are connected with the first poles of the fifth transistors through the first vias, and the first poles of the fifth transistors are connected with the second electrodes of the storage capacitors through the second vias.

25. The display substrate according to claim 24, wherein in at least one sub-pixel, there is one first via and a plurality of second vias, and the plurality of second vias are arranged in the extension direction of the data lines, the orthographic projection of the power lines on the base substrate comprises an orthographic projection of the first via on the base substrate, and the orthographic projection of the first pole of the fifth transistor on the base substrate comprises an orthographic projection of the second vias on the base substrate.

26. The display substrate according to claim 21, wherein the semiconductor layer comprises a third connection part;
in one row, a semiconductor layer in a first sub-pixel is disconnected from a semiconductor layer in a second sub-pixel, the semiconductor layer in the second sub-pixel and a semiconductor layer in a third sub-pixel are connected with each other through the third connection part, and the semiconductor layer in the third sub-pixel is disconnected from a semiconductor layer in a fourth sub-pixel; and
in the other row, a semiconductor layer in a first sub-pixel and a semiconductor layer in a second sub-pixel are connected with each other through the third connection part, the semiconductor layer in the second sub-pixel is disconnected from a semiconductor layer in a third sub-pixel, and the semiconductor layer in the third sub-pixel and a semiconductor layer in a fourth sub-pixel are connected with each other through the third connection part.

27. The display substrate according to claim 26, wherein in the extension direction of the gate lines, the power lines are connected with each other through the third connection part of the semiconductor layer and the second electrodes of the storage capacitors.

28. The display substrate according to claim 27, wherein the third insulating layer is provided with eleventh vias exposing the second electrodes of the storage capacitors, and the first insulating layer, the second insulating layer and the third insulating layer are provided with twelfth vias exposing the third connection part of the semiconductor layer, the power lines are connected with the second electrodes of the storage capacitors through the eleventh vias, and the power lines are connected with the third connection part of the semiconductor layer through the twelfth vias.

29. The display substrate according to claim 28, wherein in at least one sub-pixel, there is one eleventh via and a plurality of twelfth vias, the plurality of twelfth vias are arranged in the extension direction of the data lines; and
the orthographic projection of the power lines on the base substrate comprises orthographic projections of the eleventh via and the twelfth vias on the base substrate.

30. The display substrate according to claim 1, wherein the plurality of transistors comprise a first transistor, a second transistor, a third transistor, a fourth transistor, a fifth transistor, a sixth transistor and a seventh transistor;
in at least one sub-pixel, the semiconductor layer at least comprises a first active region at a position where the first transistor is located, a second active region at a position where the second transistor is located, a third active region at a position where the third transistor is located, a fourth active region at a position where the fourth transistor is located, a fifth active region at a position where the fifth transistor is located, a sixth active region at a position where the sixth transistor is located, and a seventh active region at a position where the seventh transistor is located, and the first active region, the second active region, the third active region, the fourth active region, the fifth active region, the sixth active region and the seventh active region are an integrated structure.

31. The display substrate according to claim 30, wherein a distance between the second active region and the first active region in the extension direction of the gate lines is smaller than a distance between the second active region and the seventh active region in the extension direction of the gate lines.

32. The display substrate according to claim 30, wherein the seventh active region and the first active region are sequentially arranged in a direction from the data lines to the power lines in which data signals are written.

33. The display substrate according to claim 30, wherein at least one sub-pixel comprises a first region, a second region and a third region which are sequentially arranged in the extension direction of the data lines; and
the first active region and the seventh active region are arranged on a side of the first region away from the second region, the second active region and the fourth active region are arranged on a side of the first region close to the second region, the third active region is arranged in the second region, and the fifth active region and the sixth active region are arranged in the third region.

34. The display substrate according to claim 30, wherein the first pole of the first transistor is connected with an initial signal line, the second pole of the first transistor is connected with the first electrode of the storage capacitor, the first pole of the second transistor is connected with the first electrode of the storage capacitor, the second pole of the second transistor is connected with the second pole of the sixth transistor, the first pole of the third transistor is connected with the second pole of the fourth transistor, the second pole of the third transistor is connected with the second pole of the sixth transistor, the first pole of the fourth transistor is connected with a data line, the first pole of the fifth transistor is connected with a power line, the second pole of the fifth transistor is connected with the first pole of the third transistor, the second pole of the sixth transistor is connected with an anode of a light-emitting device, the first pole of the seventh transistor is connected with an initial signal line, and the second pole of the seventh transistor is connected with the anode of the light-emitting device; and
the first active region is respectively connected with the second active region and the seventh active region, the second active region is respectively connected with the third active region and the sixth active region, and the fourth active region is respectively connected with the third active region and the fifth active region.

35. The display substrate according to claim 30, wherein semiconductor layers of adjacent sub-pixels are symmetrical with each other in the extension direction of the gate lines.

36. The display substrate according to claim 30, wherein there is at least one area comprising 2*2 sub-pixels, a shape of a semiconductor layer in a first sub-pixel in one row is the same as a shape of a semiconductor layer in a second sub-pixel in the other row, and a shape of a semiconductor layer in a second sub-pixel in one row is the same as a shape of a semiconductor layer in a first sub-pixel in the other row.

37. The display substrate according to claim 30, wherein the semiconductor layer comprises a third connection part, and a semiconductor layer in at least one sub-pixel is connected with a semiconductor layer in an adjacent sub-pixel in the extension direction of the gate lines through the third connection part.

38. The display substrate according to claim 37, wherein the third connection part is connected with the active region of the fifth transistor.

39. The display substrate according to claim 37, wherein there is an overlapping area between an orthographic projection of the third connection part on the base substrate and the orthographic projection of the power lines on the base substrate.

40. The display substrate according to claim 37, wherein the first insulating layer, the second insulating layer and the third insulating layer are provided with twelfth vias exposing the third connection part, and the power lines are connected with the third connection part through the twelfth vias.

41. The display substrate according to claim 37, wherein
there is at least one area comprising 2*4 sub-pixels, in one row, a semiconductor layer in a first sub-pixel is disconnected from a semiconductor layer in a second sub-pixel, the semiconductor layer in the second sub-pixel and a semiconductor layer in a third sub-pixel are connected with each other through the third connection part, and the semiconductor layer in the third sub-pixel is disconnected from a semiconductor layer in a fourth sub-pixel; and
in the other row, a semiconductor layer in a first sub-pixel and a semiconductor layer in a second sub-pixel are connected with each other through the third connection part, the semiconductor layer in the second sub-pixel is disconnected from a semiconductor layer in a third sub-pixel, and the semiconductor layer in the third sub-pixel and a semiconductor layer in a fourth sub-pixel are connected with each other through the third connection part.

42. The display substrate according to claim 41, wherein in the extension direction of the data lines, the data line comprises a plurality of sub-data lines connected sequentially; and there is at least one sub-pixel, such that two sub-data lines are arranged between the sub-pixel and an adjacent sub-pixel in the extension direction of the gate lines.

43. The display substrate according to claim 42, wherein the two sub-data lines are parallel to each other.

44. The display substrate according to claim 42, wherein in at least one sub-pixel, the first insulating layer, the second insulating layer and the third insulating layer are provided with eighth vias exposing the semiconductor layer, the fourth insulating layer is provided with third vias exposing the first pole of the fourth transistor, the data line is connected with the first pole of the fourth transistor through the third via, and the first pole of the fourth transistor is connected with the semiconductor layer through the eighth via.

45. The display substrate according to claim 44, wherein in the extension direction of the gate lines, the eighth vias of adjacent sub-pixels are symmetrical with each other.

46. The display substrate according to claim 42, wherein the data line are arranged on the third conductor layer, and the power line are arranged on the third conductor layer.

47. The display substrate according to claim 42, wherein the data lines are arranged on the fourth conductor layer, and the power lines are arranged on the third conductor layer or the fourth conductor layer.

48. The display substrate according to claim 42, wherein in at least one column of sub-pixels, the data line comprises a first sub-data line and a second sub-data line, which are located on two sides of the column of sub-pixels, respectively.

49. The display substrate according to claim 48, wherein the power line is located between the first sub-data line and the second sub-data line.

50. The display substrate according to claim 49, wherein pixel structures of adjacent sub-pixels are symmetrical with each other in the extension direction of the gate lines.

51. The display substrate according to claim 50, wherein there is at least one area comprising 2*2 sub-pixels, in which a pixel structure of a first sub-pixel in one row is the same as a pixel structure of a second sub-pixel in the other row, and a pixel structure of a second sub-pixel in one row is the same as a pixel structure of a first sub-pixel in the other row.

52. The display substrate according to claim 51, wherein the display substrate further comprises a reset signal line, a light emission control line and an initial signal line; the semiconductor layer at least comprises active regions of a plurality of transistors, the first conductor layer at least comprises a gate line, a light emission control line, a reset signal line, a first electrode of a storage capacitor, and gate electrodes of a plurality of transistors, the second conductor layer at least comprises an initial signal line and a second electrode of a storage capacitor; and the third conductor layer at least comprises source and drain electrodes of a plurality of transistors, and the fourth conductor layer at least comprises a data line and a power line.

53. The display substrate according to claim 52, wherein at least one sub-pixel comprises a first region, a second region and a third region which are sequentially arranged in the extension direction of the data line; and the gate line, the initial signal line and the reset signal line are located in the first region, the first electrode and the second electrode of the storage capacitor are located in the second region, and the light emission control line is located in the third region.

54. The display substrate according to claim 52, wherein the second conductor layer further comprises a shield electrode, and in at least one sub-pixel, there is an overlapping area between an orthographic projection of the shield electrode on the base substrate and the orthographic projection of the power lines on the base substrate.

55. The display substrate according to claim 54, wherein the power line is connected with the shield electrode through a via.

56. The display substrate according to claim 54, wherein the shield electrode is arranged between the gate line and the reset signal line in the extension direction of the data lines.

57. The display substrate according to claim 54, wherein the shield electrode comprises a first part extending in the extension direction of the gate lines and a second part extending in the extension direction of the data lines, and an end of the first part close to the second part is connected with an end of the second part close to the first part.

58. The display substrate according to claim 57, wherein the first conductor layer further comprises a gate block extending in the extension direction of the data lines, and the gate block is connected with the gate line; and in the extension direction of the data lines, the gate block and the second part of the shield electrode have opposite areas therebetween.

59. The display substrate according to claim 52, wherein the source and drain electrodes of the plurality of transistors comprise the first pole of the second transistor, the second insulating layer and the third insulating layer are provided with seventh vias exposing the first electrode of the storage capacitor, the first insulating layer, the second insulating layer and the third insulating layer are provided with ninth vias exposing the active region of the second transistor, one end of the first pole of the second transistor is connected with the first electrode of the storage capacitor through the seventh via, and the other end of the first pole of the second transistor is connected with the active region of the second transistor through the ninth via.

60. The display substrate according to claim 59, wherein there is an overlapping area between an orthographic projection of the first pole of the second transistor on the base substrate and an orthographic projection of the gate line on the base substrate, and there is no overlapping area between the orthographic projection of the first pole of the second transistor on the base substrate and orthographic projections of the light emission control line, the reset signal line and the initial signal line on the base substrate.

61. The display substrate according to claim 52, wherein the source and drain electrodes of the plurality of transistors comprise a first pole of a first transistor, the third insulating layer is provided with sixth vias exposing the initial signal line, the first insulating layer, the second insulating layer and the third insulating layer are provided with tenth vias exposing the active region of the first transistor, one end of the first pole of the first transistor is connected with the initial signal line through the sixth via, and the other end of the first pole of the first transistor is connected with the active region of the first transistor through the tenth via.

62. The display substrate according to claim 61, wherein there is an overlapping area between an orthographic projection of the first pole of the first transistor on the base substrate and an orthographic projection of the reset signal line on the base substrate, and there is no overlapping area between the orthographic projection of the first pole of the first transistor on the base substrate and orthographic projections of the gate line and the light emission control line on the base substrate.

63. The display substrate according to claim 52, wherein the display substrate further comprises a fifth insulating layer arranged on the fourth conductive layer and a fifth conductive layer arranged on the fifth insulating layer; the fourth conductor layer further comprises a connection electrode, and the source and drain electrodes of the plurality of transistors comprise a second pole of a sixth transistor; the fourth insulating layer is provided with fourth vias exposing the second pole of the sixth transistor, the fifth insulating layer is provided with fifth vias exposing the connection electrode, the connection electrode is connected with the second pole of the sixth transistor through the fourth via, and the fifth conductor layer is connected with the connection electrode through the fifth via.

64. The display substrate according to claim 63, wherein there is an overlapping area between an orthographic projection of the connection electrode on the base substrate and an orthographic projection of the first pole of the second transistor on the base substrate.

65. The display substrate according to claim 52, wherein at least one sub-pixel at least comprises:
a first via exposing a first pole of a fifth transistor, the first via being configured to connect the first pole of the fifth transistor with the power line;
a second via exposing a second electrode of a storage capacitor, the second via being configured to connect the second electrode with the first pole of the fifth transistor;
a third via exposing a first pole of a fourth transistor, the third via being configured to connect the first pole of the fourth transistor with the data line;
a fourth via exposing a second pole of a sixth transistor, the fourth via being configured to connect the second pole of the sixth transistor with a connection electrode;
a fifth via exposing the connection electrode, the fifth via being configured to connect the connection electrode with an anode of the fifth conductor layer;
a sixth via exposing the initial signal line, the sixth via being configured to connect the initial signal line with a first pole of a first transistor;
a seventh via exposing a first electrode of the storage capacitor, the seventh via being configured to connect the first electrode with a first pole of a second transistor;
an eighth via exposing an active region of the fourth transistor, the eighth via being configured to connect the active region of the fourth transistor with the first pole of the fourth transistor;
a ninth via exposing an active region of the second transistor, the ninth via being configured to connect the active region of the second transistor with the first pole of the second transistor; and
a tenth via exposing an active region of the first transistor, the tenth via being configured to connect the active region of the first transistor with the first pole of the first transistor.

66. The display substrate according to claim 52, wherein at least one sub-pixel at least comprises:
an eleventh via exposing the second electrode of the storage capacitor, the eleventh via being configured to connect the second electrode with the power line; and
a twelfth via exposing a third connection part, the twelfth via being configured to connect the third connection part with the power line.

67. A display apparatus, comprising the display substrate according to claim 1.

68. A method for manufacturing a display substrate according to claim 1,
the display substrate comprising, in a plane parallel to the display substrate, gate lines, data lines, power lines and a plurality of sub-pixels arranged on a base substrate, at least one sub-pixel comprising a light-emitting device and a driving circuit configured to drive the light-emitting device to emit light, and the driving circuit comprising a plurality of transistors and a storage capacitor;
the method comprising:
providing a base substrate; and
forming a plurality of functional layers on the base substrate, the plurality of functional layers comprising a semiconductor layer, a first conductive layer, a second conductive layer, a third conductive layer and a fourth conductive layer which are sequentially arranged, a first insulating layer, a second insulating layer, a third insulating layer and a fourth insulating layer being respectively arranged between the plurality of functional layers, and in an extension direction of the gate lines, the power lines being connected with each other through at least one functional layer.

* * * * *